(12) United States Patent
Chen et al.

(10) Patent No.: US 11,916,012 B2
(45) Date of Patent: Feb. 27, 2024

(54) MANUFACTURING METHOD OF SEMICONDUCTOR STRUCTURE

(71) Applicant: Taiwan Semiconductor Manufacturing Company, Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 17/361,362

(22) Filed: Jun. 29, 2021

(65) Prior Publication Data
US 2021/0327807 A1     Oct. 21, 2021

Related U.S. Application Data

(63) Continuation of application No. 16/547,602, filed on Aug. 22, 2019, now Pat. No. 11,069,608.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76807* (2013.01); *H01L 21/76816* (2013.01);
(Continued)

(58) Field of Classification Search
CPC ............... H10B 80/00; H01L 23/5226; H01L 21/76807; H01L 21/76816; H01L 23/481;
(Continued)

(56) References Cited

U.S. PATENT DOCUMENTS 8,993,380 B2    3/2015    Hou et al.
9,281,254 B2    3/2016    Yu et al.
(Continued)

*Primary Examiner* — Jasmine J Clark
(74) *Attorney, Agent, or Firm* — JCIPRNET

(57) ABSTRACT

A manufacturing method of a semiconductor structure is provided. A first semiconductor die includes a first semiconductor substrate, a first interconnect structure formed thereon, a first bonding conductor formed thereon, and a conductive via extending from the first interconnect structure toward a back surface of the first semiconductor substrate. The first semiconductor substrate is thinned to accessibly expose the conductive via to form a through semiconductor via (TSV). A second semiconductor die is bonded to the first semiconductor die. The second semiconductor die includes a second semiconductor substrate including an active surface facing the back surface of the first semiconductor substrate, a second interconnect structure between the second and the first semiconductor substrates, and a second bonding conductor between the second interconnect structure and the first semiconductor substrate and bonded to the TSV. The second bonding conductor is substantially aligned with the first bonding conductor and smaller than the TSV.

20 Claims, 34 Drawing Sheets

(51) Int. Cl.
  *H01L 25/065* (2023.01)
  *H01L 23/48* (2006.01)
  *H01L 23/00* (2006.01)
  *H01L 23/528* (2006.01)

(52) U.S. Cl.
  CPC ........ *H01L 23/481* (2013.01); *H01L 23/5283* (2013.01); *H01L 24/08* (2013.01); *H01L 25/0657* (2013.01)

(58) Field of Classification Search
  CPC .. H01L 23/5283; H01L 24/08; H01L 25/0657
  See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,069,608 B2 * | 7/2021 | Chen ................ H01L 24/08 |
| 11,410,972 B2 * | 8/2022 | Wu ................ H01L 25/50 |
| 11,574,891 B2 * | 2/2023 | Shih ................ H01L 23/3738 |

\* cited by examiner

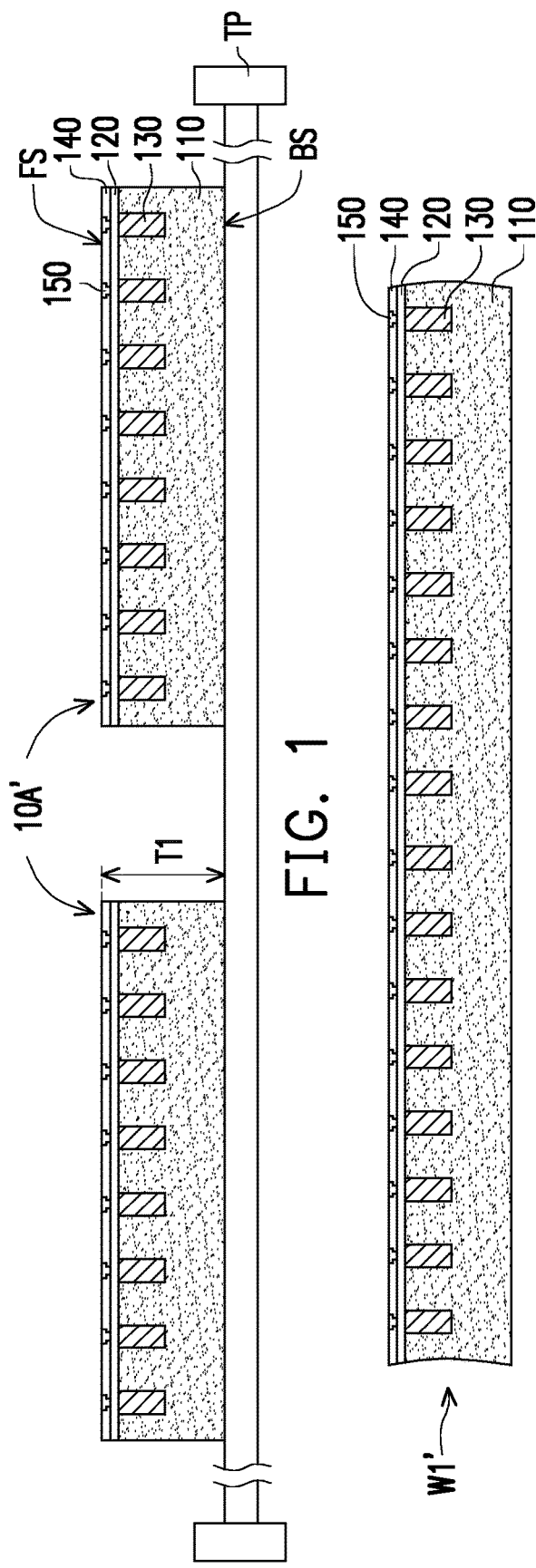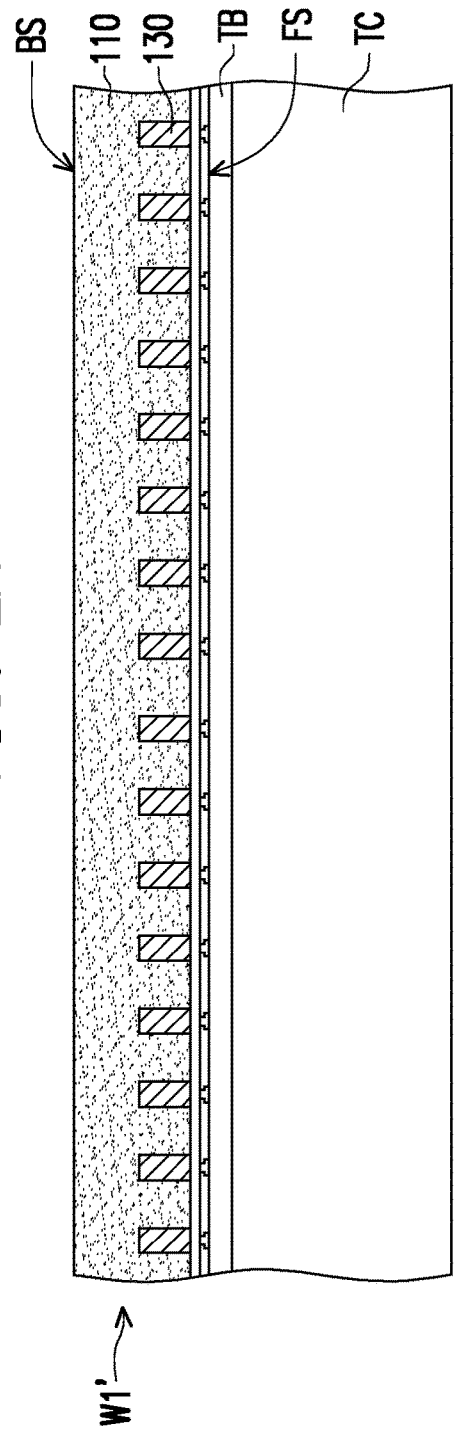

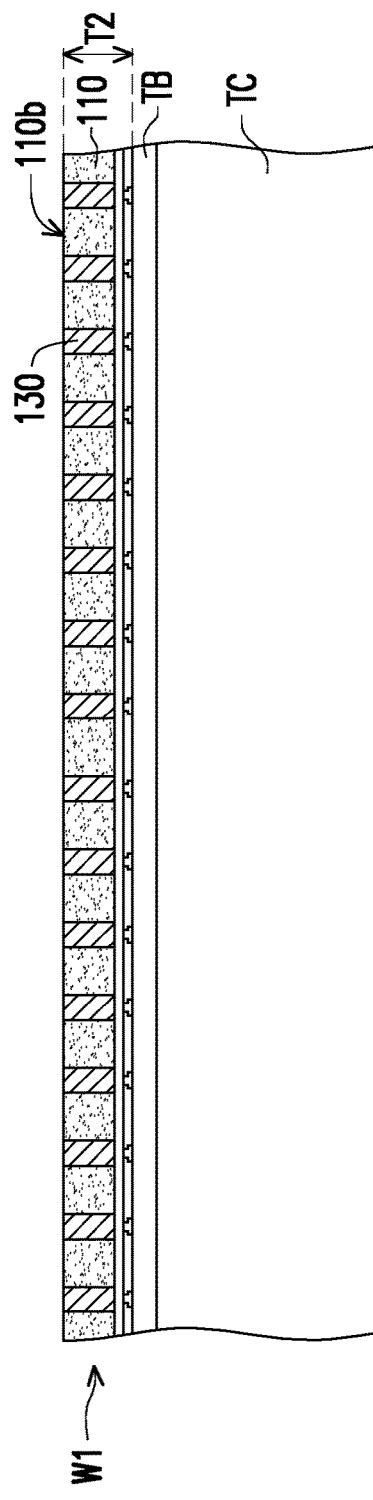
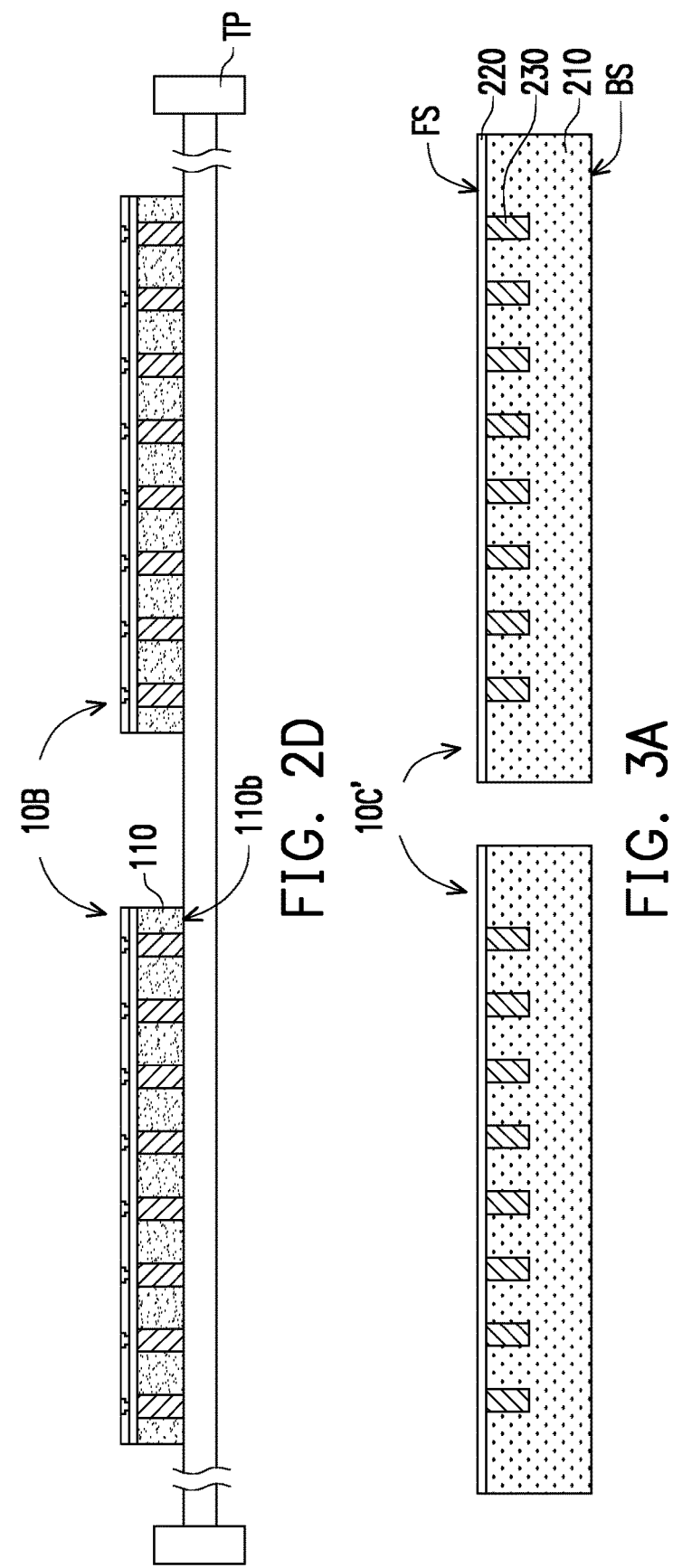

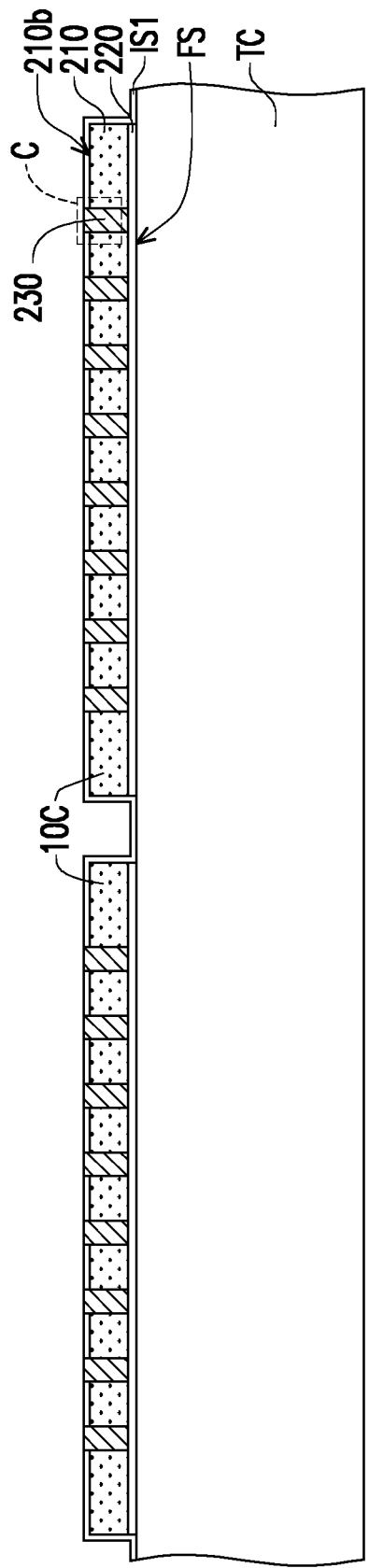
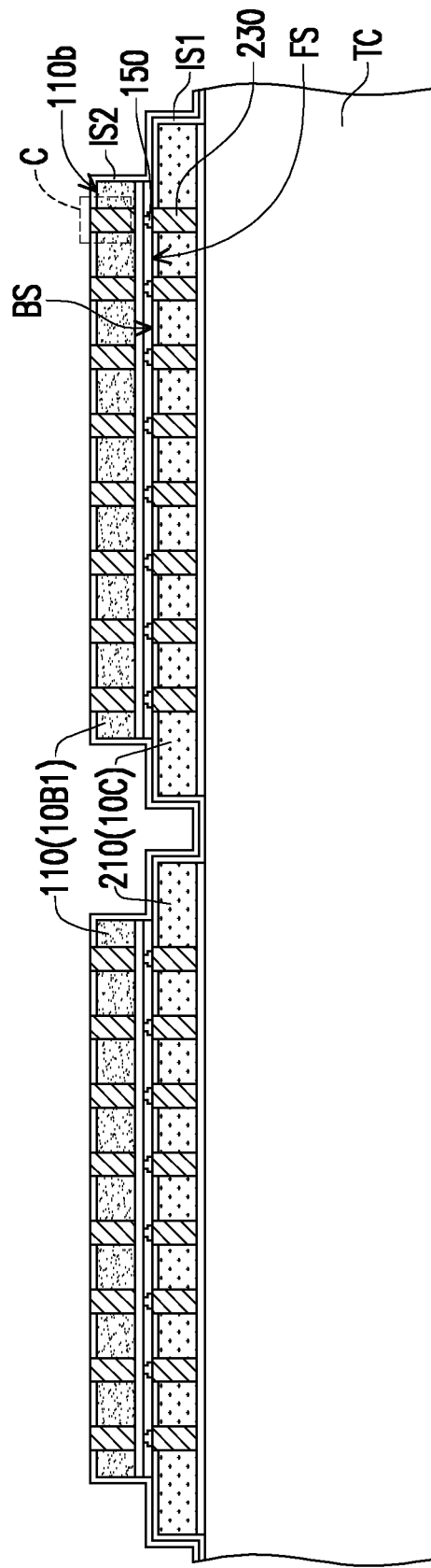
FIG. 7A
FIG. 7B

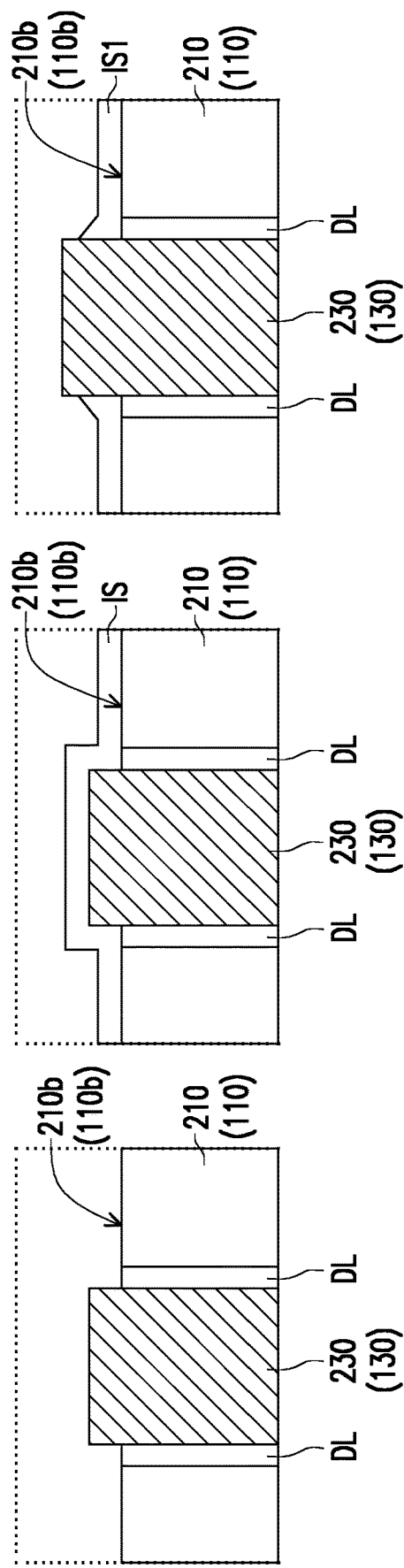

MANUFACTURING METHOD OF SEMICONDUCTOR STRUCTURE

CROSS-REFERENCE TO RELATED APPLICATION

This application is a continuation application of and claims the priority benefit of a prior application Ser. No. 16/547,602, filed on Aug. 22, 2019, now U.S. Pat. No. 11,069,608. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. For example, the area occupied by integrated components is proximate to the surface of a semiconductor wafer; however, there are physical limitations to an achievable density in two-dimensional (2D) integrated circuit formation. For example, one of these limitations comes from the significant gains in the number and length of interconnections between semiconductor devices as the number of semiconductor devices increases. As the existing integrated circuit design rules require a decreasing pitch for laying out conductive wirings in a semiconductor structure, there is continuous effort in developing new mechanisms of forming semiconductor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic cross-sectional view showing a semiconductor die according to some embodiments of the present disclosure.

FIG. 2A to FIG. 2D are schematic cross-sectional views showing various stages in a manufacturing method of a semiconductor die according to some embodiments of the present disclosure.

FIG. 3A to FIG. 3C are schematic cross-sectional views showing various stages in a manufacturing method of a carrier die according to some embodiments of the present disclosure.

FIG. 7A to FIG. 7E are schematic cross-sectional views showing various stages in a manufacturing method of a semiconductor structure according to some embodiments of the present disclosure.

FIG. 8A to FIG. 8C are enlarged and schematic cross-sectional views of intermediate steps during a process for exposing a conductive via in a dashed area C outlined in FIG. 7A or FIG. 7B according to some embodiments of the present disclosure.

DETAILED DESCRIPTION

Figure 3B:
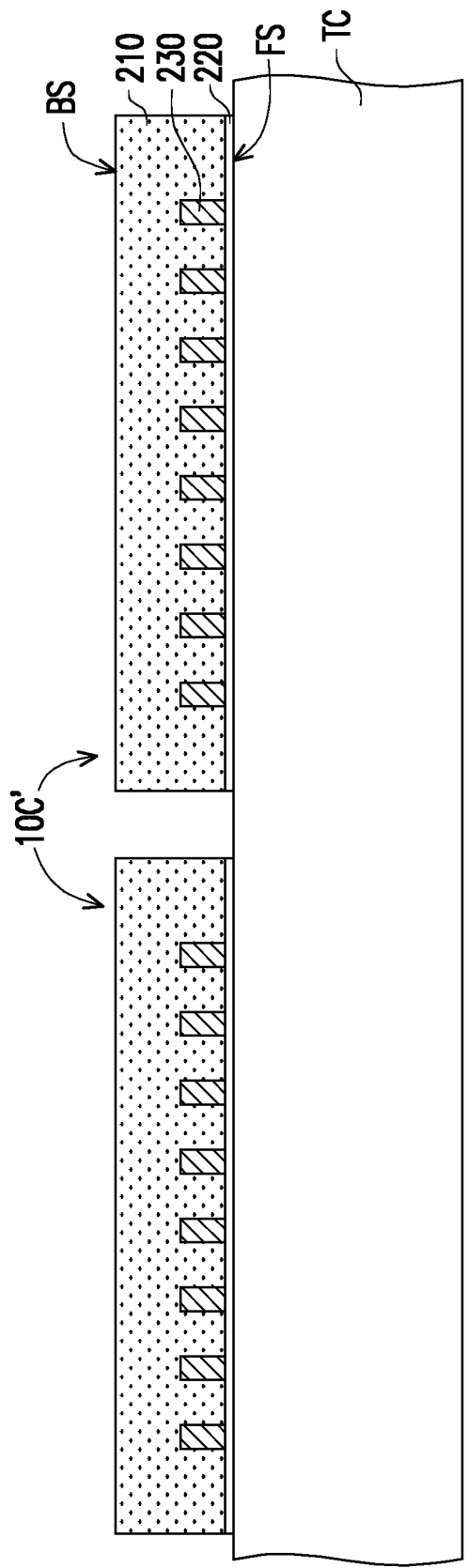

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic cross-sectional view showing a semiconductor die according to some embodiments of the present disclosure. Referring to FIG. 1, a plurality of semiconductor dies 10A' is provided. The semiconductor dies 10A' may be formed in a semiconductor wafer (not shown). For example, the semiconductor wafer is processed to include multiple die regions, and then after formation, the semiconductor wafer may be tested. For example, each die region of the semiconductor wafer is probed and tested for functionality and performance, and only known good dies (KGDs) are selected and used for subsequently processing. In some embodiments, the semiconductor wafer is attached to a temporary carrier or a frame including an adhesive tape, and then the semiconductor wafer is singulated along scribe lines (not shown) to form individual semiconductor die 10A'. For example, the tape frame TP is used for holding the semiconductor wafer in place during the singulation process. The semiconductor dies 10A' singulated from the same semiconductor wafer or singulated from different semiconductor wafers may be vertically stacked to form a die stack in a subsequent process as will be described later in detail accompanying with the figures.

In some embodiments, the semiconductor die 10A' includes a semiconductor substrate 110 having semiconductor devices (not shown) formed therein, an interconnect structure 120 formed on the semiconductor substrate 110, a plurality of conductive vias 130 formed in the semiconductor substrate 110 and extending into the interconnect structure 120, a dielectric layer 140 formed on the interconnect structure 120 and opposite to the semiconductor substrate 110, and a plurality of bonding conductors 150 formed over the interconnect structure 120 and laterally covered by the dielectric layer 140. For example, the semiconductor die 10A' has a front side FS and a backside BS opposite to each other. The bonding conductors 150 are distributed at the front side FS and accessibly revealed by the dielectric layer 140, and the backside BS may be considered to the side distal from the interconnect structure 120 and the bonding conductors 150.

For example, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. The semiconductor substrate 110 may include the semiconductor devices (not shown) formed therein or thereon, and the semiconductor devices may be or may include active devices (e.g., transistors, diodes, etc.) and/or passive devices (e.g., capacitors, resistors, inductors, etc.), or other suitable electrical components. In some embodiments, the semiconductor devices are formed at the side of the semiconductor substrate 110 proximal to the interconnect structure 120.

The semiconductor substrate 110 may include circuitry (not shown) formed in a front-end-of-line (FEOL), and the interconnect structure 120 may be formed in a back-end-of-line (BEOL). In some embodiments, the interconnect structure 120 includes an inter-layer dielectric (ILD) layer formed over the semiconductor substrate 110 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

For example, the interconnect structure 120 including one or more dielectric layer(s) and metallization pattern(s) is formed on the semiconductor substrate 110. The metallization pattern(s) may be embedded in the dielectric layers (e.g., the IMD layers), and the metallization patterns (e.g., metal lines, metal vias, metal pads, etc.) may be formed of conductive materials such as copper, gold, aluminum, the like, or combinations thereof. In some embodiments, the interconnect structure 120 is electrically coupled to the semiconductor devices formed in and/or on the semiconductor substrate 110 to one another and to external components (e.g., test pads, bonding conductors, etc.). For example, the metallization patterns in the dielectric layers route electrical signals between the semiconductor devices of the semiconductor substrate 110. The semiconductor devices and metallization patterns are interconnected to perform one or more functions including memory structures (e.g., memory cell), processing structures, input/output circuitry, or the like. The outermost layer of the interconnect structure 120 may be a passivation layer made of one or more suitable dielectric materials such as silicon oxide, silicon nitride, low-k dielectrics, polyimide, combinations of these, or the like. In some embodiments, the semiconductor die 10A' includes a conductive pad (e.g., the conductive pad AP illustrated in FIG. 5A) disposed over and electrically coupled to the top metallization pattern of the interconnect structure 120, and the passivation layer of the interconnect structure 120 may have an opening exposing at least a portion of the conductive pad for testing or for further electrical connection.

In some embodiments, the conductive vias 130 are formed to extend into the semiconductor substrate 110. The conductive vias 130 may be in physical and electrical contact with the metallization patterns of the interconnect structure 120. For example, when the conductive vias 130 are initially formed, the conductive vias 130 are embedded in the semiconductor substrate 110 and may not extend to the backside BS of the semiconductor substrate 110. In some embodiments, the thickness T1 of the semiconductor die 10A' is in a range of about 100 μm to about 600 μm. In other embodiments, when the semiconductor substrate 110 is thinned to have the conductive vias 130 accessibly revealed at the backside BS, the conductive vias 130 may be referred to as through semiconductor vias (TSVs) or through silicon vias when the semiconductor substrate 110 is a silicon substrate. In some embodiments, each of the conductive vias 130 includes barrier material(s) (e.g., TiN, Ta, TaN, Ti, or the like; not shown) and conductive material (e.g., copper, tungsten, aluminum, silver, combinations thereof, or the like; not shown). The barrier material(s) may be formed between the conductive material and the semiconductor substrate 110. In some embodiments, a dielectric liner (e.g., silicon nitride, an oxide, a polymer, a combination thereof, etc.; labeled in FIG. 8A) is formed between the barrier materials of the conductive vias and the semiconductor substrate 110.

In an embodiment, the conductive vias 130 are formed by forming recesses in the semiconductor substrate 110 and depositing dielectric liner, barrier materials, and conductive materials in the recesses, removing excess materials on the semiconductor substrate 110. For example, the recesses of the semiconductor substrate 110 are lined with the dielectric liner so as to laterally separate the conductive vias 130 from the semiconductor substrate 110. The conductive vias 130 may be formed by using a via-first approach. For example, the conductive vias 130 are formed during the formation of the interconnect structure 120. Alternatively, the conductive vias 130 (i.e. TSVs) are formed by using a via-last approach, and may be formed after the formation of interconnect structure 120.

In some embodiments, the dielectric layer 140 is formed on the interconnect structure 120. For example, the dielectric layer 140 includes one or more layers of dielectric materials (e.g., silicon nitride, silicon oxide, high-density plasma (HDP) oxide, tetra-ethyl-ortho-silicate (TEOS), undoped silicate glass (USG), the like, or a combination thereof). In some embodiments, the dielectric layer 140 laterally covering the bonding conductor 150 is subsequently used for bonding. It should be appreciated that the dielectric layer 140 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials. The structure of the dielectric layer 140 will be described in details later in conjunction with figures.

The bonding conductors 150, such as bond vias and/or bond pads, are formed over the interconnect structure 120 to provide an external electrical connection to the circuitry and semiconductor devices. The bonding conductors 150 may be formed of conductive materials such as copper, gold, aluminum, the like, or combinations thereof. The bonding conductors 150 may be electrically coupled to the semiconductor devices of the semiconductor substrate 110 through the interconnect structure 120. The bonding conductors 150 may be substantially leveled with the dielectric layer 140 for bonding. The above examples are provided for illustrative purposes, other embodiments may utilize fewer or additional elements (e.g., conductive pads), and the details of the semiconductor dies will be described later in accompanying with enlarged views.

FIG. 2A to FIG. 2D are schematic cross-sectional views showing various stages in a manufacturing method of a semiconductor die according to some embodiments of the present disclosure. Like elements are designated with the same reference numbers for ease of understanding and the details thereof are not repeated herein. Referring to FIG. 2A, a semiconductor wafer W1' is processed to completion of all levels. For example, the semiconductor wafer W1' includes multiple die regions, and each die region may include integrated circuit devices (e.g., a logic die, a memory die, a radio frequency die, a power management die, a micro-electro-mechanical-system (MEMS) die, the like, or combinations of these). The configuration of die regions may be similar to that of semiconductor die 10A' described in FIG. 1. For example, each die location includes the semiconductor substrate 110, the interconnect structure 120, the conductive vias 130, the dielectric layer 140, and the bonding conductors 150.

Referring to FIG. 2B, the semiconductor wafer W1' is placed on a temporary carrier TC by a temporary bonding layer TB. A material of the temporary carrier TC may include glass, metal, ceramic, silicon, plastic, combinations thereof, multi-layers thereof, or other suitable material that can provide structural support for the semiconductor wafer W1' in subsequent processing. In some embodiments, the temporary carrier TC is made of glass, and the temporary bonding layer TB used to adhere the semiconductor wafer W1' to the temporary carrier TC includes a polymer adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used. In some embodiments, the temporary carrier TC is a silicon wafer, and the temporary bonding layer TB includes a silicon-containing dielectric material (e.g., silicon oxide, silicon nitride, etc.) or other suitable dielectric material(s) used for bonding. For example, the bonding includes oxide-to-oxide bonding and the dielectric layer 140 of the semiconductor wafer W1' is bonded to the temporary bonding layer TB. Alternatively, the temporary bonding layer TB is omitted. In some embodiments, the front side FS of the semiconductor wafer W1' is attached to the temporary carrier TC and the backside BS of the semiconductor wafer W1' faces upwardly for subsequent processing.

Referring to FIG. 2C and FIG. 2D, the semiconductor wafer W1' is thinned to form a thinned semiconductor wafer W1 by, for example, grinding, chemical mechanical polishing (CMP), combinations thereof, or other suitable thinning techniques. For example, a thinning process is performed on the backside BS of the semiconductor wafer W1' so that the conductive vias 130 are accessibly revealed through the back surface 110b of the semiconductor substrate 110. Since the conductive vias 130 extend through the semiconductor substrate 110, the conductive vias 130 may be referred to as through semiconductor vias (TSVs) or through silicon vias when the semiconductor substrate 110 is a silicon substrate. In some embodiments, after thinning, the thickness T2 of the thinned semiconductor wafer W1 is in a range of about 5 μm to about 500 μm.

Continue to FIG. 2D, after wafer backside thinning, the thinned semiconductor wafer W1 is mounted on the tape frame TP. In some embodiments, the structure shown in FIG. 2C is overturned (e.g., flipped upside down) such that the back surface 110b of semiconductor substrate 110 is disposed on the tape frame TP. Next, a de-bonding process may be performed on the temporary carrier TC to release from the thinned semiconductor wafer W1. For example, external energy (e.g., UV light or a laser) is applied on the temporary bonding layer TB. Alternatively, the removal process of the temporary carrier TC may include a mechanical peel-off process, a grinding process, an etching process, or the like. In some embodiments, a cleaning process is performed to remove residues of temporary bonding layer TB from the thinned semiconductor wafer W1 by using suitable solvent, cleaning chemical, or other cleaning techniques. Subsequently, a singulation process is performed on the thinned semiconductor wafer W1. For example, the tape frame TP holds the thinned semiconductor wafer W1 in place during the singulation process, and a dicing tool (e.g., a saw) may be used to cut through the thinned semiconductor wafer W1 along the scribe lines (not shown) to dice the die regions into a plurality of semiconductor dies 10B. In other embodiments, the singulation process is performed prior to mounting on the tape frame TP.

In some embodiments, the temporary carrier TC illustrated in FIG. 2B and FIG. 2C is replaced by the tape frame TP. For example, the semiconductor wafer W1' is mounted on the first tape frame with the front side FS facing towards the first tape frame, and then the thinning process is performed on the backside BS of the semiconductor wafer W1' until the conductive vias 130 are revealed. Subsequently, the thinned semiconductor wafer W1 is transferred to be mounted on the second tape frame with the back surface 110b of semiconductor substrate 110 facing towards the second tape frame, and then the singulation process is performed, and the second tape frame holds the thinned semiconductor wafer W1 in place during the singulation process. In some embodiments, the semiconductor dies 10B and the semiconductor dies 10A' described in FIG. 1 are similar in functions and properties. It should be noted that above examples are provided for illustrative purposes, the formation of the semiconductor dies 10B can be formed in any logical order which are not limited in the disclosure.

Figure 3C:
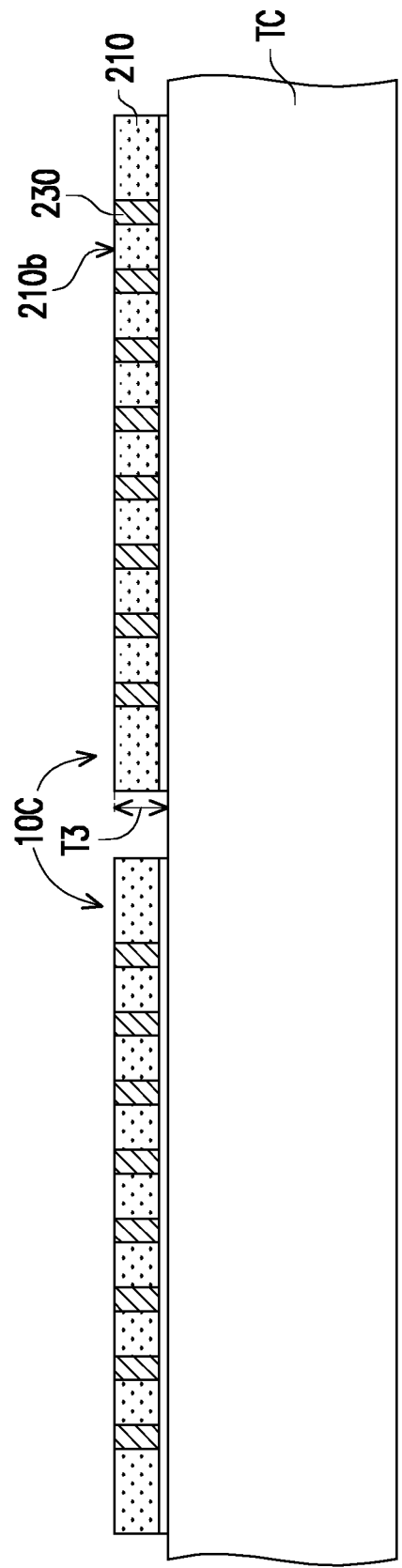

FIG. 3A to FIG. 3C are schematic cross-sectional views showing various stages in a manufacturing method of a carrier die according to some embodiments of the present disclosure. Like elements are designated with the same reference numbers for ease of understanding and the details thereof are not repeated herein. Referring to FIG. 3A, a semiconductor die 10C' is provided. For example, a semiconductor wafer is processed in a manner to generate individual semiconductor dies 10C'. The semiconductor die 10C' may include a structure similar to the semiconductor die 10A'. For example, the semiconductor die 10C' has the front side FS and the backside BS opposite to each other, and includes the semiconductor substrate 210 having semiconductor devices formed therein, the interconnect structure 220 formed over the semiconductor substrate 210 and including dielectric layers and metallization patterns proximal to the front side FS, and the conductive vias 230 formed in the semiconductor substrate 210 and extending into the dielectric layers of the interconnect structure 220 to be in physical and electrical contact with the metallization pattern of the interconnect structure 220. The conductive vias 230 of the semiconductor die 10C' may be electrically coupled to the semiconductor devices and the metallization patterns of the interconnect structure 220.

It should be noted that various layers and features of the semiconductor dies are omitted from the figures. For example, the interconnect structure 220 includes a passivation layer (not individually illustrated) formed over the top metallization pattern of the interconnect structure 220 in order to provide a degree of protection for the underlying structures. The passivation layer may be made of one or more suitable dielectric materials such as silicon oxide, silicon nitride, low-k dielectrics, polyimide, combinations of these, or the like. The conductive pads may be covered by the passivation layer at this point for protection.

It is appreciated that semiconductor dies diced from different semiconductor wafers may have different properties and functions. In some embodiments, the semiconductor die 10C' and the semiconductor die 10A' and/or 10B are singulated from different semiconductor wafers, and may be different in functions and properties. For example, the semiconductor die 10C' is a logic die (e.g., a system-on-a-chip (SoC), a central processing unit (CPU), a graphics processing unit (GPU), etc.). The semiconductor die 10A' described in FIG. 1 or the semiconductor die 10B described in FIG. 2D may be a memory die (e.g., a dynamic random access memory (DRAM) die, a static random access memory (SRAM) die, a synchronous dynamic random access memory (SDRAM), a NAND flash, etc.).

Referring to FIG. 3B and FIG. 3C, the semiconductor die 10C' is disposed on the temporary carrier TC. For example, the semiconductor wafer is probed and tested before singulating. After performing the singulation process, only known good semiconductor dies 10C' are picked and placed on the temporary carrier TC. In some embodiments, the temporary bonding layer (not shown; e.g., the temporary bonding layer TB described in conjunction with FIG. 2B) is deposited on the temporary carrier TC, and the front side FS of the semiconductor die 10C' is attached to the temporary carrier TC through the temporary bonding layer. In other embodiments, the temporary bonding layer is omitted.

Next, the thinning process (e.g., grinding, CMP, or the like) is performed on the backside BS of each semiconductor die 10C' until the conductive vias 230 are accessibly revealed through the back surface 210b of the semiconductor substrate 210 so as to form carrier dies 10C. The conductive vias 230, which penetrate through the semiconductor substrate 210, may be referred to as through semiconductor vias (TSVs) or through silicon vias when the semiconductor substrate 210 is a silicon substrate. In some embodiments, after attaching the semiconductor dies 10C' to the temporary carrier TC, each semiconductor die 10C' is thinned to form the carrier die 10C having a thickness T3 below 100 μm. The thickness T3 of each carrier die 10C may be in a range of about 5 μm to about 100 μm. For example, the thickness T3 of the carrier die 10C is at least about 20 μm. It should be noted that various layers and features of the semiconductor dies are omitted from the figures, and the carrier dies 10C may include more elements formed therein to perform different functions.

Figure 4A:
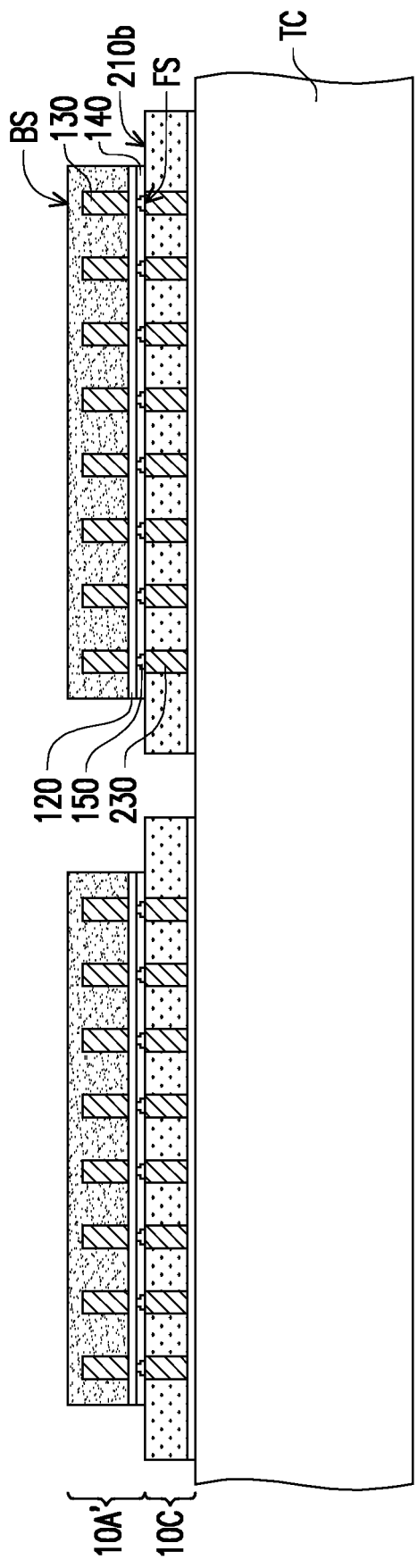
FIG. 4A to FIG. 4F are schematic cross-sectional views showing various stages in a manufacturing method of a semiconductor structure according to some embodiments of the present disclosure.
Figure 4B:
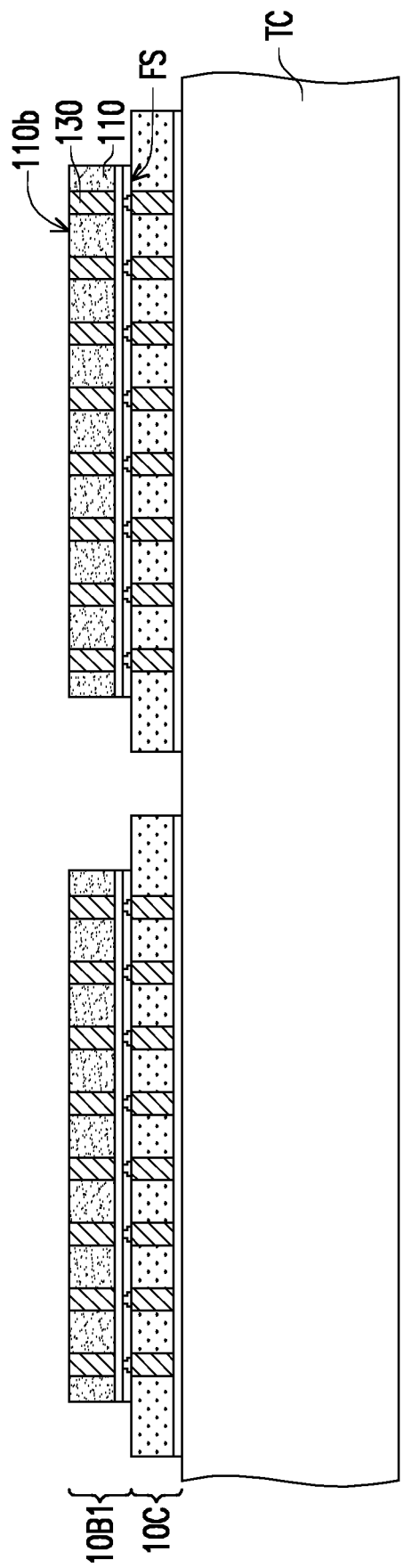
Figure 4C:
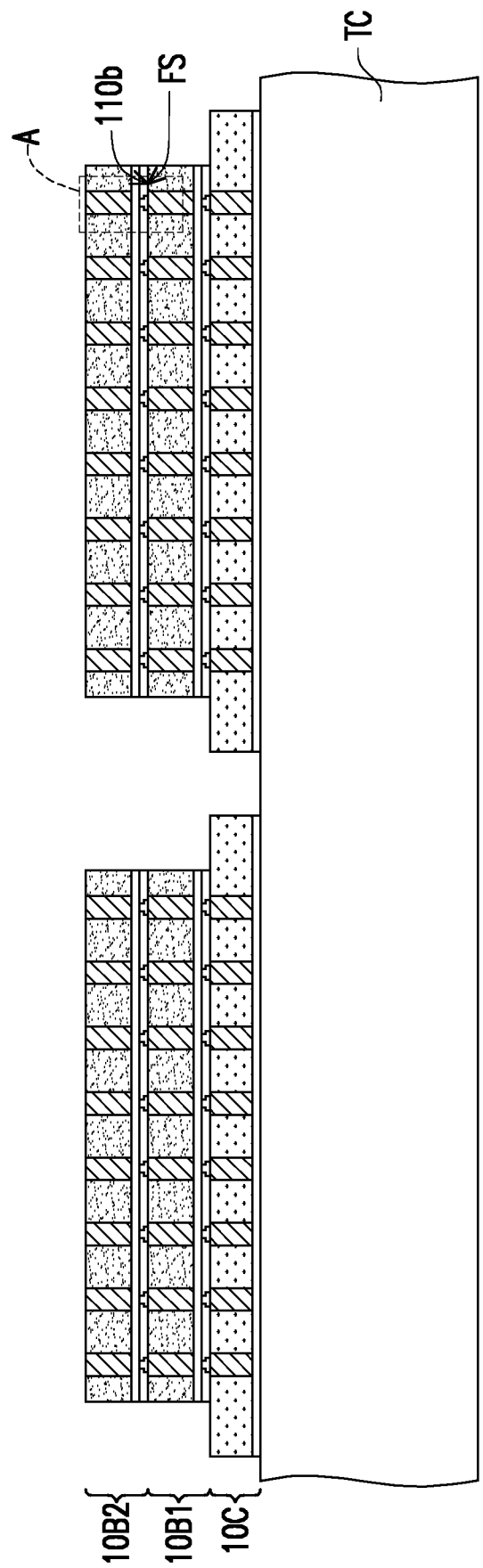
Figure 4D:
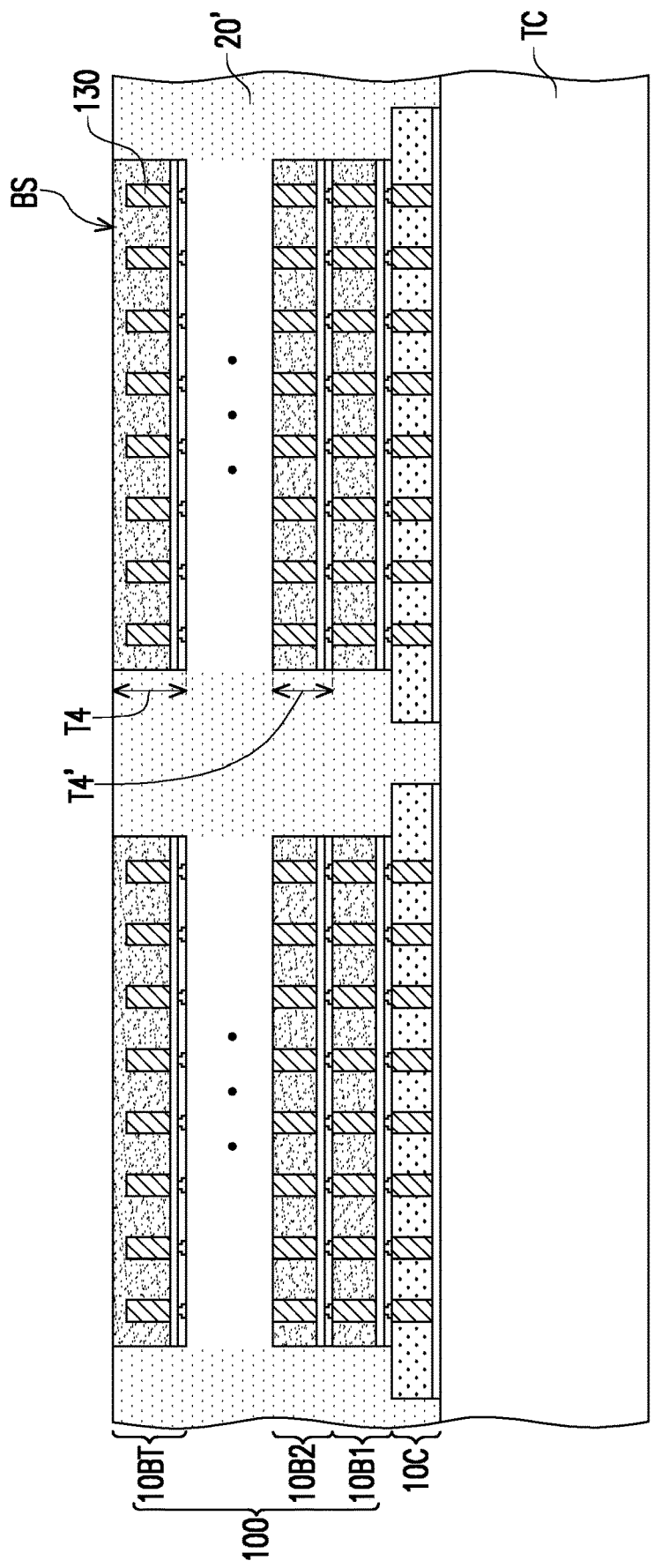
Figure 4E:
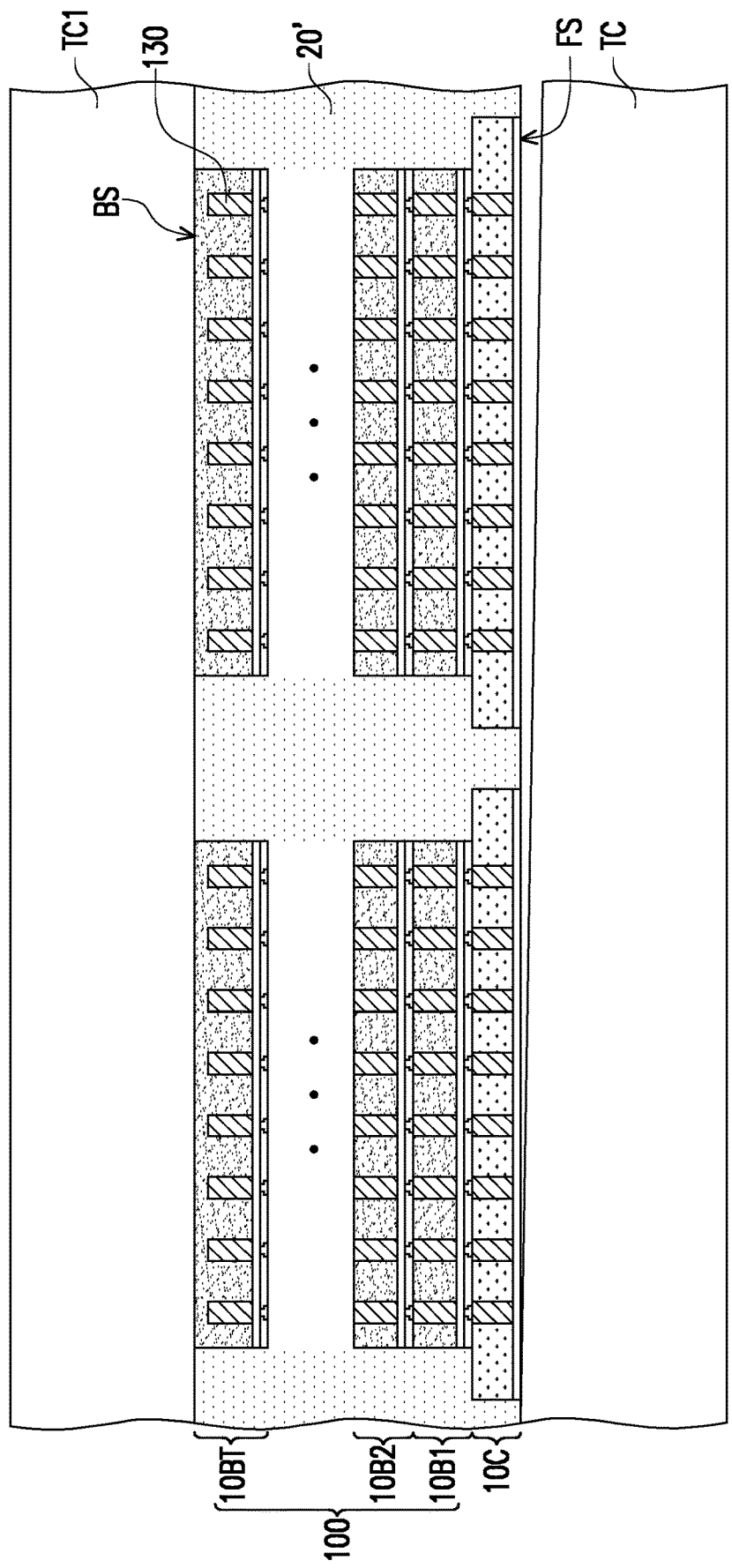
Figure 4F:
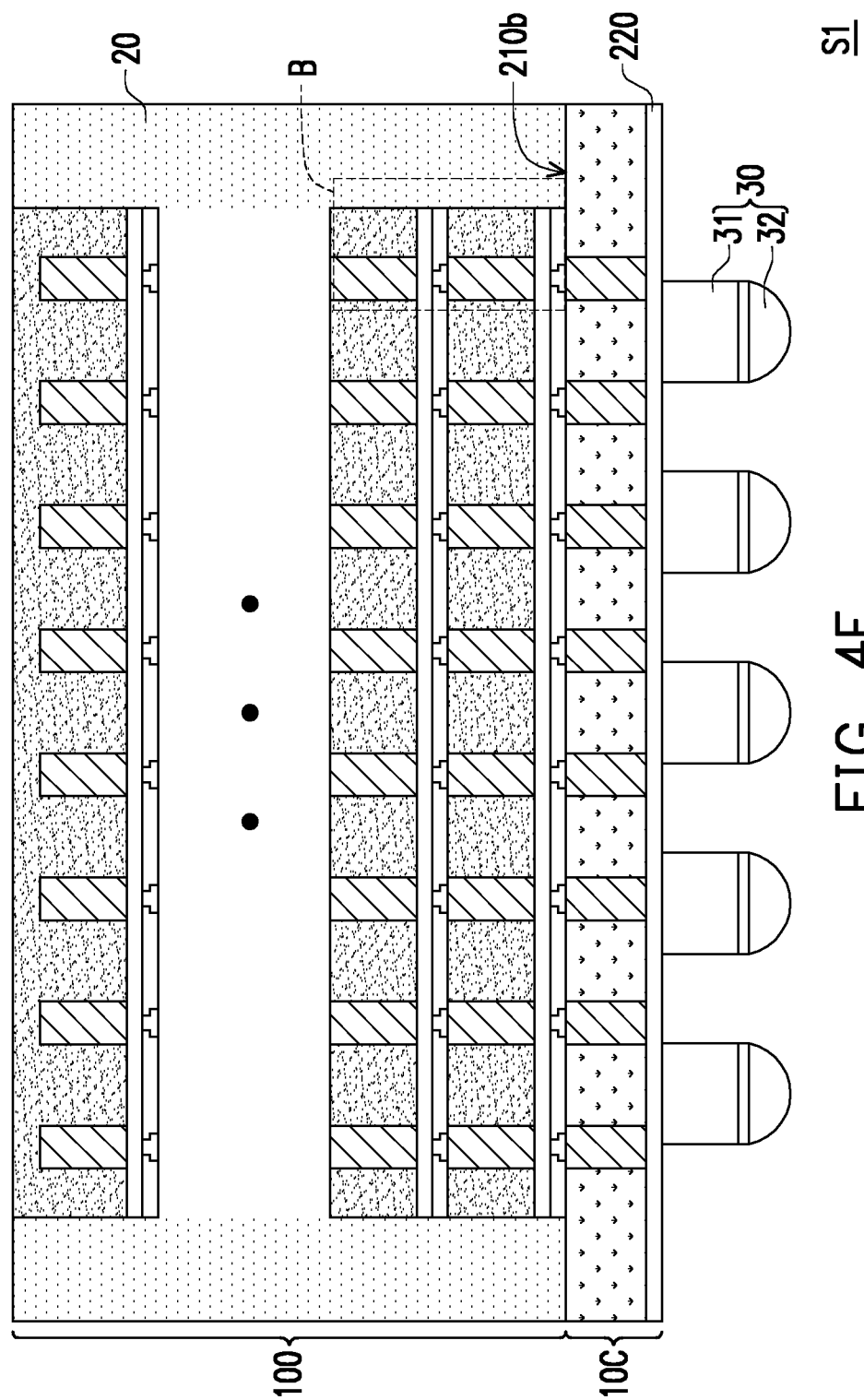
Figure 5A:
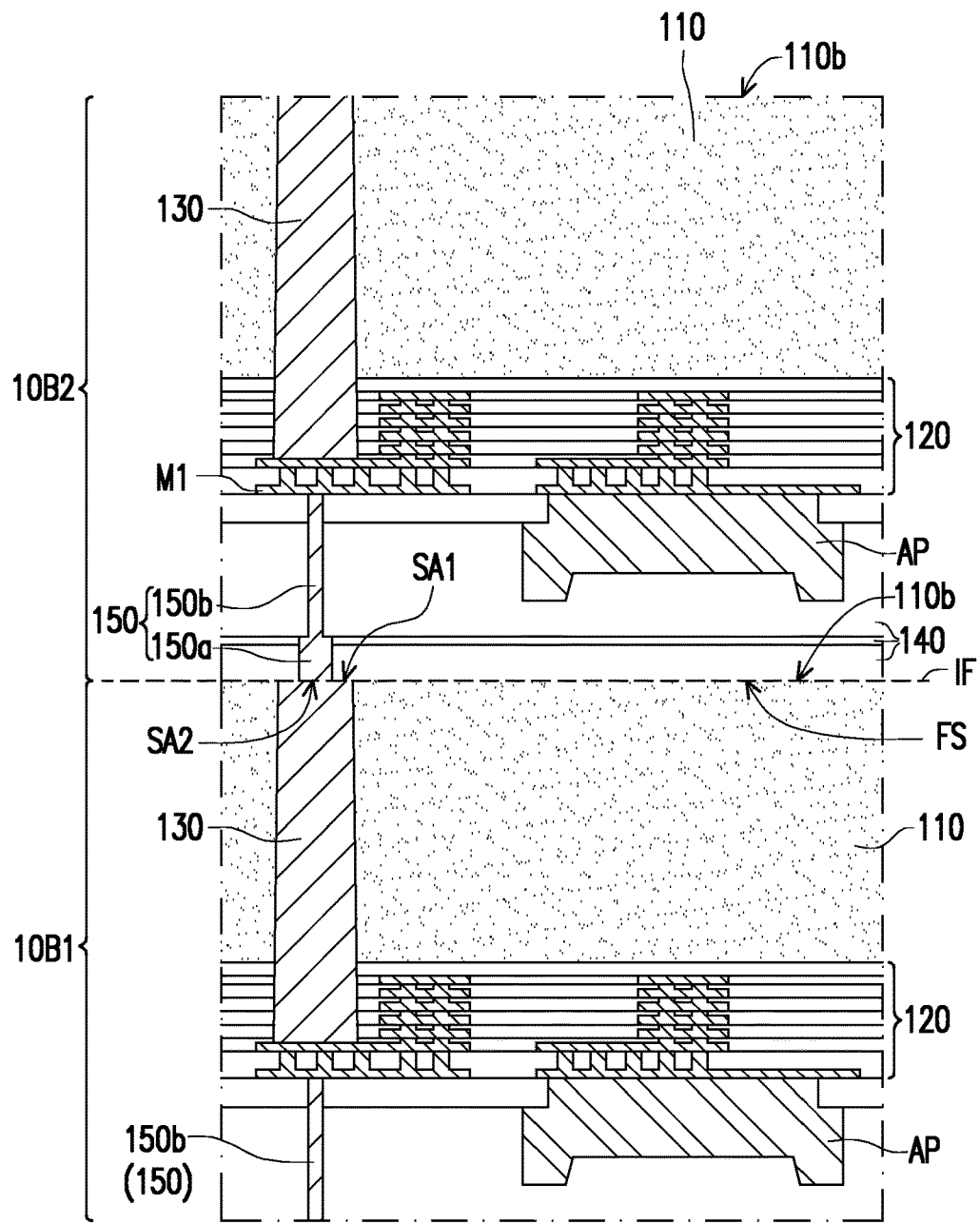
FIG. 5A is an enlarged and schematic cross-sectional view showing a dashed area A outlined in FIG. 4C according to some embodiments of the present disclosure.
Figure 5B:
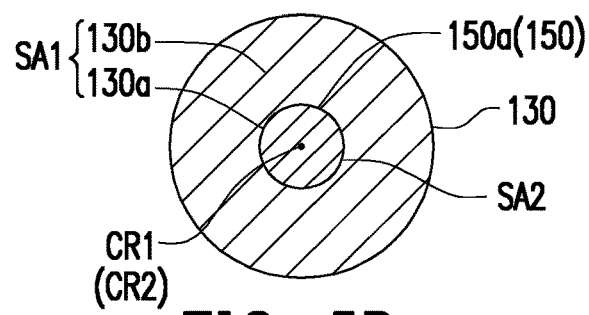
FIG. 5B is a schematic bottom view illustrating the relationship of a bonding conductor and a through semiconductor via at a bonding interface of semiconductor dies in FIG. 5A according to some embodiments of the present disclosure.
Figure 5C:
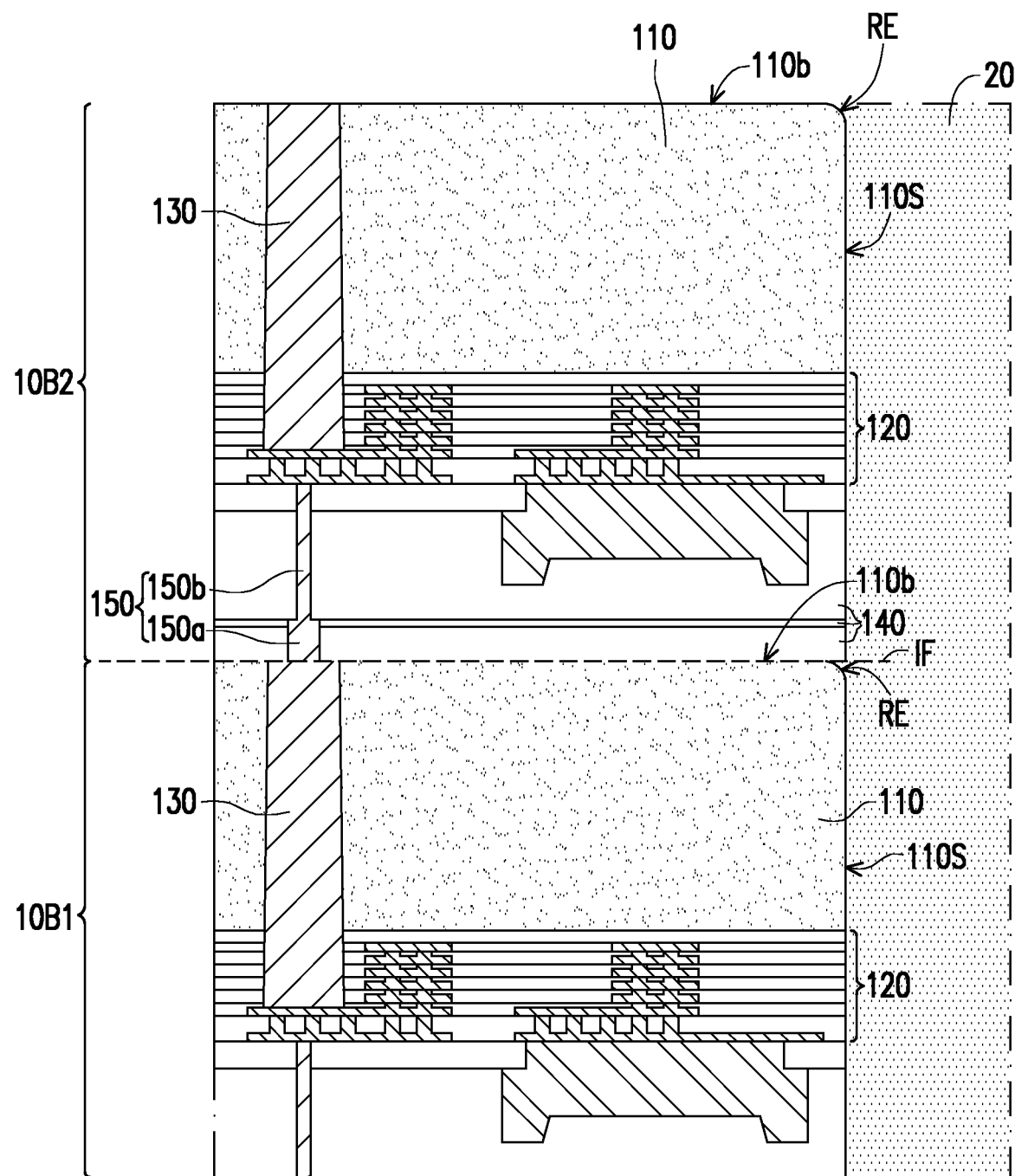
FIG. 5C is an enlarged and schematic cross-sectional view showing a dashed area B outlined in FIG. 4F according to some embodiments of the present disclosure.

FIG. 4A to FIG. 4F are schematic cross-sectional views showing various stages in a manufacturing method of a semiconductor structure according to some embodiments of the present disclosure, FIG. 5A is an enlarged and schematic cross-sectional view showing a dashed area A outlined in FIG. 4C according to some embodiments of the present disclosure, FIG. 5B is a schematic bottom view illustrating the relationship of a bonding conductor and a through semiconductor via at a bonding interface of semiconductor dies in FIG. 5A according to some embodiments of the present disclosure, and FIG. 5C is an enlarged and schematic cross-sectional view showing a dashed area B outlined in FIG. 4F according to some embodiments of the present disclosure. The manufacturing method of the semiconductor structure includes bonding a die stack to a carrier die (e.g., 10C), where forming the die stack involves stacking the semiconductor dies (e.g., 10A' or 10B). Like elements are designated with the same reference numbers for ease of understanding and the details thereof are not repeated herein.

Referring to FIG. 4A, the semiconductor die 10A' is stacked on the carrier dies 10C. For example, the semiconductor die 10A' and the carrier die 10C are separately fabricated as respectively described in conjunction with FIG. 1 and FIG. 3A through FIG. 3C. Next, the semiconductor die 10A' may be removed from the tape frame TP (shown in FIG. 1) to be mounted on the carrier dies 10C by using, for example, a pick-and-place process or other suitable attaching techniques. The semiconductor die 10A' may be tested before bonding, so that only known good die (KGD) is used for attaching. The semiconductor die 10A' may be disposed on the carrier die 10C in a face-to-back configuration. For example, the front side FS of the semiconductor die 10A' face toward the back surface 210b of the carrier dies 10C.

In some embodiments, a bonding process is performed to bond the semiconductor die 10A' to the carrier dies 10C. For example, a bonding interface between the semiconductor die 10A' and the carrier die 10C includes metal-to-metal bonding (e.g., copper-to-copper bonding), metal-to-dielectric bonding (e.g., oxide-to-copper bonding), oxide-to-silicon bonding, dielectric-to-dielectric bonding (e.g., oxide-to-oxide bonding), adhesive bonding, any combinations thereof, and/or the like. For example, the bonding conductors 150 of the semiconductor die 10A' and the TSVs 230 of the carrier dies 10C are bonded together through copper-to-copper bonding, and the dielectric layer 140 of the semiconductor die 10A' is bonded to a silicon back surface 210b of the carrier dies 10C.

In some embodiments in which the dimensions of bonding conductors 150 are smaller than those of corresponding TSVs 230, the dielectric layer 140 of the semiconductor die 10A' immediately adjacent to the bonding conductors 150 may be bonded to a portion of the TSVs 230 of the carrier dies 10C. In other embodiments, before bonding the semiconductor die 10A' to the carrier dies 10C, a bonding dielectric film (not shown; e.g., a bonding oxide) and bonding conductors (not shown) are formed on the back surface 210b of the carrier dies 10C, such that the bonding conductors of two dies are bonded to each other through direct metal-to-metal bonding, and the bonding dielectric film of one of two semiconductor dies is bonded to the bonding dielectric film (or a silicon surface in some embodiments) of the other die. It should be noted that bonding methods described above are merely examples and are not intended to be limiting.

Referring to FIG. 4B, the thinning process (e.g., grinding, CMP, or the like) may be performed on the backside BS of the semiconductor die 10A' until the conductive vias 130 are accessibly revealed through the back surface 110b of the semiconductor substrate 110 so as to form the semiconductor die 10B1. The semiconductor die 10B1 may be referred to as the first tier of the die stack. In some other embodiments, the semiconductor die 10B1 is fabricated by the method described in conjunction with FIG. 2A to FIG. 2D, and transferred from the tape frame TP to be bonded to the carrier dies 10C so as to render the structure illustrated in FIG. 4B. That is, the backside thinning of semiconductor dies may be performed prior to the bonding.

Referring to FIG. 4C, FIG. 5A, and FIG. 5B, the semiconductor die 10B2 is attached to the semiconductor die 10B1 to form a second tier of the die stack. For example, the semiconductor dies 10B1 and 10B2 are bonded together in a face-to-back configuration. In some embodiments, the semiconductor die 10A' fabricated by the method described in conjunction with FIG. 1 is picked and placed on the semiconductor die 10B1. The front side FS of the semiconductor die 10A' may be bonded to the back surface 110b of the semiconductor die 10B1. Next, the backside of the semiconductor die 10A' is thinned to accessibly reveal the conductive vias 130 through the back surface 110b of the semiconductor substrate 110 so as to form the semiconductor die 10B2. In some other embodiments, the semiconductor die 10B fabricated by the method described in conjunction with FIG. 2A to FIG. 2D is placed on and bonded to the back surface 110b of the semiconductor die 10B1 so as to form the semiconductor die 10B2 at the second tier of the die stack. The semiconductor dies 10B1 and 10B2 may be similar in configurations, functions, and properties.

Turning to FIG. 5A and FIG. 5B, FIG. 5A shows the enlarged view of the bonding area between the semiconductor dies 10B1 and 10B2, and FIG. 5B illustrates the relative configuration of the bonding conductor 150 of the semiconductor die 10B2 and the TSV 130 of the semiconductor die 10B1 after bonding. The bonding conductor 150 of the semiconductor die 10B2 distributed at the front side FS is in physical and electrical contact with the TSV 130 of the semiconductor die 10B1. In some embodiments, the TSV 130 is tapered from the interconnect structure 120 to the back surface 110. Alternatively, the TSV 130 has substantially vertical sidewalls. The shape of the TSV 130 may depend on the design requirements, and is not intended to be limiting in the disclosure.

In some embodiments, the dielectric layer 140 is a multi-layered structure having more than one layer of dielectric materials. The layer of dielectric material(s) that is in physical contact with the back surface 110b of the semiconductor die 10B1 may be different from or similar to the overlying layer(s) of dielectric materials. For example, the layer of dielectric material(s) that is in physical contact with the back surface 110b of the semiconductor die 10B1 may be high-density plasma (HDP) oxide, tetra-ethyl-ortho-silicate (TEOS), undoped silicate glass (USG), a combination thereof, or the like. In some embodiments, the dielectric layer 140 includes an etch stop material layer interposed between two layers of dielectric materials. The etch stop material layer may be formed of a material having a high etching selectivity relative to the adjacent layer(s) of dielectric material(s). In some embodiments, the middle layer of dielectric material sandwiched in-between and serving as the etch stop layer has a thinnest thickness in the dielectric layer 140. For example, the thickness of the etch stop layer in the dielectric layer 140 ranges from about 500 angstroms to about 1000 angstroms. In some embodiments, a silicon nitride layer is interposed between two silicon oxide layers to serve as the etch stop layer in the dielectric layer 140. Alternatively, the etch stop material layer is omitted in the dielectric layer 140. In some embodiments, the dielectric layer 140 is a single layer of dielectric material or a bi-layered dielectric having different etching selectivity.

In some embodiments, the bonding conductor 150 includes a pad portion 150a bonding to the TSV 130, and a via portion 150b extending from the pad portion 150a to reach the top metallization pattern M1 of the interconnect structure 120. The via portion 150b of the bonding conductor 150 may have a width (e.g., diameter) narrower than the pad portion 150a. For example, a critical dimension of the pad portion 150a of the bonding conductor 150 ranges from about 0.5 μm to about 5 μm, and a critical dimension of the via portion 150b of the bonding conductor 150 ranges from about 0.1 μm to about 2 μm. In other embodiments, the via portion 150b of the bonding conductor 150 extends further to be in contact with any other level of metallization pattern underneath the top metallization pattern M1 of the interconnect structure 120. For example, the bonding conductor 150 is formed by a dual damascene process or any suitable process. It should be appreciated that a single damascene process or other suitable patterning process may be used to form the bonding conductor of the semiconductor die in other embodiments.

The dual damascene process may be the via-first-trench-last approach or the trench-first-via-last approach. As an example of the dual damascene process, openings for a via portion and a pad portion are formed in the dielectric layer 140. The opening for the pad portion may be wider than the opening for the via portion. In some embodiments, the etch stop material layer of the dielectric layer 140 is used to form the openings for the via portion and the pad portion. Next, a seed layer is deposited in the openings of the dielectric layer 140, and then the conductive material is filled in the openings of the dielectric layer 140 by, for example, plating, printing, sputtering, or the like. A planarization process (e.g., CMP) is optionally performed to remove excess materials, such that top surfaces of the bonding conductor 150 and dielectric layer 140 may be substantially leveled.

Continue to FIG. 5A, the bonding conductor 150 may be formed aside a conductive pad AP. The conductive pad AP may be formed over the interconnect structure 120 and opposite to the semiconductor substrate 110. For example, the conductive pad AP is in electrical contact with the metallization patterns (e.g., top metallization pattern M1 or other levels of metallization patterns) of the interconnect structure 120. The conductive pad AP may be made of different conductive material from the bonding conductor 150. For example, the conductive pad AP is made of aluminum or alloy thereof. Other conductive materials, such as copper, copper alloy, may alternatively be used to form the conductive pad AP. In some embodiments, the conductive pad AP is used for testing. For example, before bonding, the semiconductor die (e.g., 10A' or 10B) is tested using dedicated testing pads such as the conductive pad AP. The dielectric layer 140 may be thick enough to embed the conductive pad AP therein. The TSV 130 may be accessibly revealed from the back surface 110b of the semiconductor substrate 110 and extend into any level of metallization patterns of the interconnect structure 120. In some embodiments, the TSV 130 of the semiconductor die (e.g., 10B1 or 10B2) substantially corresponds to the bonding conductor 150 of the same semiconductor die, such that the semiconductor dies having the same or similar configuration(s) may be easily stacked upon one another and bonded together, thereby improving manufacturability.

Still referring to FIG. 5A and FIG. 5B, a bonding interface IF between the semiconductor dies 10B1 and 10B2 includes dielectric-to-dielectric bonding (e.g., oxide-to-oxide bonding), metal-to-metal bonding (e.g., copper-to-copper bonding), metal-to-dielectric bonding (e.g., oxide-to-copper bonding), dielectric-to-silicon bonding (e.g., oxide-to-silicon bonding), any combinations thereof, and/or the like. In some embodiments, a dimension (e.g., length, width, diameter, depth, height, etc.) of the bonding conductor 150 is less than that of the TSV 130. For example, the bonding conductor 150 is finer and/or shorter than the TSV 130. The critical dimension of the TSV may be in a range of about 1 μm to about 10 μm. In some embodiments, the TSV 130 at the bonding interface IF has a surface area SA1 greater than a surface area SA2 of the bonding conductor 150 at the bonding interface IF. For example, the bonding conductor 150 is in direct contact with the TSV 130, where the contact area of the TSV 130 and the bonding conductor 150 at the bonding interface IF is substantially equal to the surface area SA2 of the bonding conductor 150.

For example, the surface area SA2 of the bonding conductor 150 is bonded to a first portion 130a of the surface area SA1 of the TSV 130 such that direct metal-to-metal bonding occurs at the bonding interface IF. A center CR1 of the bonding conductor 150 may be substantially aligned with a center CR2 of the TSV 130. In some embodiments, the center CR1 of the bonding conductor 150 is shifted slightly in one direction (e.g., to the right or left) relative to the center CR2 of the TSV 130 due to formation and/or alignment process variations. The perimeter of the bonding conductor 150 may be less than the perimeter of the corresponding TSV 130 and may be located within the perimeter of the corresponding TSV 130. It should be noted that the perimeters of the bonding conductor 150 and the TSV 130 construe no limitation in the disclosure as long as the bonding conductor 150 and the TSV 130 are reliably bonded together. Since the bonding conductor 150 has a smaller bonding surface than the TSV 130, direct metal-to-metal bonding may still be achieved even if misalignment occurs, thereby exhibiting better reliability.

The surface area SA1 of the TSV 130 may include a second portion 130b connected to the first portion 130a. The second portion 130b of the surface area SA1 of the TSV 130 is not bonded to the bonding conductor 150, but bonded to a portion of the dielectric layer 140 (e.g., immediately adjacent to the bonding conductor 150), such that metal-to-dielectric bonding occurs at the bonding interface IF. The rest portion of the dielectric layer 140, which is not bonded to the TSV 130, may be bonded to the semiconductor substrate 110 such that dielectric-to-silicon bonding may occur at the bonding interface IF. Other bonding configurations may be employed at the bonding interface IF as will be described later in accompanying with figures.

Referring to FIG. 4D, the steps described above are repeated to form the die stack 100 including a topmost semiconductor die 10BT. It should be appreciated that the die stack 100 disposed on the carrier die 10C may include any number of tiers. In some embodiments, the topmost semiconductor die 10BT does not be thinned, and the conductive vias 130 of the topmost semiconductor die 10BT may not be revealed. The conductive vias 130 of the topmost semiconductor die 10BT may remain electrically insulated. In some embodiments, the topmost semiconductor die 10BT is thicker than any one of the underlying semiconductor dies in the die stack 100. For example, a thickness T4 of the topmost semiconductor die 10BT is greater than a thickness T4' of one tier of the other semiconductor dies in the die stack 100.

In some embodiments, the semiconductor dies (e.g., 10B1, 10B2, 10BT) at each tier may be tested before bonding, so that only known good dies (KGDs) are used to form the die stack 100, thereby increasing manufacturing yield. In some embodiments in which the semiconductor dies (e.g., 10B1, 10B2, 10BT) are memory dies, since the semiconductor dies stacked and bonded vertically, faster inter-memory communication may be achieved by the die stack 100 during operation, which in turn may improve data bandwidth and enable faster data access and data storage. In some embodiments, during operation, the semiconductor die 10B1 may help to manage data storage and data format interoperability between the respective semiconductor dies (e.g., 10B2, 10BT) stacked thereon and/or the carrier die 10C.

Continue to FIG. 4D, after forming the die stack 100 on the carrier die 10C, an insulating material 20' is formed over the temporary carrier TC to encapsulate the die stack 100 and the carrier die 10C. The insulating material 20' may include a low moisture absorption rate and may be rigid after solidification for protecting the die stack 100 and the carrier die 10C. For example, the insulating material 20' may be a molding compound, epoxy, the like, or other suitable electrically insulating materials, and may be applied by compression molding, transfer molding, or the like. In some embodiments, the die stack 100 and the carrier die 10C are over-molded, and then the insulating material 20' is thinned to reduce the overall thickness of the structure by using, for example, grinding, chemical mechanical polishing (CMP), combinations thereof, or other suitable thinning process. For example, the backside BS of the topmost semiconductor die 10BT is exposed by the insulating material 20' after thinning. In other embodiments, the thinning process is omitted and the die stack 100 and the carrier die 10C are buried or covered by the insulating material 20'.

Referring to FIG. 4E, after forming the insulating material 20', another temporary carrier TC1 is optionally attached to the insulating material 20' opposite to the temporary carrier TC. In some embodiments in which the insulating material 20' is thinned to expose the topmost semiconductor die 10BT, the temporary carrier TC1 is bonded to the insulating material 20' and the backside BS of the topmost semiconductor die 10BT. A de-bonding process may be performed on the temporary carrier TC to release from the carrier die 10C such that the front side FS of the carrier die 10C is exposed. In some embodiments, the front side FS of the carrier die 10C is cleaned after de-bonding the temporary carrier TC for further processing.

Referring to FIG. 4F and FIG. 5C, after removing the temporary carrier TC, the front side FS of the carrier die 10C is exposed. A plurality of conductive terminals 30 may be subsequently formed at the front side FS of the carrier die 10C. In some embodiments in which the passivation layer (not individually illustrated) of the interconnect structure 220 covers the underlying metallization patterns, a portion of the passivation layer is removed to form openings. The openings of the passivation layer may accessibly expose at least a portion of the underlying metallization pattern. Next, the conductive terminals 30 may be formed in the openings of the passivation layer to be in electrical contact with the metallization patterns of the interconnect structure 220 by using, for example, a sputtering, printing, plating, deposition, or the like. The conductive terminals 30 may be formed of conductive material(s) including copper, aluminum, gold, nickel, silver, palladium, tin, solder, metal alloy, the like, or combinations thereof. Alternatively, before forming the conductive terminals 30, other processes may be performed at the front side FS of the carrier die 10C depending on the design requirements.

For example, each of the conductive terminals 30 includes a bump 31. The bump 31 may be a micro-bump, a metal pillar, an electroless nickel-electroless palladium-immersion gold (ENEPIG) formed bump, a controlled collapse chip connection (C4) bump, a ball grid array (BGA) bump, or the like. In an embodiment in which the bumps 31 are micro-bumps, a bump pitch between two adjacent bumps 31 ranges from about 35 µm to about 55 µm. The bumps 31 may be solder free and may have substantially vertical sidewalls. In some embodiments, each of the conductive terminals 30 includes a metal cap 32 formed on the top of the bump 31 by, for example, plating, printing, or the like. For example, a material of the metal caps 32 includes nickel, tin, tin-lead, gold, silver, palladium, nickel-palladium-gold, nickel-gold, the like, or any combination of these.

In some embodiments, after forming the conductive terminals 30, the temporary carrier TC1 (shown in FIG. 4E) is de-bonded from the insulating material 20'. For example, a de-bonding process includes applying energy to the temporary bonding layer, mechanical peeling, etching, or other suitable removal techniques. Subsequently, a singulation process is performed to form a plurality of semiconductor structures S1. The singulation may be performed along scribe lines (not shown) by, for example, a sawing, laser cutting, or the like. The insulating material 20' may be cut through to form an insulating encapsulation 20. In some embodiments, the sidewalls of the carrier die 10C are exposed by the insulating encapsulation 20 after singulation. For example, the sidewalls of the insulating encapsulation 20 may be substantially leveled with the sidewalls of the insulating encapsulation 20 after singulation. The insulating encapsulation 20 is disposed around the sidewalls of the die stack 100 and directly on the back surface 210b of the carrier die 10C. In other embodiments, the insulating encapsulation 20 covers the sidewalls of the carrier die 10C and the die stack 100 after singulation. In some embodiments, the carrier die 10C is, for example, a logic die configured to perform read, program, erase, and/or other operations, and the die stack 100 is, for example, a memory stack including memory dies stacked upon one another and programmed by the carrier die 10C. In certain embodiments, the semiconductor structure S1 is referred to as a device package.

Turning to FIG. 5C which shows the enlarged view of the insulating encapsulation 20 and the bonding area between the semiconductor dies 10B1 and 10B2, at least one of the semiconductor substrates 110 of the semiconductor dies 10B1 and 10B2 may have a rounded edge RE. For example, the rounded edge RE is connected to the back surface 110b and the sidewall 110s. In some embodiments, the dielectric layer 140 of the semiconductor die 10B2 is a substantially flat surface so that a gap is formed between the rounded edge RE of the semiconductor die 10B1 and the dielectric layer 140 of the semiconductor die 10B2. The insulating encapsulation 20 may fill the gap and cover the rounded edge RE of the semiconductor die 10B1 and the dielectric layer 140 of the semiconductor die 10B2. In some embodiments, the rounded edge RE is created during the backside thinning process (e.g., the step described in conjunction with FIG. 4B). For example, the grinding pad, which is contact with the edges of the semiconductor dies, makes the edges of the semiconductor dies rounded. Alternatively, the rounded edge RE is created by continuous and perimeter cutting during the singulation process (e.g., the step described in conjunction with FIG. 2C).

For example, the semiconductor dies having the rounded edges RE may be advantageously used in device package configurations compared with the semiconductor dies having rectangular-shaped corners. For example, since thermal stress is highest at boundaries and at corners and edges, the corners and edges of the semiconductor die are the highest mechanical stress locations and are prone to cracking. By forming the rounded edges RE, the semiconductor dies may spread out the stress in the edge/corner area caused by mechanical/thermal stress and by bonding. In other embodiments, the semiconductor die (e.g., 10B1 and 10B2) having the rounded edge RE is bonded to another semiconductor die (e.g., carrier die 10C, topmost tier of the die stack, etc.) having rectangular-shaped, sharply edges. The semiconductor die having rectangular-shaped edges may be the semiconductor die which does not undergo backside grinding.

Figure 6A:
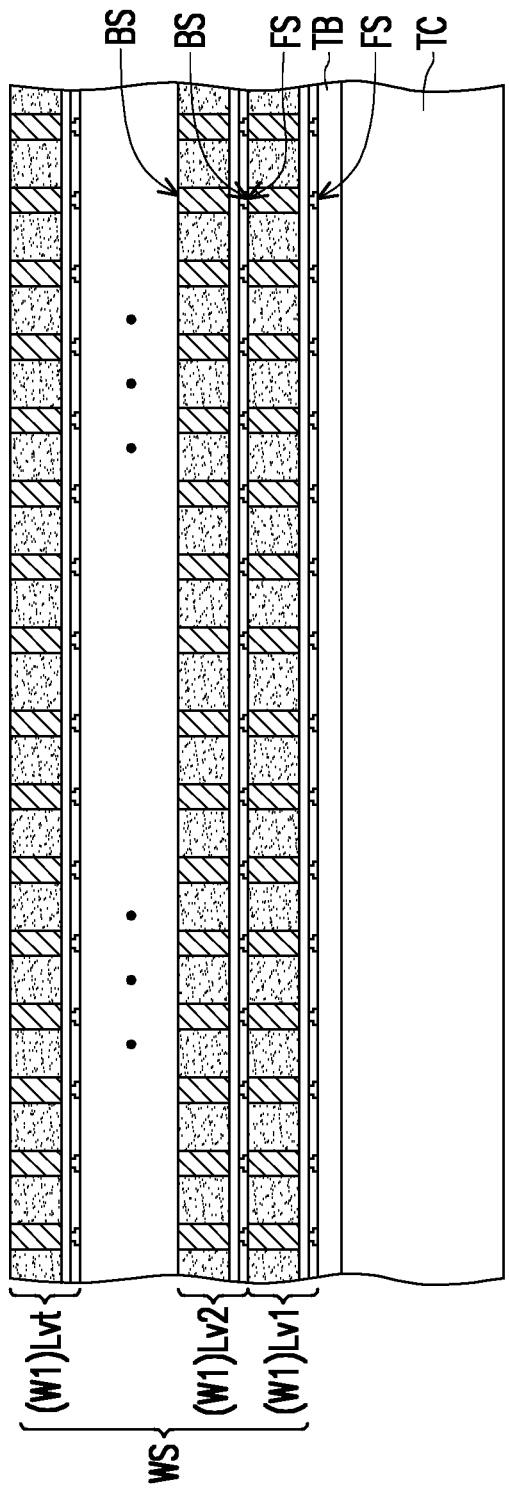
FIG. 6A to FIG. 6D are schematic cross-sectional views showing various stages in a manufacturing method of forming a semiconductor structure according to some embodiments of the present disclosure.
Figure 6B:
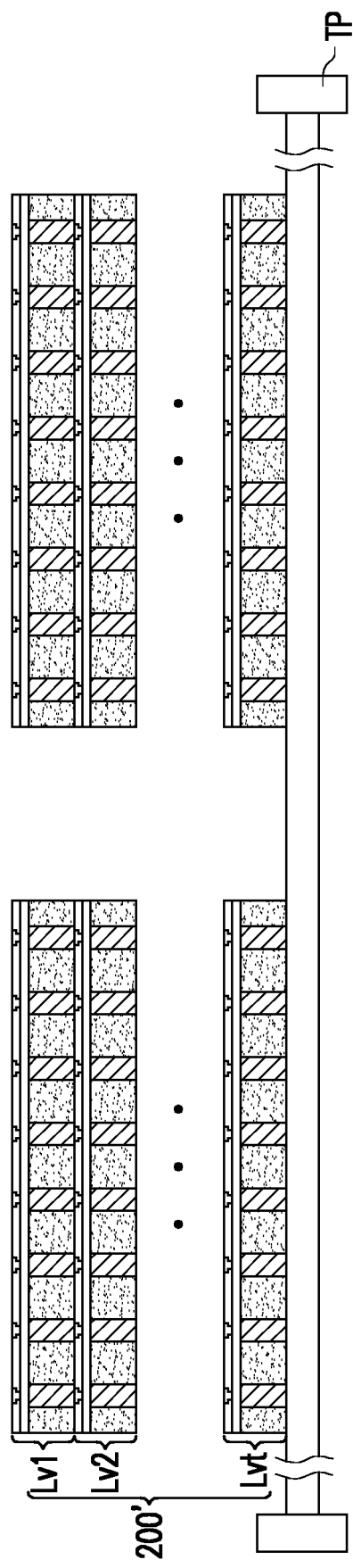

FIG. 6A to FIG. 6D are schematic cross-sectional views showing various stages in a manufacturing method of forming a semiconductor structure according to some embodiments of the present disclosure. Like elements are designated with the same reference numbers for ease of understanding and the details thereof are not repeated herein. Referring to FIG. 6A and FIG. 6B, a plurality of thinned semiconductor wafers W1 are stacked upon one another to form a wafer stack WS. For example, the thinned semiconductor wafer W1 at a first tier Lv1 of the wafer stack WS is fabricated by the method described in conjunction with FIG. 2A to FIG. 2C, and then the front side FS of another semiconductor wafer W1' (as shown in FIG. 2A) is attached to the backside BS of the thinned semiconductor wafer W1 at the first tier Lv1. After bonding, the semiconductor wafer W1' may be thinned to form the thinned semiconductor wafer W1 at a second tier Lv2 of the wafer stack WS.

The thinning and the bonding processes may be similar to the processes described above. It should be appreciated that various methods have been employed for wafer-to-wafer bonding. For example, the wafer-to-wafer bonding includes eutectic bonding, fusion bonding, direct metal bonding, hybrid bonding, any combinations thereof, and/or the like. In some embodiments in which the eutectic bonding occurs, two eutectic materials are placed together, and then a high pressure and a high temperature are applied so that the eutectic materials are melted, and when the melted eutectic materials solidify, the semiconductor wafers are bonded together. In some embodiments in which the fusion bonding occurs, an oxide surface of the semiconductor wafer is bonded to an oxide surface or a silicon surface of another semiconductor wafer. In some embodiments in which the direct metal-to-metal bonding occurs, two bonding conductors are pressed against each other at an elevated temperature, and the inter-diffusion of the bonding conductors may cause the bonding of the bonding conductors. In some embodiments in which the hybrid bonding occurs, the bonding conductors of two semiconductor wafers are bonded together through direct metal-to-metal bonding, and an oxide surface of one of the two semiconductor wafers is bonded to an oxide surface or a silicon surface of the other semiconductor wafer.

In some embodiments, the thinning and the bonding processes are repeated several times to form the wafer stack WS having multiple tiers. It should be appreciated that the wafer stack WS may include any number of tiers. The bonding region between two adjacent tiers may have the configuration similar to the configuration described above in conjunction with FIG. 5A or other configurations described later in other embodiments. The semiconductor wafer at the topmost tier Lvt of the wafer stack WS may be or may not be thinned to reveal the conductive vias depending on the product requirements.

Continue to FIG. 6B, the wafer stack WS may be mounted on the tape frame TP for performing the singulation process. For example, the structure shown in FIG. 6A is overturned (e.g., flipped upside down) and attached to the tape frame TP. Next, the temporary carrier TC is de-bonded from the thinned semiconductor wafer W1 at the first tier Lv1. In some embodiments in which the temporary bonding layer TB is disposed between the wafer stack WS and the temporary carrier TC, the cleaning process is optionally performed to remove undesired residues of the temporary bonding layer TB left at the front side FS of the thinned semiconductor wafer W1. Subsequently, the singulation process is performed on the wafer stack WS to form a plurality of die stacks 200'. It should be noted that above examples are provided for illustrative purposes, the formation of the die stacks 200' can be formed in any logical order which are not limited in the disclosure. In some embodiments, the individual die stack 200' includes several semiconductor dies having the same or similar function(s) and stacked upon one another. In an embodiment, the die stack 200' is a memory cube that is suitable for rapid data access applications. The die stacks 200' may be tested after formation.

Figure 6C:
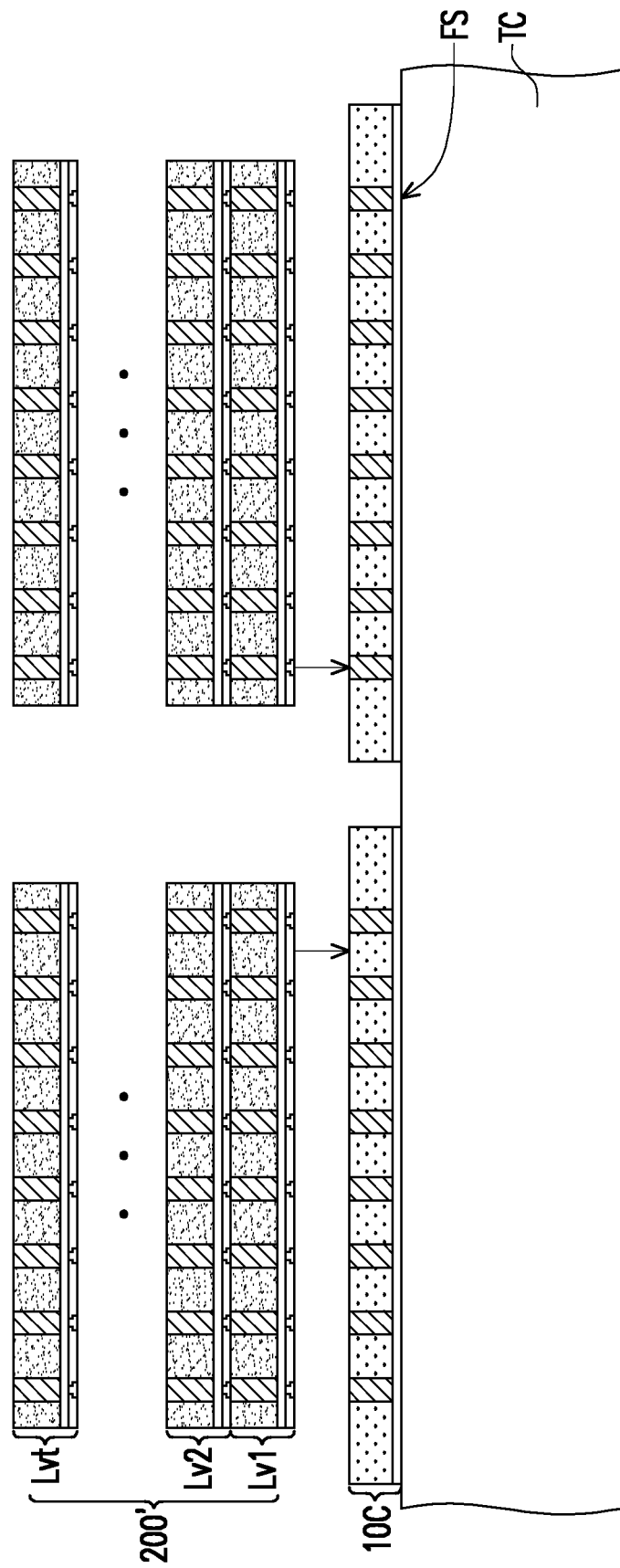
Figure 6D:
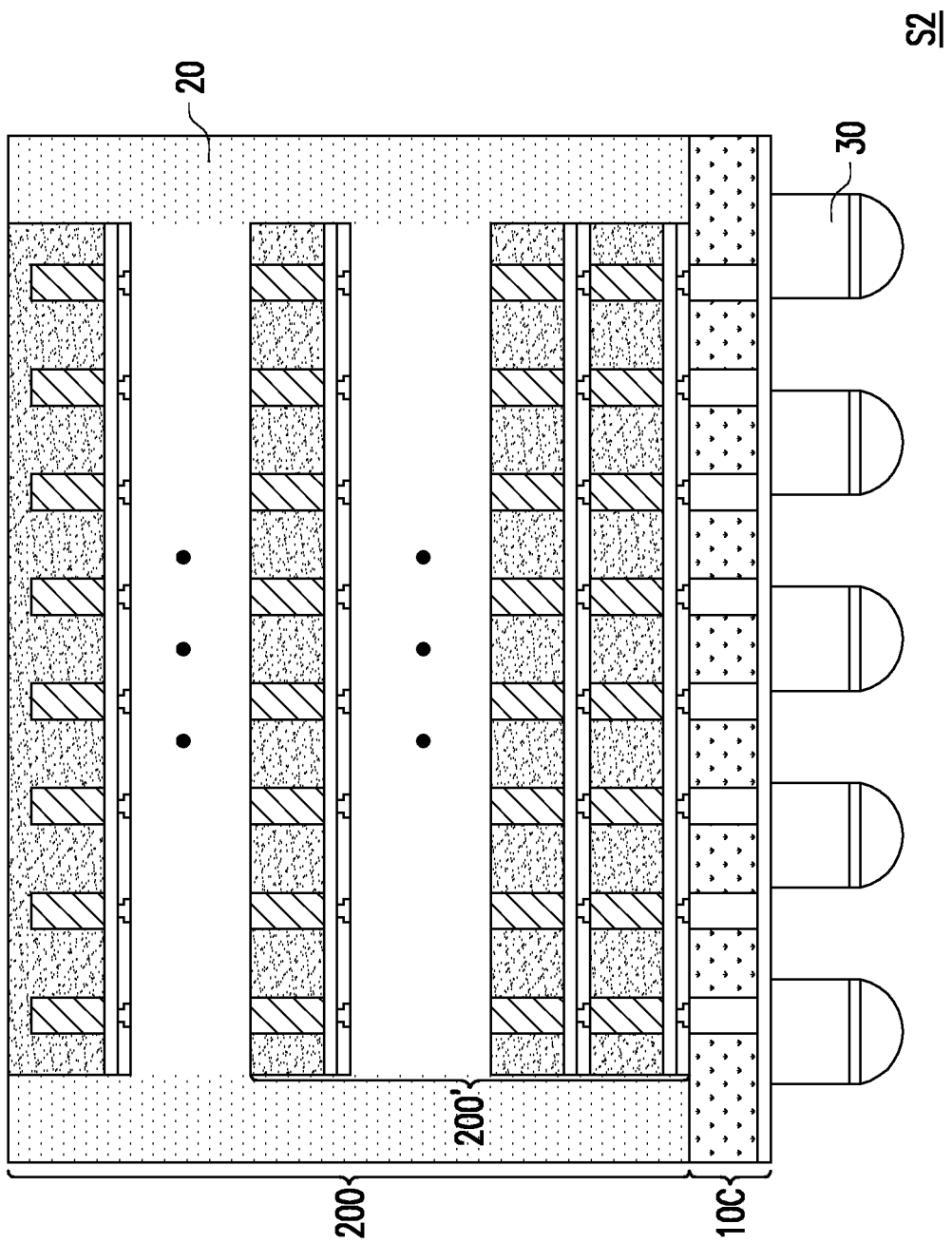

Referring to FIG. 6C and FIG. 6D, the individual die stack 200' is removed from the tape frame TP and bonded to the carrier die 10C. For example, the die stack 200' and the carrier die 10C are separately fabricated, and the formation of the carrier die 10C may be similar to the processes described in conjunction with FIG. 3A to FIG. 3C. After bonding the die stack 200' to the carrier die 10C, another die stack (e.g., 200') is optionally bonded to the die stack 200' so as to form a multi-tiered die stack 200 in accordance with the product requirements. Alternatively, another semiconductor die (e.g., the semiconductor die 10A' illustrated in FIG. 1, the semiconductor die 10B illustrated in FIG. 2D, etc.), or other electrical component(s) is optionally bonded to the die stack 200' so as to form a multi-tiered die stack 200 in accordance with the product requirements.

In some embodiments, after bonding the die stack 200 or forming the multi-tiered die stack 200, the insulating material is formed over the temporary carrier TC. Next, the temporary carrier TC is released to expose the front side FS of the carrier die 10C, and then the conductive terminals 30 are formed at the front side FS of the carrier die 10C. Subsequently, the singulation process is performed to form a plurality of semiconductor structures S2 including the insulating encapsulation 20 around the die stack 200 for protection. The processes of forming the insulating encapsulation 20, de-bonding the temporary carrier TC, forming the conductive terminals 30, and the singulation may be similar to the processes described in conjunction with FIG. 4D to FIG. 4F. The detailed descriptions of these processes are omitted for brevity. In some embodiments, the semiconductor dies in the die stack 200 of the semiconductor structure S2 may be or may include memory dies (e.g., a high bandwidth memory (HBM) dies), and the carrier die 10C may be a logic die providing control functionality for these memory dies. Other types of dies may be employed in the semiconductor structure S2 depending on the product requirements.

FIG. 7A to FIG. 7E are schematic cross-sectional views showing various stages in a manufacturing method of a semiconductor structure according to some embodiments of the present disclosure. FIG. 8A to FIG. 8C are enlarged and schematic cross-sectional views of intermediate steps during a process for exposing a conductive via in a dashed area C outlined in FIG. 7A or FIG. 7B according to some embodiments of the present disclosure. Like elements are designated with the same reference numbers for ease of understanding and the details thereof are not repeated herein.

Referring to FIG. 7A and FIG. 8A to FIG. 8C, a first isolation layer IS1 is formed over the temporary carrier TC to partially cover the carrier die 10C. The formation of the carrier die 10C may be similar to the steps described in conjunction with FIG. 3A to FIG. 3C, so the detailed descriptions are omitted for brevity. For example, after performing the backside thinning process, the semiconductor substrate 210 may be recessed such that the conductive via (i.e. TSV) 230 is accessibly revealed and protruded from the back surface 210b of the semiconductor substrate 210 as shown in FIG. 8A. The TSV 230 may protrude about a few microns from the backside of the back surface 210b of the semiconductor substrate 210. In some embodiments, the dielectric liner DL is interposed between the semiconductor substrate 210 and the TSV 230.

Continue to FIG. 8B and FIG. 8C, the isolation material IS (e.g., silicon nitride, an oxide, silicon oxynitride, silicon carbide, a polymer, the like, etc.) is conformally formed on the back surface 210b of the semiconductor substrate 210 and the TSV 230 by, for example, spin-coating, a chemical vapor deposition (CVD) process, or the like. Alternatively, a native oxide that may be formed on the back surface 210b of the semiconductor substrate 210. The layer of the isolation material IS may be thick enough to cover the protruded portion of the TSV 230. In such embodiments, a portion of the isolation material IS may be removed to accessibly reveal the TSV 230 for further electrical connection by any suitable thinning process (e.g., etching, grinding, a chemical mechanical polishing (CMP) process, or the like). For example, an etching process with a high etch-rate selectivity between the material of the TSV 230 and the isolation material IS may be performed to recess the isolation material IS to form the first isolation layer IS1. In some embodiments, the bottom portion of the TSV 230 protruding from the back surface 210b of the semiconductor substrate 210 is laterally covered by the first isolation layer IS1, and the top portion of the TSV 230 protruding from the back surface 210b of the semiconductor substrate 210 is exposed by the first isolation layer IS1.

Referring to FIG. 7B and FIG. 8A to FIG. 8C, the semiconductor die 10B1 is disposed on the carrier die 10C. The semiconductor die 10B1 may be fabricated by the method described in conjunction with FIG. 2A through FIG. 2D. Alternatively, the semiconductor die 10B1 is provided by thinning the semiconductor die 10A' shown in FIG. 1. For example, the bonding conductors 150 distributed at the front side FS of the semiconductor die 10B1 are correspondingly bonded to the TSVs 230 accessibly revealed from the backside BS of the carrier die 10C. The bonding process may be similar to the processes described in conjunction with FIG. 4A and FIG. 4B, and the detailed descriptions are omitted for brevity. In some embodiments, after bonding the semiconductor die 10B1 to the carrier die 10C, a second isolation layer IS2 is formed to cover the semiconductor die 10B1 and a portion of the first isolation layer IS1 unmasked by the semiconductor die 10B1.

The formation of the second isolation layer IS2 is similar to the formation of the first solation layer IS1. For example, after performing the backside thinning process (e.g., the process described in FIG. 4B or the process described in FIG. 2C), the semiconductor substrate 110 is recessed such that the conductive via (i.e. TSV) 130 is accessibly revealed and protruded from the back surface 110b of the semiconductor substrate 110 as shown in FIG. 8A. The TSV 130 may protrude about a few microns from the backside of the back surface 110b of the semiconductor substrate 110. The dielectric liner DL may be interposed between the semiconductor substrate 110 and the TSV 130. The isolation material IS may be conformally formed on the sidewalls of the semiconductor die 10B1, the back surface 110b of the semiconductor substrate 110, and the TSV 130 protruded from the back surface 110b. The isolation material IS may also cover the portion of the first isolation layer IS1 which is unmasked by the semiconductor die 10B1. Next, the isolation material IS may be partially removed to form the second isolation layer IS2 which accessibly reveals the TSV 130 of the semiconductor die 10B1 for further electrical connection. The bottom portion of the TSV 130 protruding from the back surface 110b of the semiconductor substrate 110 may be laterally covered by the second isolation layer IS2, and the top portion of the TSV 130 protruding from the back surface 110b of the semiconductor substrate 110 may be exposed by the second isolation layer IS2 for further electrical connection.

Figure 7C:
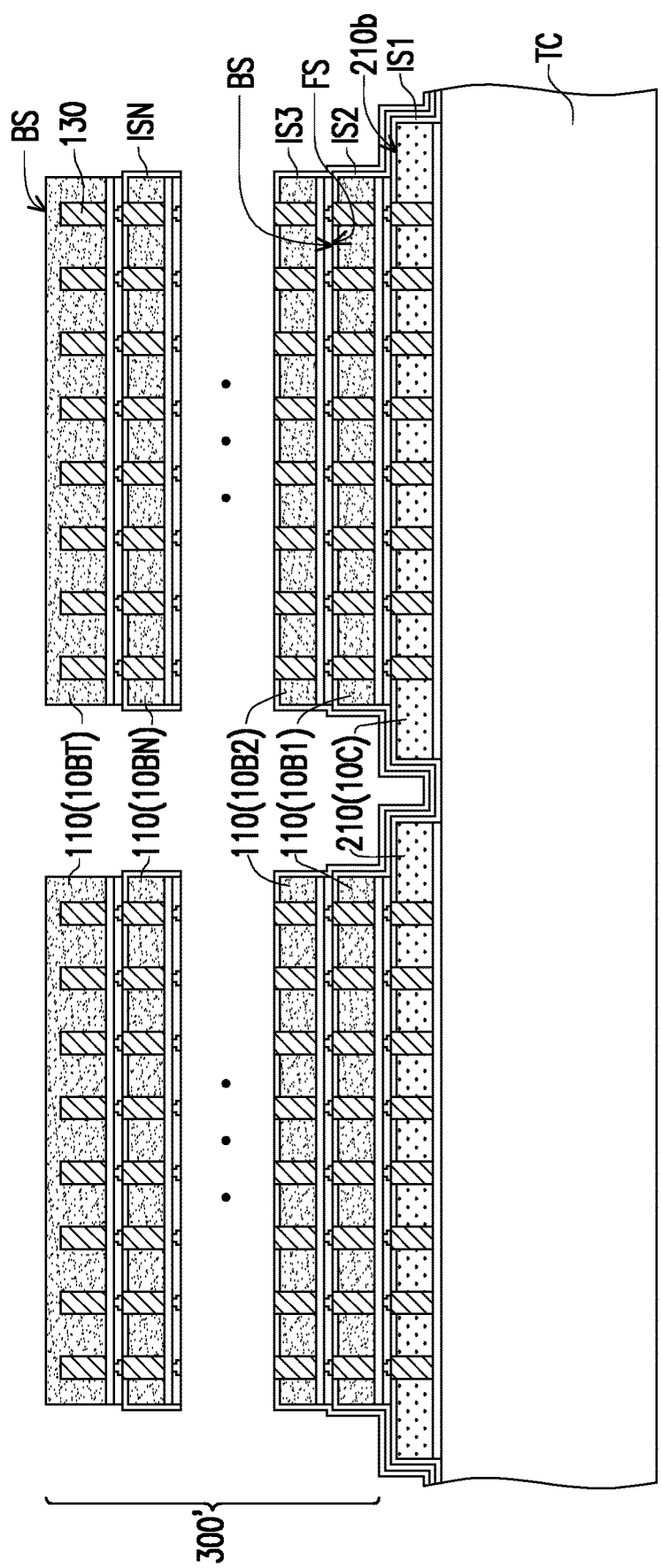

Referring to FIG. 7C, the semiconductor die 10B2 is stacked on the semiconductor die 10B1 to form the second tier of a die stack 300'. The semiconductor dies 10B1 and 10B2 may be bonded together in a face-to-back configuration. The bonding process may be similar to the process described in conjunction with FIG. 4C, and the detailed descriptions are omitted for brevity. In some embodiments, after bonding the front side FS of the semiconductor die 10B2 to the backside BS of the semiconductor die 10B1, a third isolation layer IS3 is formed to cover the semiconductor die 10B2 and a portion of the second isolation layer IS2 unmasked by the semiconductor die 10B2. The TSVs 130 of the semiconductor die 10B2 may be accessibly revealed by the third isolation layer IS3 for further electrical connection. The formation of the third isolation layer IS3 is similar to the formation of the second isolation layer IS2, and the detailed descriptions are omitted for brevity. After forming the third isolation layer IS3, the sidewalls of the semiconductor die 10B1 may be covered by the second isolation layer IS2 and the third isolation layer IS3 overlying thereon, and a portion of the back surface 210b of the carrier die 10C unmasked by the die stack 300' may be covered by the first isolation layer IS1, the second isolation layer IS2, and the third isolation layer IS3.

The steps of bonding the semiconductor dies and forming the isolation layers described above may be repeated several times to form the die stack 300'. It should be noted that the die stack 300' may include any number of tiers of semiconductor dies depending on the product requirements. The topmost semiconductor die 10BT may not be thinned, and the conductive vias 130 of the topmost semiconductor die 10BT are not revealed and remain electrically insulated.

In some embodiments, the sidewalls and the backside of the topmost semiconductor die 10BT of the die stack 300' are not covered by the isolation layer, and each tier of the die stack 300' beneath the topmost semiconductor die 10BT may have the sidewalls and the back surface 110b of the semiconductor substrate 110 covered by the isolation layer (e.g., ISL1, ISL2, etc.). For example, compared to the other underlying tiers of the die stack 300', the semiconductor die 10BN immediately adjacent to the topmost semiconductor die 10BT may have a thinnest layer of the isolation material covering the sidewalls of the semiconductor substrate 110. For the other tiers underlying semiconductor die 10BN, the upper tier in the die stack 300' (e.g., one of the tiers distal to the carrier die 10C) may have thinner isolation layer covering the sidewall of the semiconductor substrate 110 than the lower tier in the die stack 300' (e.g., one of the tiers proximal to the carrier die 10C).

In other embodiments, after forming the first isolation layer IS1, the die stack 200 fabricated by the method described in conjunction with FIGS. 6A and 6B is bonded to the carrier die 10C in a face-to-back configuration, and then another isolation layer is formed on the die stack 200 to cover the sidewalls of each tiers of the die stack 200 and the backside of the topmost tier Lvt. In such embodiments, the isolation layer is interposed between the contact area of the first tier Lv1 of the die stack 200 and the carrier die 10C, whereas the interface of adjacent tiers in the die stack 200 may be free of the isolation layer. In other embodiments, during fabricating the die stack as shown in FIG. 6A and FIG. 6B, the isolation layer(s) may be conformally formed to cover the semiconductor wafer W1 before bonding the next tier of the semiconductor wafer W1, such that after singulation, the isolation layer may be interposed between two adjacent tiers of the die stack, and the sidewalls of the semiconductor substrates in the die stack may be free of isolation layer. After completion of such die stack and forming the first isolation layer IS1 on the carrier die 10C, such die stack may be removed from the tape frame and then bonded to the carrier die 10C. In such embodiments, the isolation materials are not formed layer by layer on the sidewalls of the carrier die 10C and on the back surface 210b of the carrier die 10C unmasked by such die stack.

Figure 7D:
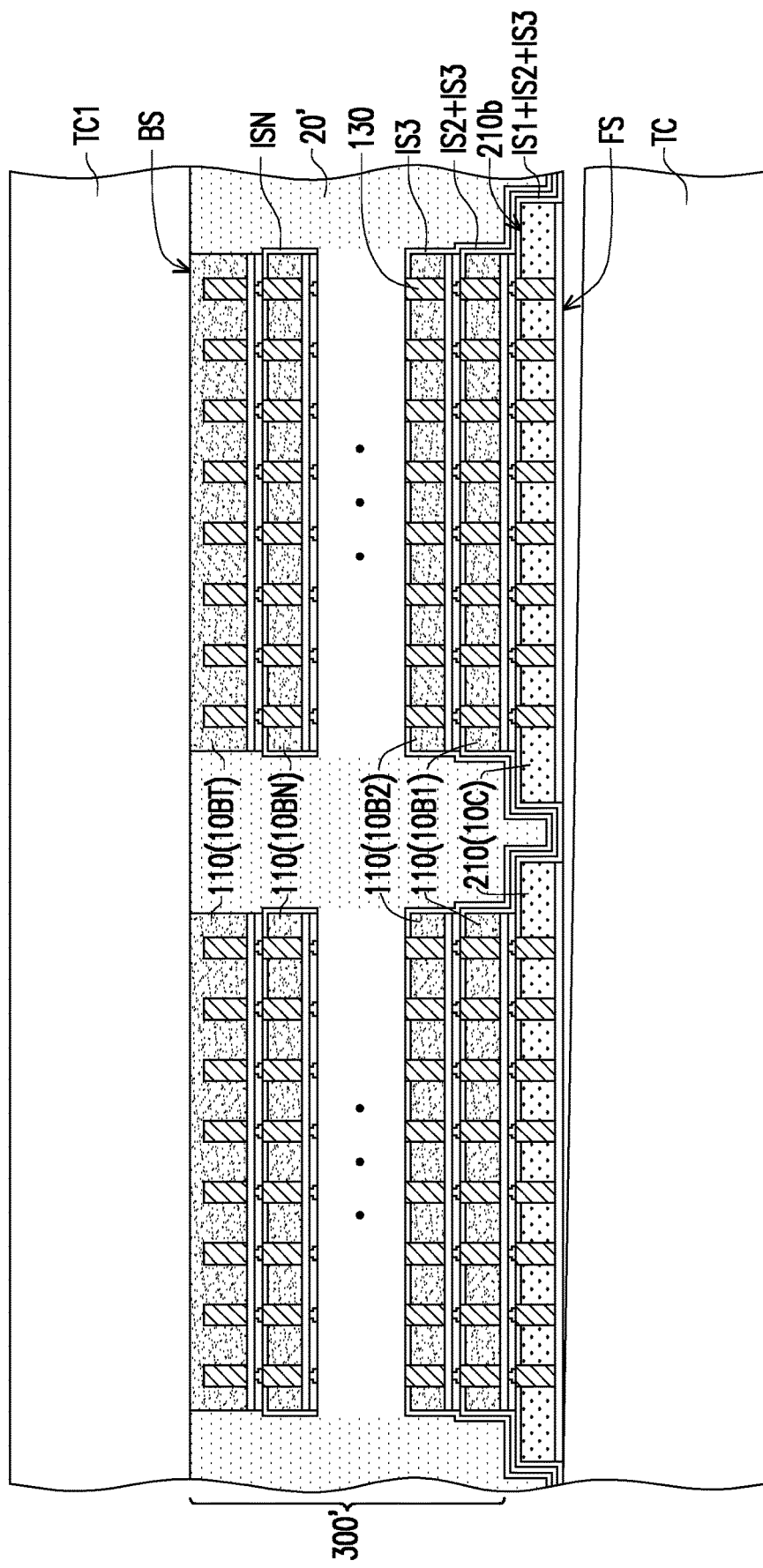

Referring to FIG. 7D, after forming the die stack 300' on the carrier die 10C, the insulating material 20' is formed to encapsulate the die stack 300' and the carrier die 10C. The insulating material 20' is optionally thinned down until the backside of the topmost semiconductor die 10BT of the die stack 300' is revealed. The formation of the insulating material 20' is similar to the process described in conjunction with FIG. 4D, and the detailed descriptions are not repeated herein. Subsequently, after forming the insulating material 20', the temporary carrier TC is de-attached to expose the front side FS of the carrier die 10C. Another temporary carrier TC1 is optionally attached to the insulating material 20' opposite to the temporary carrier TC before de-bonding the temporary carrier TC, such that the temporary carrier TC1 may serve as a mechanical support during the de-bonding process. A cleaning process is optionally performed on the carrier die 10C after de-bonding the temporary carrier TC. The processes above may be similar to the processes described in conjunction with FIG. 4E, and the detailed descriptions are omitted for brevity.

Figure 7E:
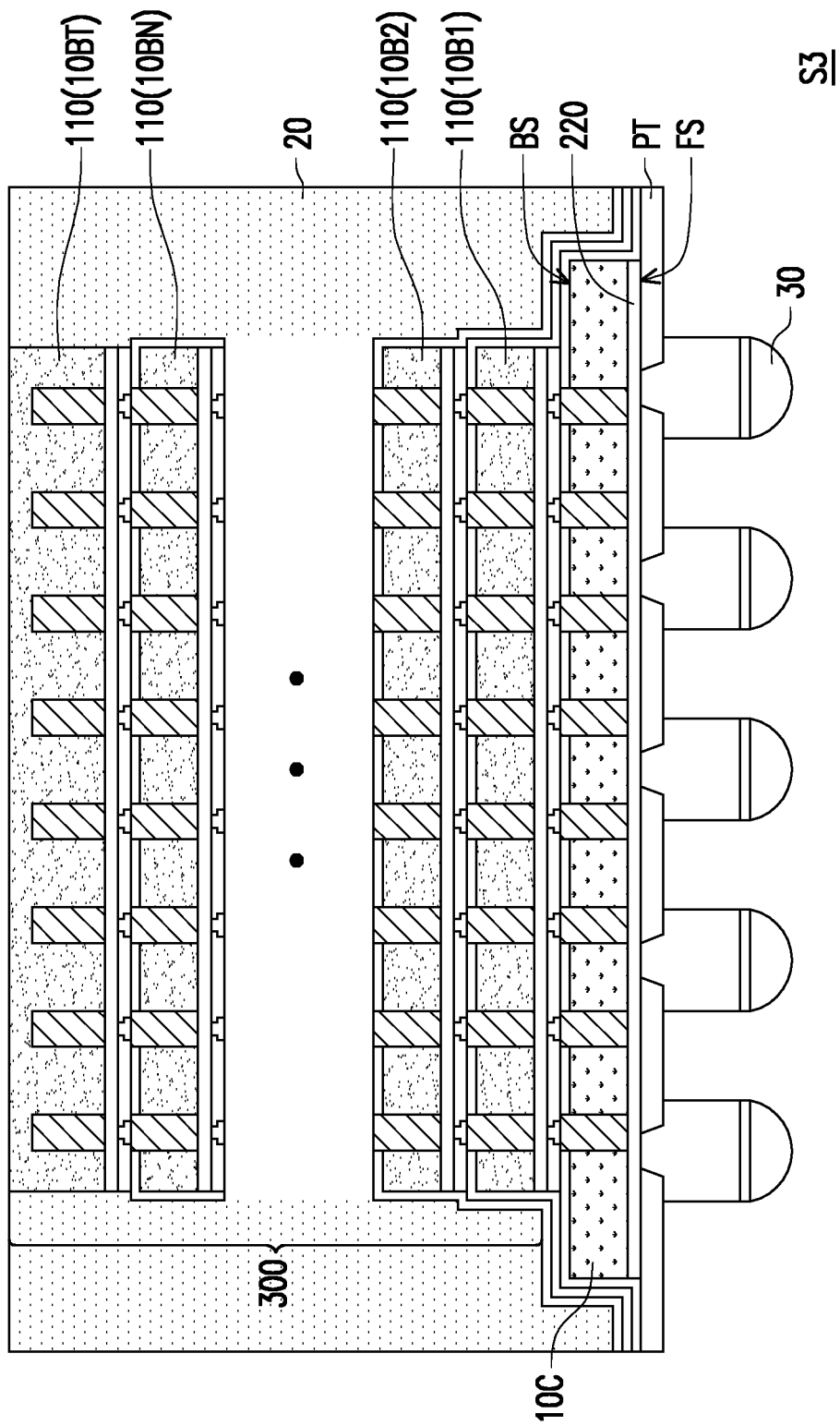

Referring to FIG. 7E, after removing the temporary carrier TC, the conductive terminals 30 may be formed at the front side FS of the carrier die 10C. In some embodiments, before forming the conductive terminals 30, a protection layer PT is formed at the front side FS of the carrier die 10C. In some embodiments, the protection layer PT may extend to cover the first isolation layer IS1. In other embodiments in which the isolation layer(s) are removed, the protection layer PT may extend to be in contact with the insulating material 20'. For example, the protection layer PT includes passivation materials such as silicon oxide, silicon nitride, un-doped silicate glass, polyimide, or other suitable insulating materials for protection the underlying structures. Alternatively, the protection layer PT is omitted. In some embodiments, the protection layer PT includes a plurality of openings exposing at least a portion of the underlying conductive features of the carrier die 10C for further electrical connection. For example, the conductive terminals 30 are formed in the openings of the protection layer PT to be in physical and electrical contact with the interconnect structure 220 of the carrier die 10C. The forming process of the conductive terminals 30 may be similar to the process described in conjunction with FIG. 4F, and the detailed descriptions are omitted for brevity.

In some embodiments, after forming the conductive terminals 30, the temporary carrier TC1 (shown in FIG. 7D) is released. The singulation may be performed to form a plurality of semiconductor structures S3. As shown in FIG. 7E, the semiconductor structure S3 includes the carrier die 10C, the die stack 300 bonded to the carrier die 10C and having multiple tiers, the insulating encapsulation 20 laterally encapsulating the carrier die 10C and the die stack 300. The carrier die 10C and the die stack 300 may have different functions. The die stack 300 includes the semiconductor dies (e.g., 10B1, 10B2, 10BN, 10BT, etc.) vertically stacked upon one another. Two adjacent semiconductor dies in the die stack 300 may be bonded in a face-to-back configuration. The bonding interface between two of the adjacent tiers of the die stack 300 may be similar to the configuration described in conjunction with FIG. 5A, FIG. 5C, or other configurations described later in conjunctions with figures (e.g., FIG. 10 through FIG. 12, FIG. 13A, FIG. 14 through FIG. 17, and FIG. 18A).

The semiconductor structure S3 may include the first isolation layer IS1 at least interposed between the contact area of the carrier die 10C and the first tier of the die stack 300. The other isolation layers (e.g., IS2, IS3, ISN) may be at least interposed between two adjacent and bonded tiers of the die stack 300 which are disposed above the first tier. The semiconductor dies (e.g., 10B1, 10B2, etc.) in the die stack 300 between the topmost semiconductor die 10BT and the carrier die 10C may be wrapped by the isolation layer(s), such that the isolation layer(s) may be formed between the insulating encapsulation 20 and the semiconductor substrates 110. The sidewalls and the backside BS of the topmost semiconductor die 10BT may be free of the isolation layer. The sidewalls and the backside BS of the carrier die 10C may be covered by the isolation layer, and the front side FS of the carrier die 10C may be free of the isolation layer. Alternatively, after singulation, the insulating encapsulation 20 are located over the carrier die 10C and around the die stack 300, the sidewalls of the carrier die 10C may be revealed and may be substantially leveled with the sidewalls of the insulating encapsulation 20.

Figure 9A:
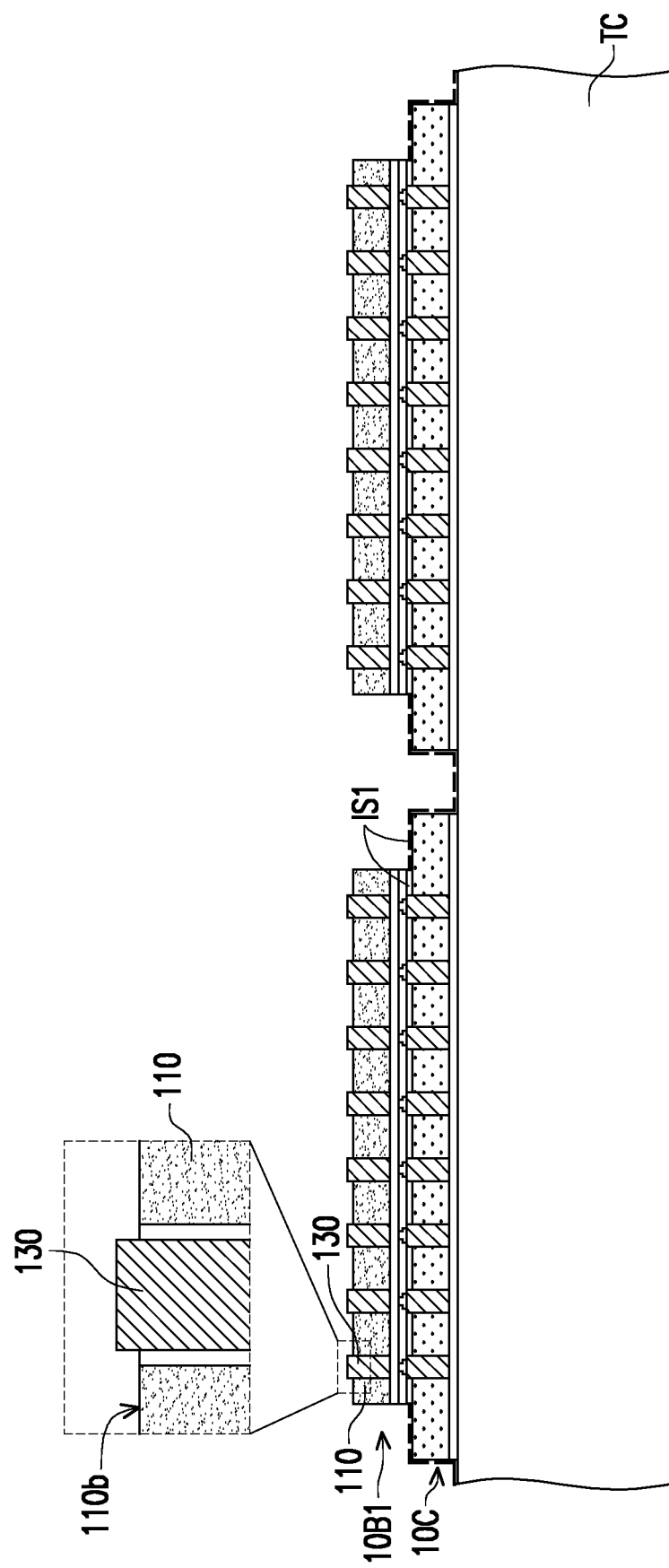
FIG. 9A to FIG. 9C are schematic cross-sectional views showing various stages in a manufacturing method of a semiconductor structure according to some embodiments of the present disclosure.
Figure 9B:
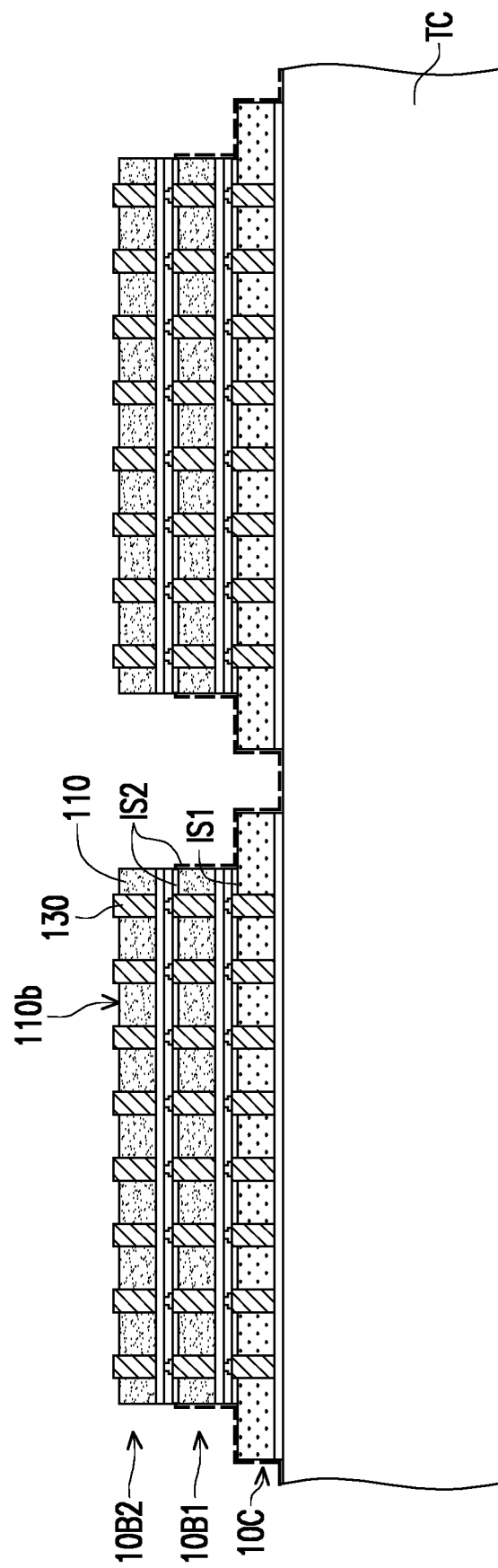
Figure 9C:
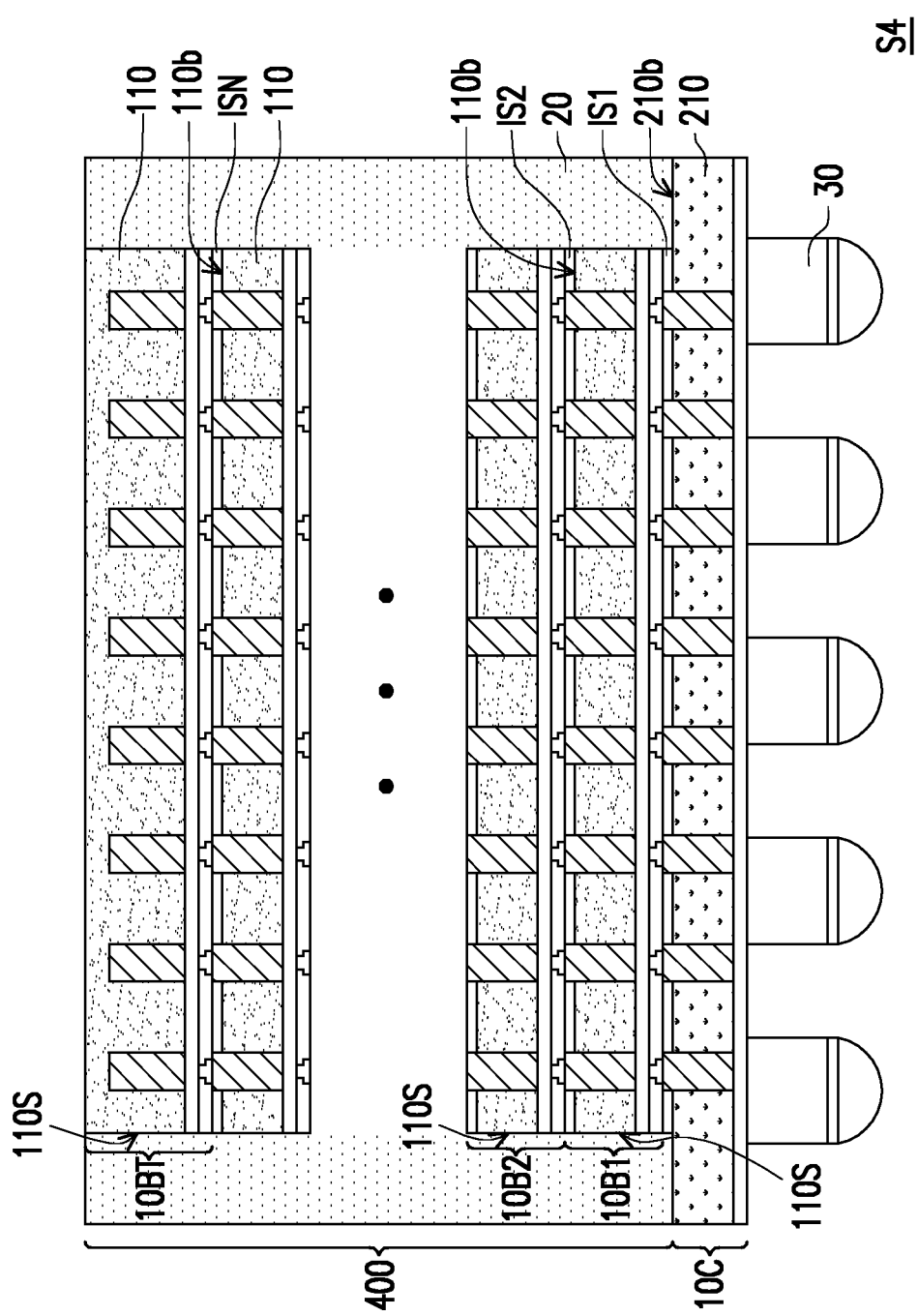

FIG. 9A to FIG. 9C are schematic cross-sectional views showing various stages in a manufacturing method of a semiconductor structure according to some embodiments of the present disclosure. Referring to FIG. 9A to FIG. 9C, a semiconductor structure S4 is provided. The formation of the semiconductor structure S4 may be similar to the formation of the semiconductor structure S3. Like elements are designated with the same reference numbers for ease of understanding and the details thereof are not repeated herein. In some embodiments, when forming the semiconductor structure S4, the removing process (e.g., etching or the like) of the isolation layer is performed during recessing the semiconductor substrate 110.

For example, after disposing the semiconductor die 10B1 at the first tier of the die stack 400 on the carrier die 10C, the semiconductor substrate 110 of the semiconductor die 10B1 at the first tier is recessed such that the conductive via (i.e. TSV) 130 is accessibly revealed and protruded from the back surface 110b of the semiconductor substrate 110 as shown in the enlarged area of FIG. 9A. The recessing process is similar to the process described in conjunction with FIG. 8A. During the recessing process, a portion of the first isolation layer IS1 formed on the carrier die 10C and unmasked by the semiconductor die 10B1 may be removed (e.g., dry etched). The portion of the first isolation layer IS1 interposed between the carrier die 10C and the front side of the semiconductor die 10B1 may remain intact during recessing. In some embodiments, the portion of the first isolation layer IS1 is not entirely removed, such that some residues of the first isolation layer IS1 may remain on a portion of the carrier die 10C which is not covered by the semiconductor die 10B1. Since the residues of the first isolation layer IS1 may remain, the portion of the first isolation layer IS1 unmasked by the semiconductor die 10B1 is depicted in FIG. 9A as dashed to indicate they may be or may not be present.

Continue to FIG. 9B, similarly, the second isolation layer IS2 is conformally formed on the semiconductor die 10B1 and the carrier die 10C. Next, the semiconductor die 10B2 is stacked on and bonded to the semiconductor die 10B1. The semiconductor substrate 110 of the semiconductor die 10B2 may be recessed to accessibly reveal the conductive via (i.e. TSV) 130 from the back surface 110b of the semiconductor substrate 110. When recessing the semiconductor substrate 110 of the semiconductor die 10B2, a portion of the second isolation layer IS2, which is not covered by the semiconductor die 10B2, may also be removed (e.g., dry etched). The portion of the second isolation layer IS1 interposed between the semiconductor dies 10B1 and 10B2 may remain intact. In some embodiments, the residues of the first isolation layer IS1 may be removed along with the removal of the second isolation layer IS2. In other embodiments, the residues of the second isolation layer IS2 and the first isolation layer IS1 are accumulated on the carrier die 10C and/or the sidewalls of the semiconductor die 10B1. The steps of bonding the semiconductor dies and forming/removing the isolation layers described above may be repeated several times to form the die stack. The following steps (e.g., encapsulating the die stack and carrier die, releasing the temporary carrier, singulation, etc.) may be similar to the processes described in conjunction with FIG. 7C to FIG. 7E, and the detailed descriptions are omitted for brevity.

As shown in FIG. 9C, the semiconductor structure S4 may include the isolation layer (e.g., IS1, IS2, IS3, ISN, etc.) interposed between the front side of the overlying semiconductor die and the backside of the underlying semiconductor die. The sidewalls 110b and 210b of the semiconductor substrates 110 and 210 may be free of the isolation material. In some embodiments, a slight amount of isolation material may remain on the sidewalls 110b and 210b of the semiconductor substrates 110 and 210 and/or on the back surface 210b of the semiconductor substrates 210. For example, the residue(s) of the isolation layers may be left on the sidewalls of the semiconductor substrates 110 at the lower tiers in the die stack 400 and/or on the sidewalls and the back surface 210b of the carrier die 10C. In such embodiments, after forming the insulating material, the sidewalls of the topmost semiconductor die 10BT in the die stack 300' are in physical contact with the insulating material 20', but the residue(s) of the isolation layers may be located between the insulating material 20' and the sidewalls of the semiconductor substrate(s) 110 at some tier(s) of the die stack 400 and/or located between the insulating material and the sidewalls and the back surface 210b of the carrier die 10C.

In other embodiments, to obtain the result structure as shown in FIG. 9C, the processes are performed as described in conjunction with FIG. 7A to FIG. 7C, and after forming the die stack and before forming the insulating material, the removing process is performed to remove the isolation layers (e.g., IS1, IS2, IS3, ISN, etc.) on the sidewalls of each tier of the die stack and on the carrier die. It should be noted that above examples are provided for illustrative purposes, the formation of the semiconductor structure S4 can be formed in any logical order which are not limited in the disclosure.

Figure 11:
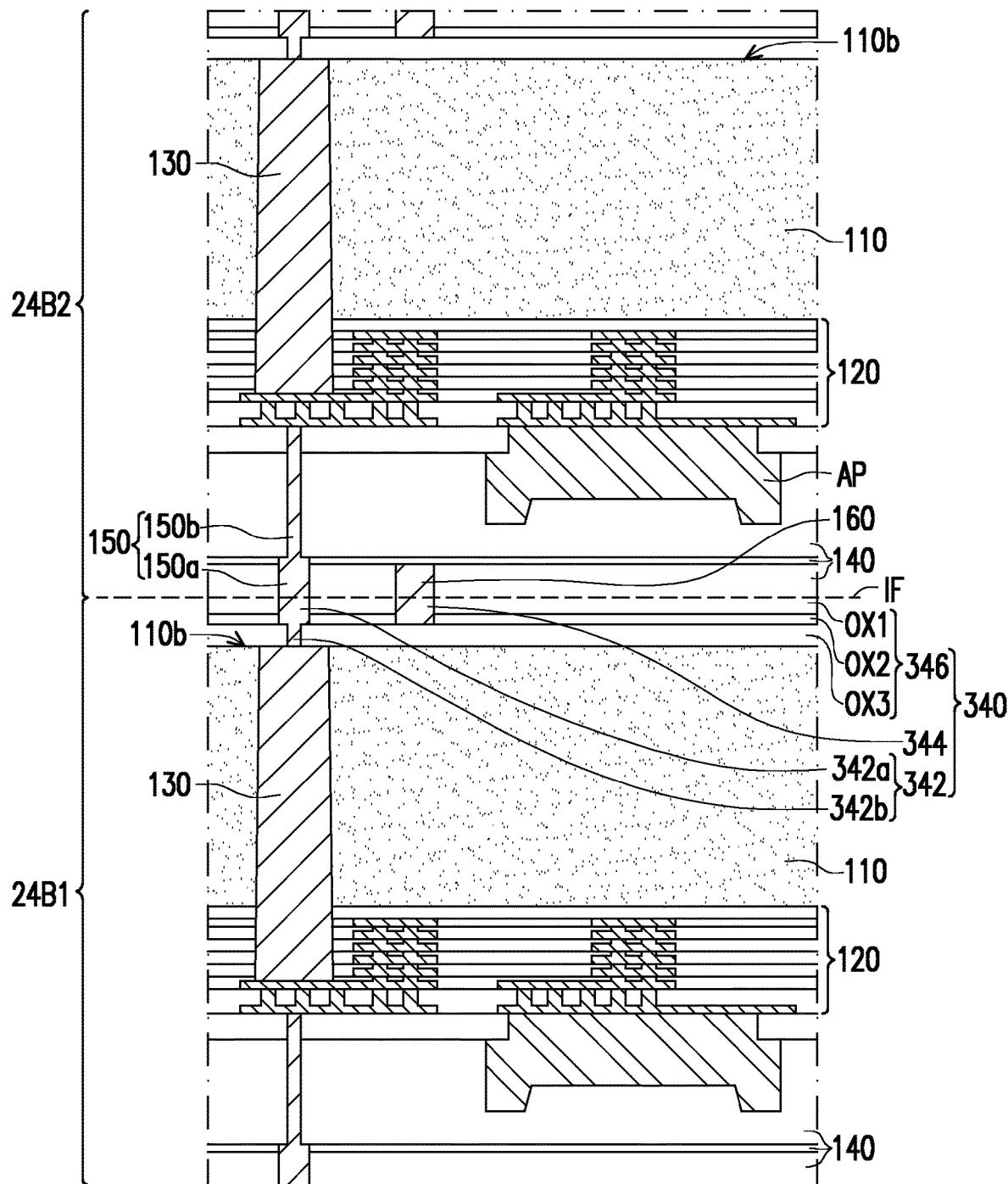
Figure 12:
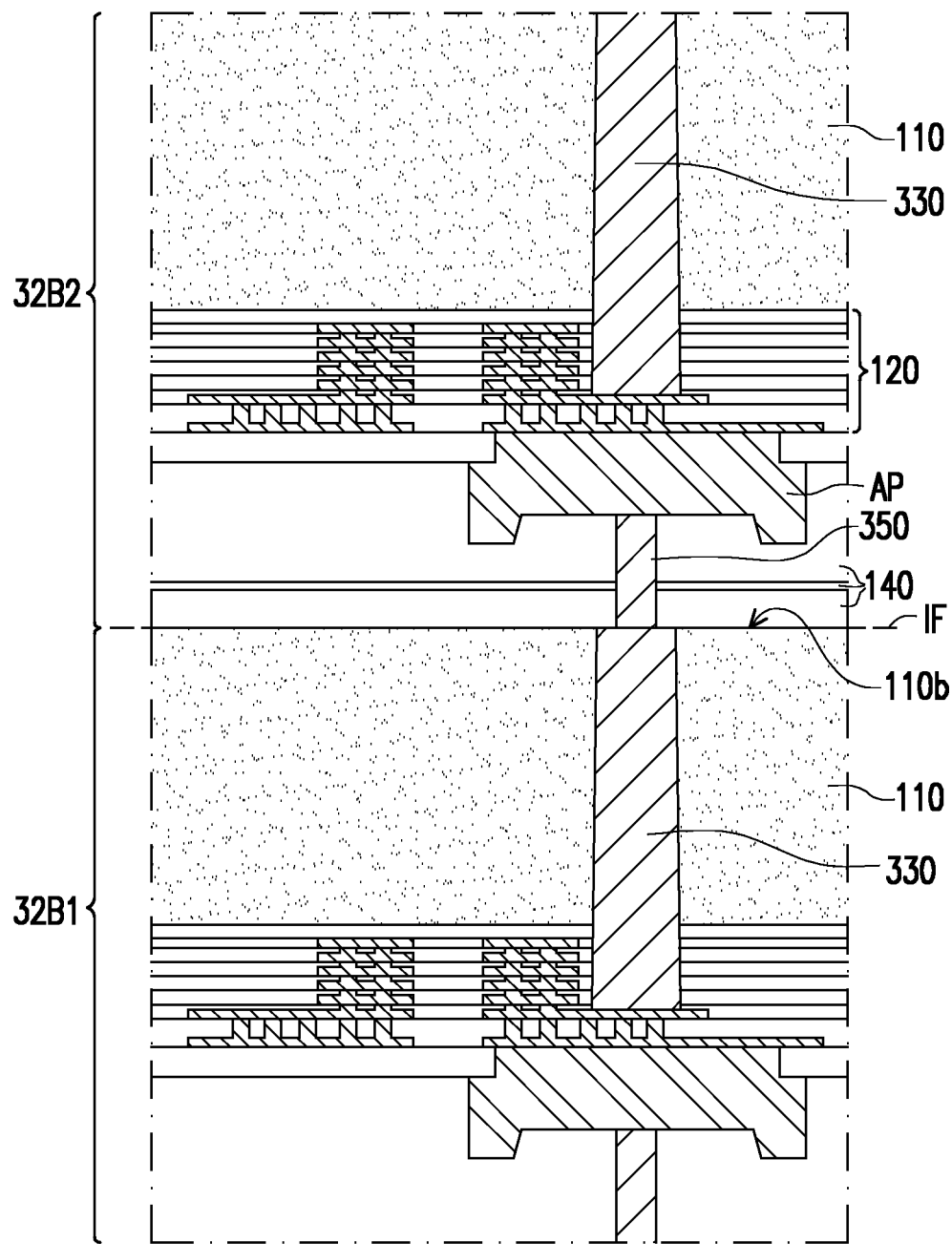
Figure 13A:
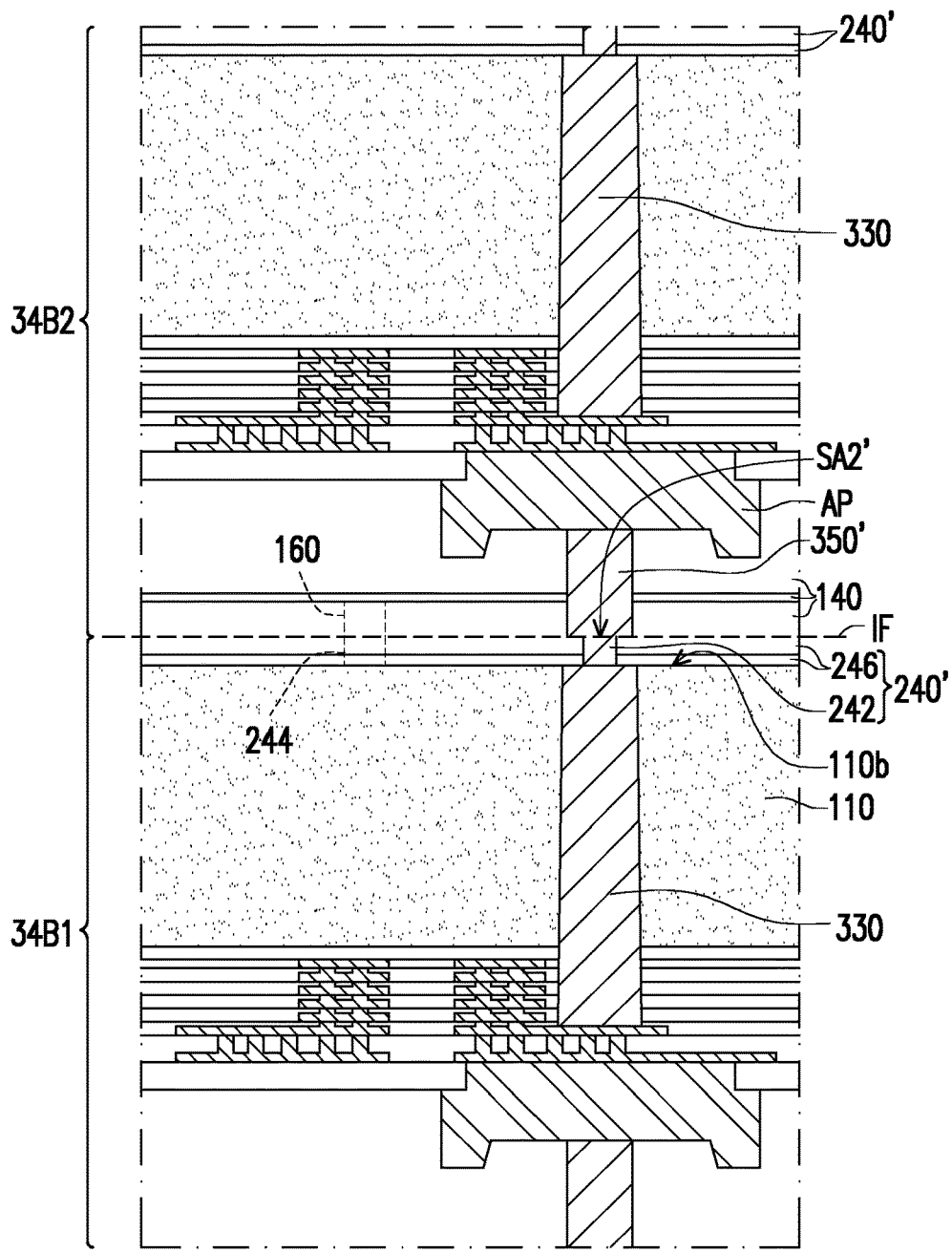
FIG. 13A is an enlarged and schematic cross-sectional view showing bonding interfaces between adjacent tiers of a die stack according to some embodiments of the present disclosure.
Figure 13B:
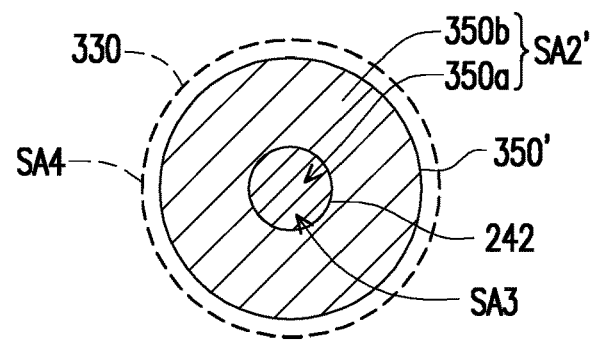
FIG. 13B is a schematic bottom view illustrating the relationship of bonding conductors at a bonding interface of semiconductor dies in FIG. 13A according to some embodiments of the present disclosure.
Figure 16:
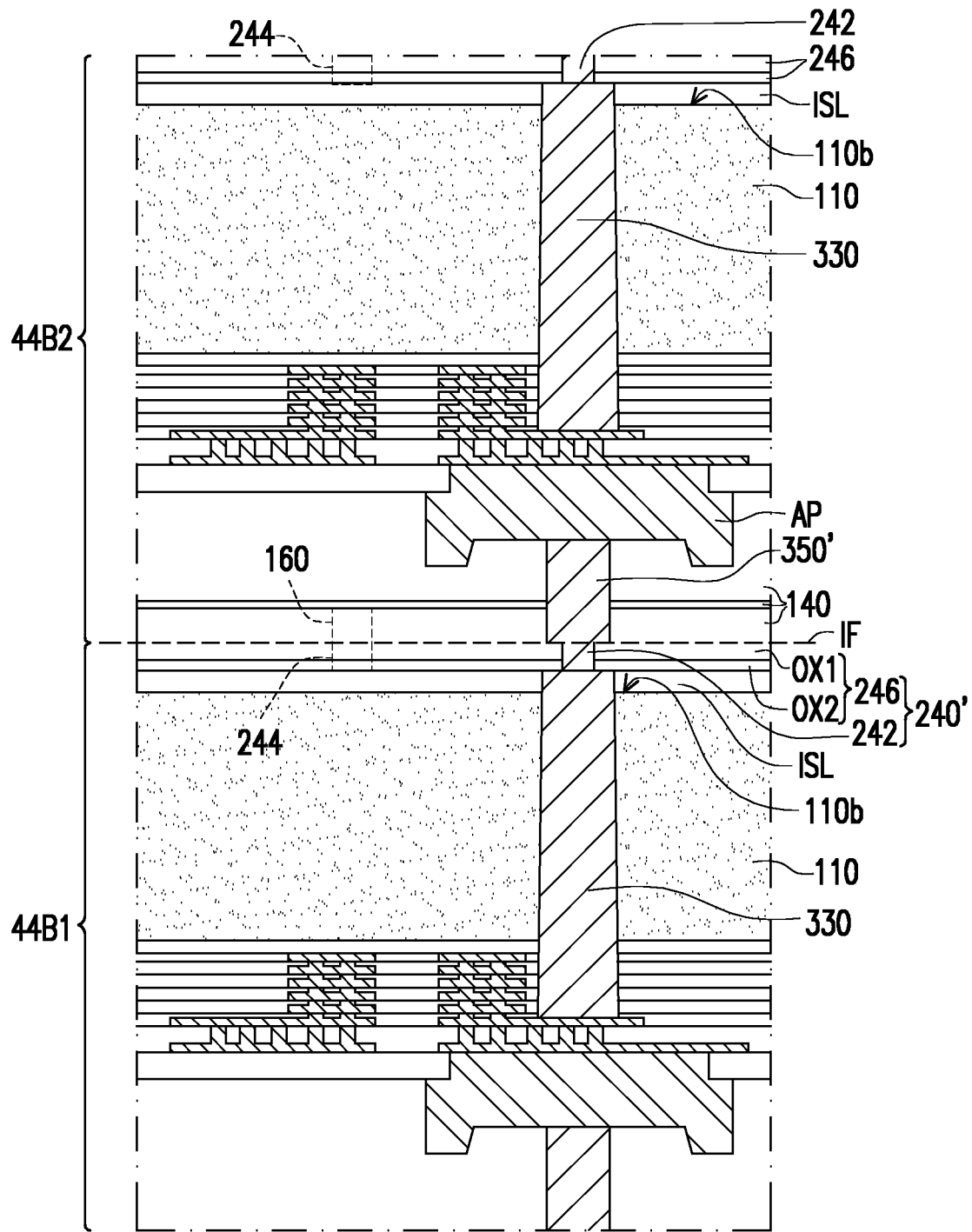
Figure 17:
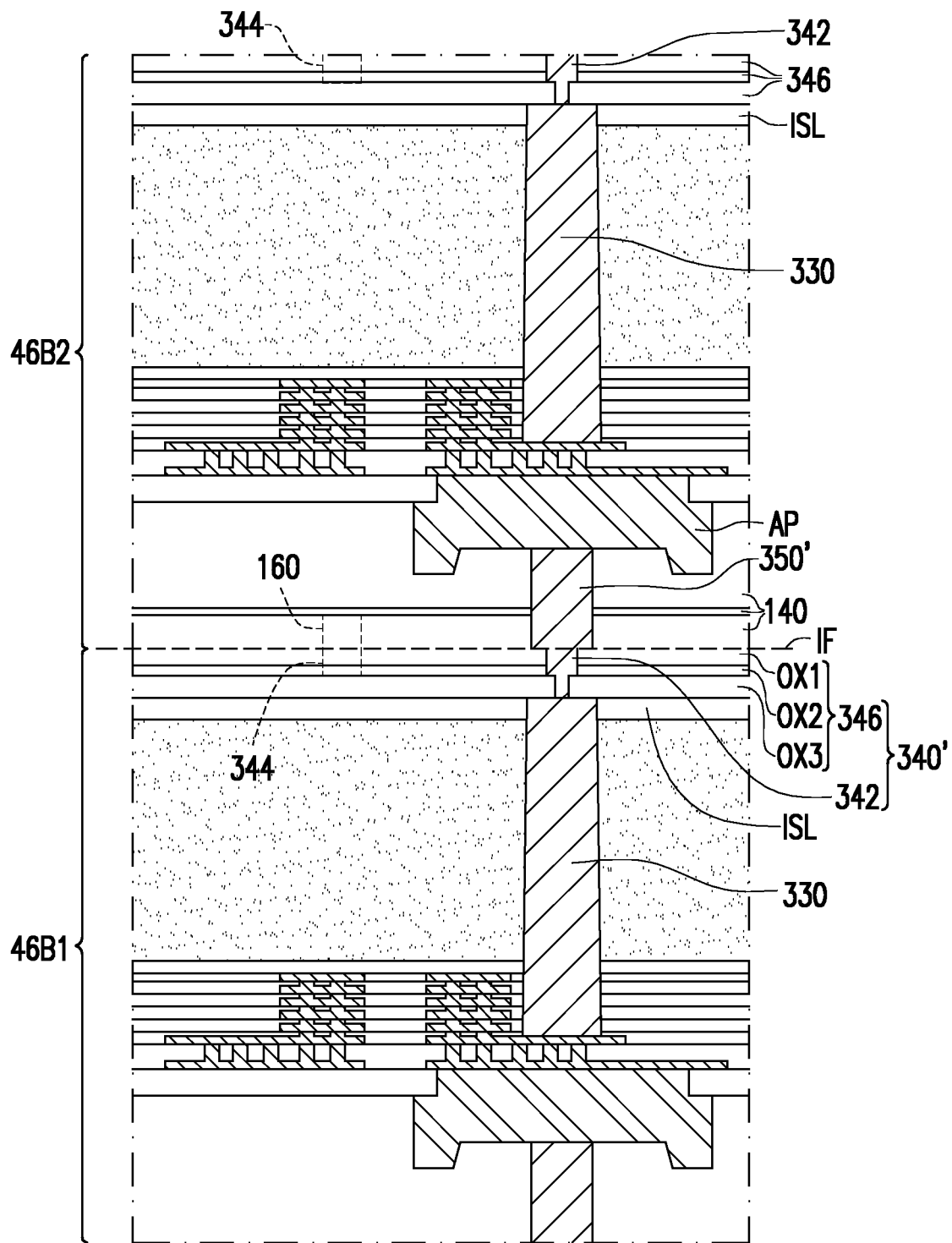
Figure 18A:
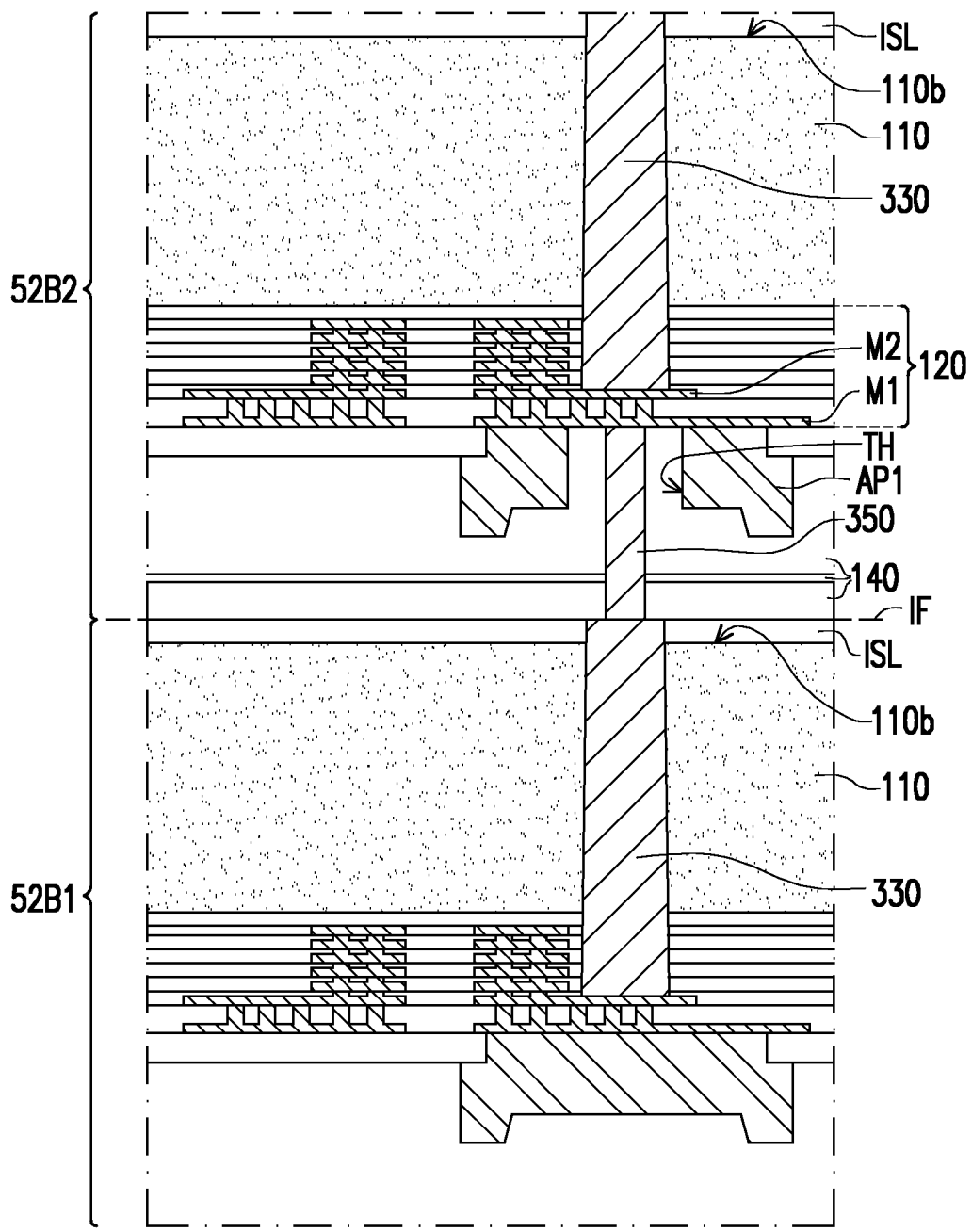
FIG. 18A is an enlarged and schematic cross-sectional view showing bonding interfaces between adjacent tiers of a die stack according to some embodiments of the present disclosure.
Figure 18B:
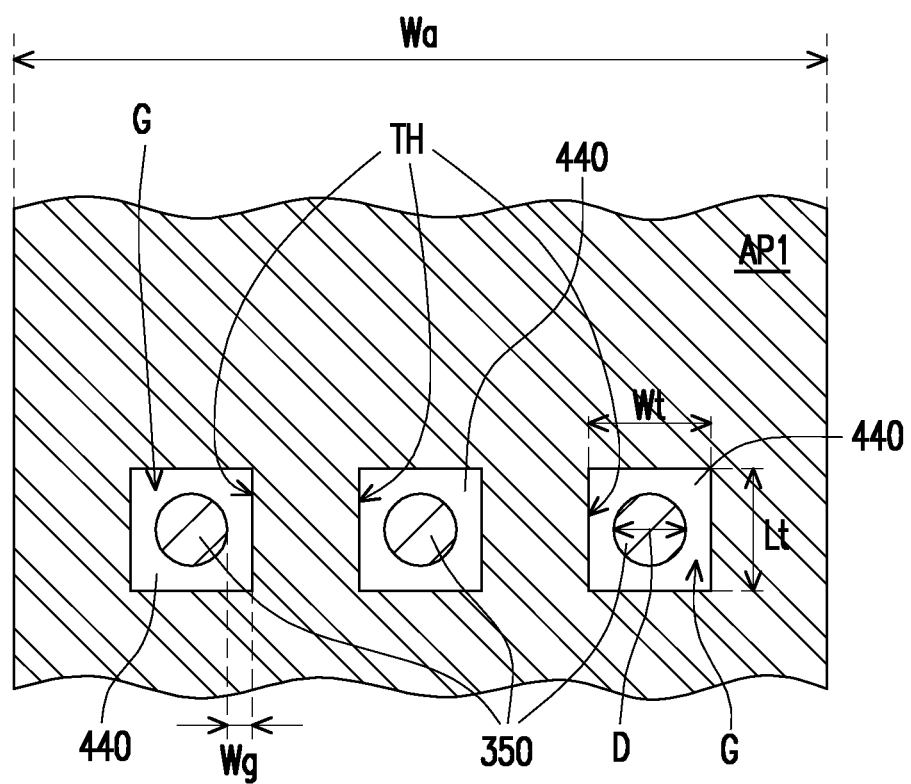
FIG. 18B is a schematic plan view showing the relationship of bonding conductors and through holes of a conductive pad according to some embodiments of the present disclosure.

FIG. 10 through FIG. 12, FIG. 13A, FIG. 14 through 17, and FIG. 18A are enlarged and schematic cross-sectional views showing bonding interfaces between adjacent tiers of a die stack according to some embodiments of the present disclosure, FIG. 13B is a schematic bottom view illustrating the relationship of bonding conductors at a bonding interface of semiconductor dies in FIG. 13A according to some embodiments of the present disclosure, and FIG. 18B is a schematic plan view showing the relationship of bonding conductors and through holes of a conductive pad according to some embodiments of the present disclosure. The variations of the embodiments are discussed below, and these configurations illustrated in FIG. 10 through FIG. 12, FIG. 13A, FIG. 14 through FIG. 17, and FIG. 18A may be the dashed area A outlined in FIG. 4C in accordance with some embodiments. Like elements are designated with the same reference numbers for ease of understanding and the details thereof are not repeated herein.

Figure 10:
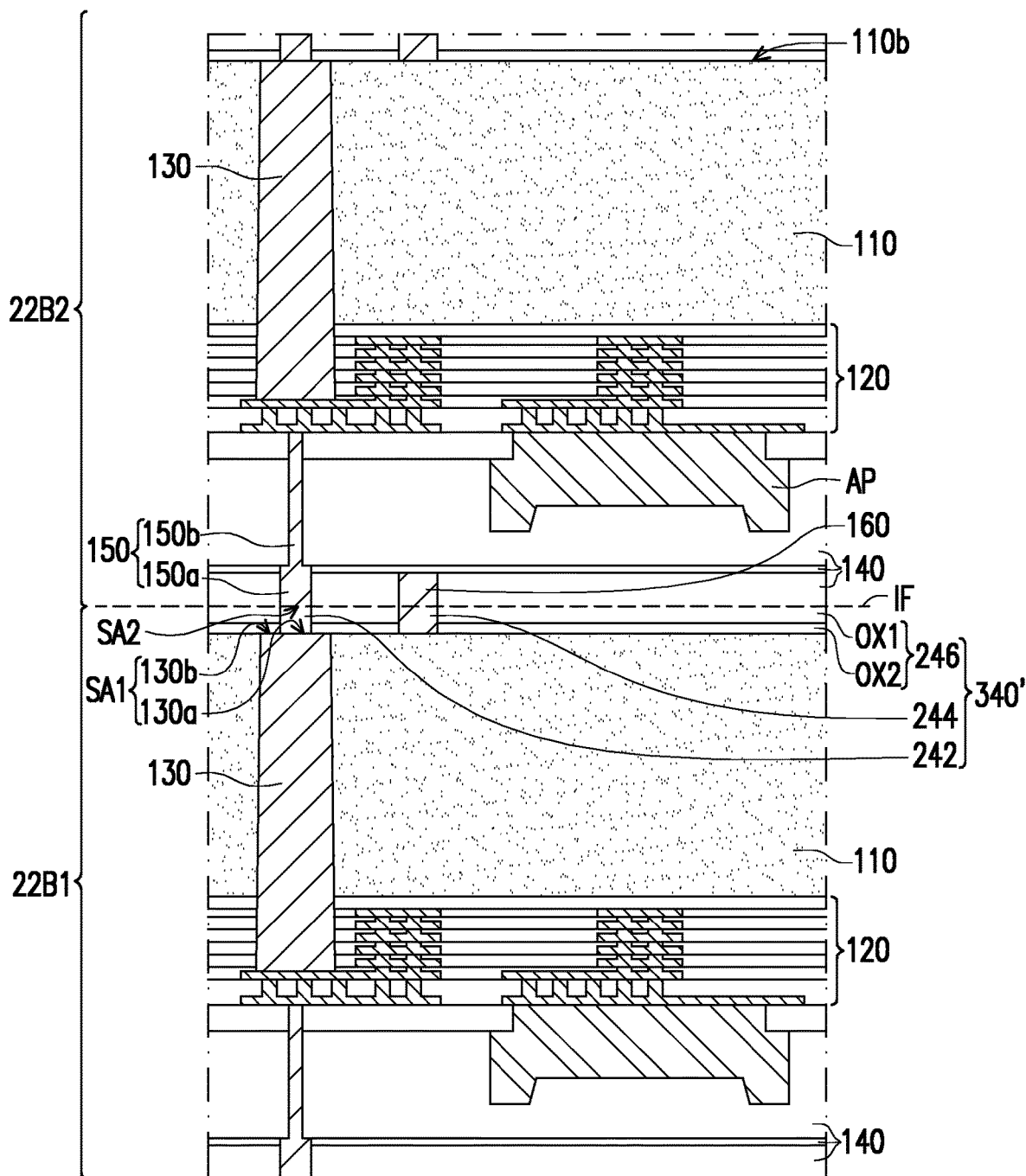
FIG. 10 through FIG. 12 are enlarged and schematic cross-sectional views showing bonding interfaces between adjacent tiers of a die stack according to some embodiments of the present disclosure.

Referring to FIG. 10, the semiconductor die 22B2 is bonded to the semiconductor die 22B1. The semiconductor dies 22B1 and 22B2 may be similar to the semiconductor dies 10B1 and 10B2 illustrated in FIG. 5A. The differences between the bonded structure of semiconductor dies 22B1 and 22B2 and the bonded structure of semiconductor dies 10B1 and 10B2 include that the underlying semiconductor die 22B1 includes a bonding structure 240 formed on the back surface 110b of the semiconductor substrate 110. The overlying semiconductor die 22B2 may be directly bonded to the bonding structure 240 of the underlying semiconductor die 22B1. For example, the bonding structure 240 includes a bonding conductor 242 disposed on the TSV 130, a dummy conductor 244 disposed aside the bonding conductor 242 without electrically coupled to any conductive features underneath, and a bonding dielectric layer 246 formed on the back surface 110b of the semiconductor substrate 110 and laterally covering the bonding conductor 242 and the dummy conductor 244.

The bonding conductor 242 may be in physical and electrical contact with the TSV 130, so that the electrical signal of the semiconductor die (e.g., 22B1 or 22B2) may be transmitted from the backside through the bonding conductor 242 and the TSV 130. For the bonded structure as shown in FIG. 10, the bonding conductor 242 of the underlying semiconductor die 22B1 is interposed between the TSV 130 of the underlying semiconductor die 22B1 and the bonding conductor 150 of the overlying semiconductor die 22B2. For example, the bonding conductor 150 of the overlying semiconductor die 22B2 extending from the interconnect structure 120 of the overlying semiconductor die 22B2 towards the TSV 130 of the underlying semiconductor die 22B1 is bonded to the bonding conductor 242 so as to electrically connect the overlying semiconductor die 22B2 to the underlying semiconductor die 22B1. The overlying semiconductor die 22B2 may optionally have the same or similar configuration as the underlying semiconductor die 22B1. In other embodiments, one of the semiconductor dies (e.g., 22B1 or 22B2) is replaced by the semiconductor die shown in the variations of the embodiments discussed elsewhere in the disclosure. Combination schemes of the bonded structure may be formed to include different types of semiconductor dies discussed herein, so that variations thereof may be carried out while still remaining within the scope of the claims and disclosure.

In some embodiments, after performing backside thinning, the bonding structure 240 is formed on the semiconductor substrate 110 and the TSV 130 by, for example, depositing dielectric material(s), patterning the dielectric material to form the bonding dielectric layer 246 with opening(s), forming conductive material(s) in the opening(s) of the bonding dielectric layer 246 to form the bonding conductor 242 and the dummy conductor 244. The bonding structure 240 may be formed on the semiconductor substrate 110 while the temporary carrier TC serves as the support before singulation as shown in FIG. 2C or before bonding the second tier of the die stack as shown in FIG. 4B.

In some embodiments, the bonding dielectric layer 246 is a multi-layered structure having more than one layer of dielectric material (e.g., OX1, OX2). Alternatively, the bonding dielectric layer 246 is a single dielectric material layer. It should be appreciated that the bonding dielectric layer 246 is merely an example, and the number of layers of dielectric material in the bonding dielectric layer 246 construes no limitation in the disclosure. In some embodiments, the underlying layer OX2 is in physical contact with the semiconductor substrate 110 and the overlying layer OX1 is in physical contact with the overlying semiconductor die 22B2. The material of the overlying layer OX1 may be different from the underlying layer OX2. In some embodiments, the underlying layer OX2 includes material properties having a lower defect rate and/or better adhesion with the material of the semiconductor substrate 110. The dielectric materials of the bonding dielectric layer 246 may be or may include any suitable electrically insulating material for the subsequent bonding process, such as silicon oxide, silicon oxynitride, silicon nitride, high-density plasma (HDP) oxide, tetra-ethyl-ortho-silicate (TEOS), undoped silicate glass (USG), combinations thereof, or the like. The bonding dielectric layer 246 may be referred to as a bonding oxide, in some embodiments.

In some embodiments, the bonding conductor 242 is formed by a single damascene process or other suitable process. For example, after forming the dielectric material(s) on the back surface 110b of the semiconductor substrate 110, lithography and etching processes may be performed to form the bonding dielectric layer 246 with the openings, where at least a portion of the TSV 130 is accessibly exposed by one of the openings of the bonding dielectric layer 246. Subsequently, conductive material(s) is formed inside the opening of the bonding dielectric layer 246 to form the bonding conductor 242, so that the bonding conductor 242 is in contact with the TSV 130. The bonding conductor 242 and the dummy conductor 244 may be formed during the same process. In some embodiments, the depths (or heights) of the bonding conductor 242 and the dummy conductor 244 are substantially the same. Alternatively, the depth of the dummy conductor 244 is less than that of the bonding conductor 242. In some embodiments, the bottom surface of the dummy conductor 244 is in physical contact with the underlying back surface 110b of the semiconductor substrate 110. In other embodiments, the dummy conductor 244 is spatially separated from the back surface 110b of the semiconductor substrate 110 by the underlying layer OX2 of the bonding dielectric layer 246.

The bonding conductor 242 of the bonding structure 240 may have a dimension (e.g., length, width, diameter, depth, height, etc.) less than the underlying TSV 130. For example, the first portion 130a of the surface area SA1 of the TSV 130 is in direct contact with the bonding conductor 242, and the second portion 130b of the surface area SA1 of the TSV 130 is in direct contact with the bonding dielectric layer 246. The perimeter of the bonding conductor 242 may be less than the perimeter of the underlying TSV 130, and may be located within the perimeter of the underlying TSV 130. It should be noted that the perimeters of the bonding conductor 242 and the TSV 130 construe no limitation in the disclosure as long as the bonding conductor 242 is reliably contact with the TSV 130.

For example, the width (or diameter) of the bonding conductor 242 substantially matches that of the bonding conductor 150. In some embodiments, the critical dimensions of the bonding conductors 150 and 242 range from about 0.5 μm to about 5 μm. In some embodiments, the bonding conductor 242 of the underlying semiconductor die 22B1 and the bonding conductor 150 of the overlying semiconductor die 22B2 are substantially aligned. In some embodiments, the surface area SA2 of the bonding conductor 150 is substantially equal to the surface area of the bonding conductor 242 at the bonding interface IF, and the contact area of the bonding conductors 150 and 242 at the bonding interface IF is the surface area SA2 of the bonding conductor 150. In other embodiments, the bonding conductors 150 of the overlying semiconductor die 22B2 and the bonding conductor 242 of the underlying semiconductor die 22B1 at the bonding interface IF may be slightly offset in one direction (e.g., to the right or left) due to formation and/or alignment process variations. In such embodiments, the contact area of the bonding conductors 150 and 242 at the bonding interface IF is slightly less than the surface area SA2 of the bonding conductor 150. In some embodiments, the height of the bonding conductor 242 of the bonding structure 240 is less than the bonding conductor 150 of the overlying semiconductor die 22B2. Alternatively, the dimension of the bonding conductor 242 is greater than that of the bonding conductor 150 of the overlying semiconductor die 22B2.

In some embodiments, the overlying semiconductor die 22B2 includes a dummy conductor 160 formed aside the bonding conductor 150 and corresponding to the location of the dummy conductor 244 of the underlying semiconductor die 22B1, so that after bonding the overlying semiconductor die 22B2 to the underlying semiconductor die 22B1, the dummy conductors 160 and 244 are bonded together. In some embodiments, a depth (or a height) of the dummy conductor 160 of the overlying semiconductor die 22B2 is less than that of the bonding conductor 150 disposed aside the dummy conductor 160. The dummy conductor 160 may have an end embedded in the dielectric layer 140, and an opposing end connected to the dummy conductor 244. For example, the depth of the dummy conductor 160 is substantially equal to the depth of the pad portion 150a of the bonding conductor 150.

The dummy conductors 160 and/or 244 may not have electrical functions, and may be electrically floating. In some embodiments, during the use of the die stack, electrical signals may be connected to the semiconductor devices in the semiconductor substrate 110 through the interconnect structure 120, the TSV 130, and the bonding conductors 150 and 242. However, no electrical signal or voltage may be connected to the dummy conductors 160 and 244. In some embodiments, with the formation of the dummy conductors 160 and 244, the pattern densities in the bonding structure of the semiconductor dies become more uniform, and hence the pattern-loading effect in the formations of the bonding conductors 150 and 242 may be reduced. Alternatively, the dummy conductors 160 and/or 244 may be omitted.

For example, the bonding method of the semiconductor die 22B1 and 22B2 includes fusion bonding (e.g., oxide-to-oxide bonding, oxide-to-silicon bonding), eutectic bonding (e.g., eutectic materials bonds), direct metal bonding (e.g., copper-to-copper bonding), hybrid bonding (e.g., involving both of direct metal bonding and fusion bonding), any combinations thereof, and/or the like.

In an embodiment in which the semiconductor dies 22B1 and 22B2 are attached by hybrid bonding, before performing the bonding, a surface treatment is performed on the semiconductor dies 22B1 and 22B2. The surface treatment may be a plasma treatment process. Through the treatment, the number of OH groups at the surfaces of the dielectric layer 140 and the bonding dielectric layer 246 may increase. Next, a pre-bonding process is performed, where the semiconductor dies 22B1 and 22B2 are aligned, and then the semiconductor dies 22B1 and 22B2 are pressed against together to form weak bonds therebetween. After the pre-bonding process, the semiconductor dies 22B1 and 22B2 are annealed to strengthen the weak bonds and form a fusion bond at the bonding interface IF. During the annealing, the H of the OH bonds may be outgassed, thereby forming Si—O—Si bonds between the semiconductor dies 22B1 and 22B2, thereby strengthening the bonds. During the hybrid bonding, direct metal-to-metal bonding (e.g., copper-to-copper bonding) also occurs between the bonding conductor 150 of the overlying semiconductor die 22B2 and the bonding conductor 246 of the underlying semiconductor die 22B1. Accordingly, the resulting bond is a hybrid bond that includes the Si—O—Si bond and metal-to-metal direct bond.

Referring to FIG. 11, the semiconductor die 24B2 is bonded to the semiconductor die 24B1. The semiconductor dies 24B1 and 24B2 may be similar to the semiconductor dies 22B1 and 22B2 discussed above. The difference therebetween may lie in the bonding structure 340. For example, the bonding structure 340 is formed on the back surface 110b of the semiconductor substrate 110 and hybrid bonded to the overlying semiconductor die 24B2. The bonding structure 340 may include the bonding conductor 342 physically and electrically connected to the TSV 130, the dummy conductor 344 formed aside the bonding conductor 342, and the bonding dielectric layer 346 formed on the semiconductor substrate 110 and surrounding the bonding conductor 342 and the dummy conductor 344.

The bonding dielectric layer 346 may be a multi-layered structure including layers of dielectric materials (e.g., OX1, OX2, OX3). In some embodiments, the materials of the underlying layers (e.g., OX2, OX3) proximal to the back surface 110b of the semiconductor substrate 110 may be different from the overlying layer (e.g., OX1) bonded to the dielectric layer 140. For example, the materials of the underlying layers (e.g., OX2, OX3) include high-density plasma (HDP) oxide, tetra-ethyl-ortho-silicate (TEOS), undoped silicate glass (USG), the like, or a combination thereof. The materials of the overlying layer (e.g., OX1) may include silicon oxide, silicon oxynitride, silicon nitride, the like, or a combination thereof. In some embodiments, the materials of the underlying layers OX2 and OX3 are different from each other. By forming the bonding dielectric layer 340 with different dielectric materials, the bonding strength between the underlying semiconductor substrate 110 and the overlying dielectric layer 140 of the semiconductor die 24B2 may be improved. It should be noted that a three-layered structure of the bonding dielectric layer 346 illustrated in FIG. 11 is merely an example and is not intended to be limiting.

The bonding conductor 342 may be formed by a dual damascene process. The dual damascene process may be the via-first-trench-last approach or the trench-first-via-last approach. For example, the bonding conductor 342 includes a pad portion 342a and a via portion 342b extending from the pad portion 342a to be in physical contact with the TSV 130. The pad portion 342a of the bonding conductor 342 of the underlying semiconductor die 24B1 may be substantially aligned with and bonded to the pad portion 150a of the bonding conductor 150 of the overlying semiconductor die 24B2. The dimension of the pad portion 342a of the bonding conductor 342 may be similar to that of the pad portion 150a of the bonding conductor 150. In some embodiments, the critical dimensions of the bonding conductor 342 of the underlying semiconductor die 24B1 and the bonding conductor 150 of the overlying semiconductor die 24B2 are substantially equal. The dummy conductor 344 formed aside the bonding conductor 342 may have a depth (or height) similar to the pad portion 342a of the bonding conductor 342.

In some embodiments, the top surface of the dummy conductor 344 is directly bonded to the dummy conductor 160 of the overlying semiconductor die 24B2, the sidewalls of the dummy conductor 344 connected to the top surface may be covered by the overlying layer(s) (e.g., OX1 and/or OX2) of the bonding dielectric layer 346, and the bottom surface of the dummy conductor 160 opposite to the top surface may be covered by the underlying layer (e.g., OX3) of the bonding dielectric layer 346. For example, the underlying layer (e.g., OX3) of the bonding dielectric layer 346 covering the bottom surface of the dummy conductor 160 may serve as an etch stop layer. Alternatively, the dummy conductor 344 of the underlying semiconductor die 24B1 and/or the dummy conductor 160 of the overlying semiconductor die 24B2 may be omitted. In other embodiments, one of the semiconductor dies (e.g., 24B1 or 24B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Referring to FIG. 12, the semiconductor die 32B2 is bonded to the semiconductor die 32B1. The semiconductor dies 32B1 and 32B2 may be similar to the semiconductor dies 10B1 and 10B2 discussed in conjunction with FIG. 5A. The difference therebetween may include the location of bonding conductor 350. For example, the bonding conductor 350 is formed on the conductive pad AP. In an embodiment, the dielectric material(s) may be formed on the interconnect structure 120 to cover the conductive pad AP, and then a portion of the dielectric materials is removed to form the dielectric layer 140 with an opening exposing at least a portion of the conductive pad AP. Subsequently, conductive material(s) may be formed in the opening of the dielectric layer 140 to be in physical and electrical contact with the conductive pad AP so as to form the bonding conductor 350. The bonding conductor 350 of the semiconductor dies 32B1 may be electrically coupled to the interconnect structure 120 of the semiconductor dies 32B1 through the conductive pad AP of the semiconductor dies 32B1.

As shown in FIG. 12, forming the bonding conductor 350 directly on the conductive pad AP may increase the available layout area at the front sides of the semiconductor dies, thereby providing improved feasibility of routing. For example, the bonding conductor 350 is formed by a damascene process. It should be appreciated that a single damascene technique illustrated in FIG. 12 is merely an example, and a dual damascene process or other suitable patterning process may be used and is not intended to be limiting. It is also noted that a multi-layered structure of the dielectric layer 140 is merely an example, the etch stop material layer in the dielectric layer may be omitted, or the dielectric layer may be a single layer depending on the design requirements.

The bonding conductor 350 of the overlying semiconductor die 32B2 landing on the conductive pad AP of the overlying semiconductor die 32B2 may be bonded to the TSV 330 of the underlying semiconductor die 32B1. The bonding conductor 350 of the overlying semiconductor die 32B2 is finer than the TSV 330 of the underlying semiconductor die 32B1. For example, the bonding conductor 350 has a width (or diameter) less than the TSV 330 at the bonding interface IF of the semiconductor dies 32B1 and 32B2, so that a portion of the TSV 330 is bonded to the bonding conductor 350 and the rest portion of the TSV 330 is bonded to the dielectric layer 140. The rest portion of the dielectric layer 140, which is not in contact with the TSV 330, may be in direct contact with the back surface 110b of the semiconductor substrate 110 of the underlying semiconductor die 32B1. A depth (or height) of the bonding conductor 350 of the overlying semiconductor die 32B2 may be less than that of the TSV 330 of the underlying semiconductor die 32B1. In some embodiments, an aspect ratio (depth/width) of the TSV 330 is greater than or substantially equal to that of the bonding conductor 350. Alternatively, the TSV having the aspect ratio greater than the bonding conductor.

For example, the center of the bonding conductor 350 of the overlying semiconductor die 32B2 is substantially aligned with the center of the TSV 330 of the underlying semiconductor die 32B1, or may be slightly shifted in one direction (e.g., to the right or left) relative to the TSV 330 of the underlying semiconductor die 32B1 due to formation and/or alignment process variations. The TSV 330 may be disposed corresponding to the conductive pad AP and/or the bonding conductor 350 landing on the conductive pad AP in the same semiconductor die (e.g., 32B1, 32B2), such that the semiconductor dies having the same or similar configuration(s) may be easily stacked upon one another, thereby improving manufacturability. In other embodiments, one of the semiconductor dies (e.g., 32B1 or 32B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Referring to FIG. 13A and FIG. 13B, the semiconductor die 34B2 is bonded to the semiconductor die 34B1. The overlying semiconductor die 34B2 includes the bonding conductor 350' disposed on the conductive pad AP, and the dielectric layer 140 laterally covering the bonding conductor 350'. The underlying semiconductor die 34B1 includes the bonding structure 240' formed on the back surface 110b of the semiconductor substrate 110. The bonding conductor 242 may be formed by a single damascene process. In other embodiments, a dual damascene process or other suitable techniques may be used to form the bonding conductor 242. For example, the bonding dielectric layer 246 and the bonding conductor 242 of the bonding structure 240' of the underlying semiconductor die 34B1 are respectively bonded to the dielectric layer 140 and the bonding conductor 350' of the overlying semiconductor die 34B2. The formation of the bonding conductor 350' may be similar to that of the bonding conductor 350 described above in FIG. 12.

In some embodiments, the bonding conductor 350' of the overlying semiconductor die 34B2 has a width (or diameter) greater than the bonding conductor 242 of the underlying semiconductor die 34B1 at the bonding interface IF. For example, the surface area SA2' of the bonding conductor 350' of the overlying semiconductor die 34B2 includes a first portion 350a directly bonded to the bonding conductor 242 of the underlying semiconductor die 34B1, and a second portion 350b surrounding the first portion 350a and being in physical contact with the bonding dielectric layer 246. The contact area of the bonding conductor 242 of the underlying semiconductor die 34B1 and the bonding conductor 350' of the overlying semiconductor die 34B2 may be substantially equal to the first portion 350a of the bonding conductor 350' or the surface area SA3 of the bonding conductor 242.

In some embodiments, the surface area SA4 of the TSV 330 revealed by the back surface 110b of the semiconductor substrate 110 is greater than the surface area SA3 of the bonding conductor 242. The surface area SA4 of the TSV 330 of the underlying semiconductor die 34B1 may be greater than or substantially equal to the surface area SA2' of the bonding conductor 350' of the overlying semiconductor die 34B2. Alternatively, the surface area SA4 of the TSV 330 of the underlying semiconductor die 34B1 may be less the surface area SA2' of the bonding conductor 350' of the overlying semiconductor die 34B2, so that the TSV 330 is depicted in FIG. 13B as dashed to indicate the surface area variations thereof. The width of the bonding conductor 350' may be substantially equal to or greater than the width of the TSV 330 revealed from the back surface 110b of the semiconductor substrate 110. Alternatively, the bonding conductor of the overlying semiconductor die 34B2 may have a width substantially equal to the bonding conductor 242 at the bonding interface IF and less than the TSV 330.

The dielectric layer 140 of the overlying semiconductor die 34B2 and/or the bonding dielectric layer 246 of the underlying semiconductor die 34B1 may further include dummy conductor(s) 160 and 244 embedded therein and bonded to each other. The configuration of the dummy conductors 160 and 244 may be similar to that of the dummy conductors 160 and 244 described in conjunction with FIG. 10. Since the dummy conductors 160 and 244 are optionally formed, the dummy conductors 160 and 244 are depicted in FIG. 13A as dashed to indicate they may be or may not be present. In other embodiments, one of the semiconductor dies (e.g., 34B1 or 34B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Figure 14:
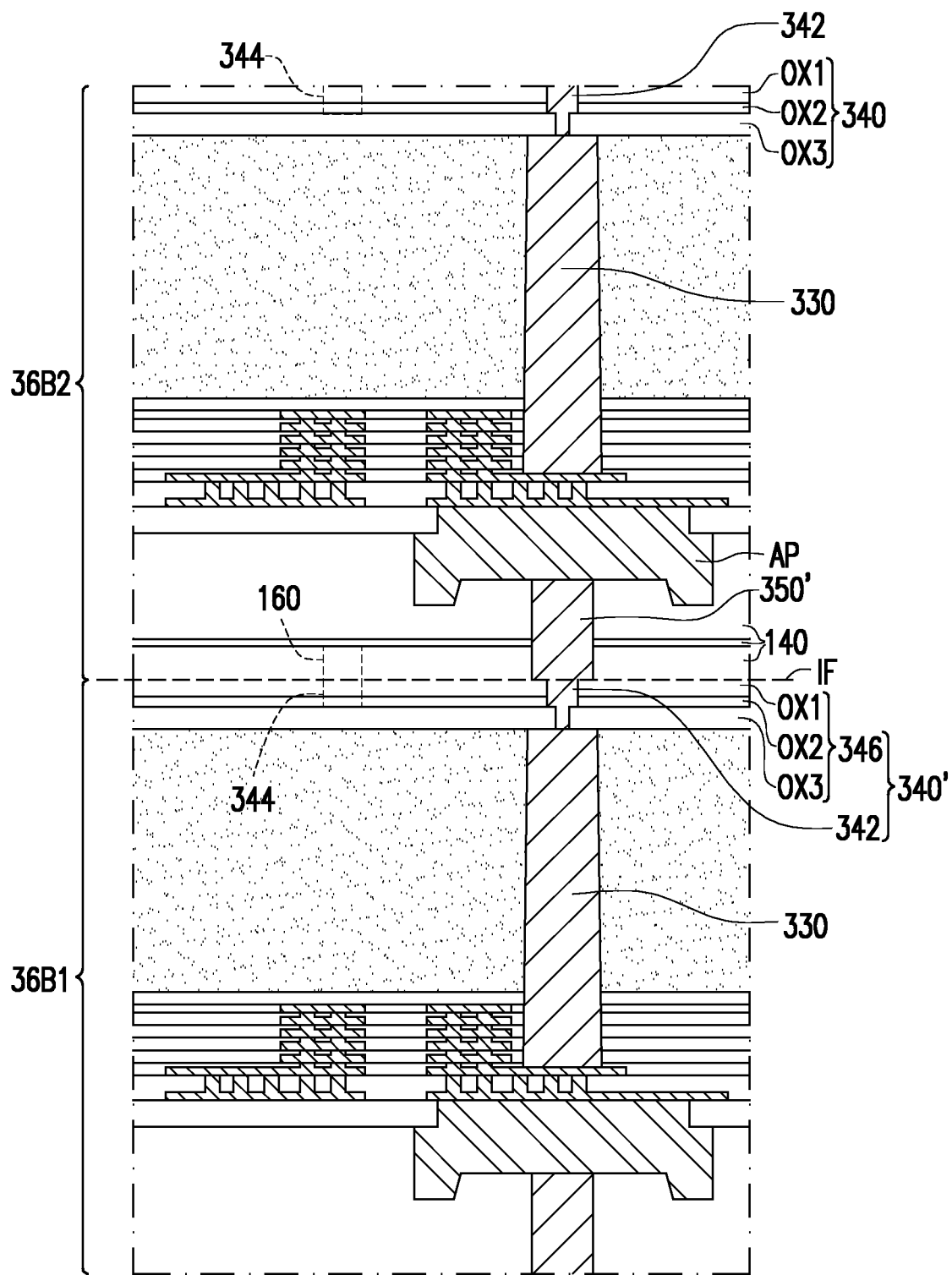
FIG. 14 through FIG. 17 are enlarged and schematic cross-sectional views showing bonding interfaces between adjacent tiers of a die stack according to some embodiments of the present disclosure.

Referring to FIG. 14, the semiconductor die 36B2 is bonded to the semiconductor die 36B1. The semiconductor dies 36B1 and 36B2 may be similar to the semiconductor dies 34B1 and 34B2 discussed above, except the bonding structure 340' of the underlying semiconductor die 36B1. The bonding structure 340' may be similar to the bonding structure 340 described in FIG. 11. For example, the bonding conductor 342 is formed by a dual damascene process. In other embodiments, a single damascene process or other suitable techniques may be used to form the bonding conductor 342. The bonding conductor 342 of the underlying semiconductor die 36B1 is in physical and electrical contact with the TSV 330 of the underlying semiconductor die 36B1, and the bonding conductor 350' of the overlying semiconductor die 36B2 is in physical and electrical contact with the conductive pad AP.

The bonding conductor 342 of the underlying semiconductor die 36B1 and the bonding conductor 350' of the overlying semiconductor die 36B2 are directly bonded together. The bonding conductor 342 of the underlying semiconductor die 36B1 may have a narrower contact area than the bonding conductor 350' of the overlying semiconductor die 36B2 at the bonding interface IF. Alternatively, the width of the bonding conductor 350' of the overlying semiconductor die 36B2 may be substantially equal to that of the bonding conductor 342 of the underlying semiconductor die 36B1, and the bonding conductor 342 of the underlying semiconductor die 36B1 and the bonding conductor 350' of the overlying semiconductor die 36B2 are substantially aligned and bonded together.

The dielectric layer 140 of the overlying semiconductor die 36B2 and/or the bonding dielectric layer 346 of the underlying semiconductor die 36B1 may further include dummy conductor(s) 160 and 344 embedded therein and bonded to each other. The configuration of the dummy conductors 160 and 244 may be similar to that of the dummy conductors 160 and 344 described in conjunction with FIG. 11. Since the dummy conductors 160 and 344 are optionally formed, the dummy conductors 160 and 344 are depicted in FIG. 14 as dashed to indicate they may be or may not be present. In other embodiments, one of the semiconductor dies (e.g., 36B1 or 36B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Figure 15:
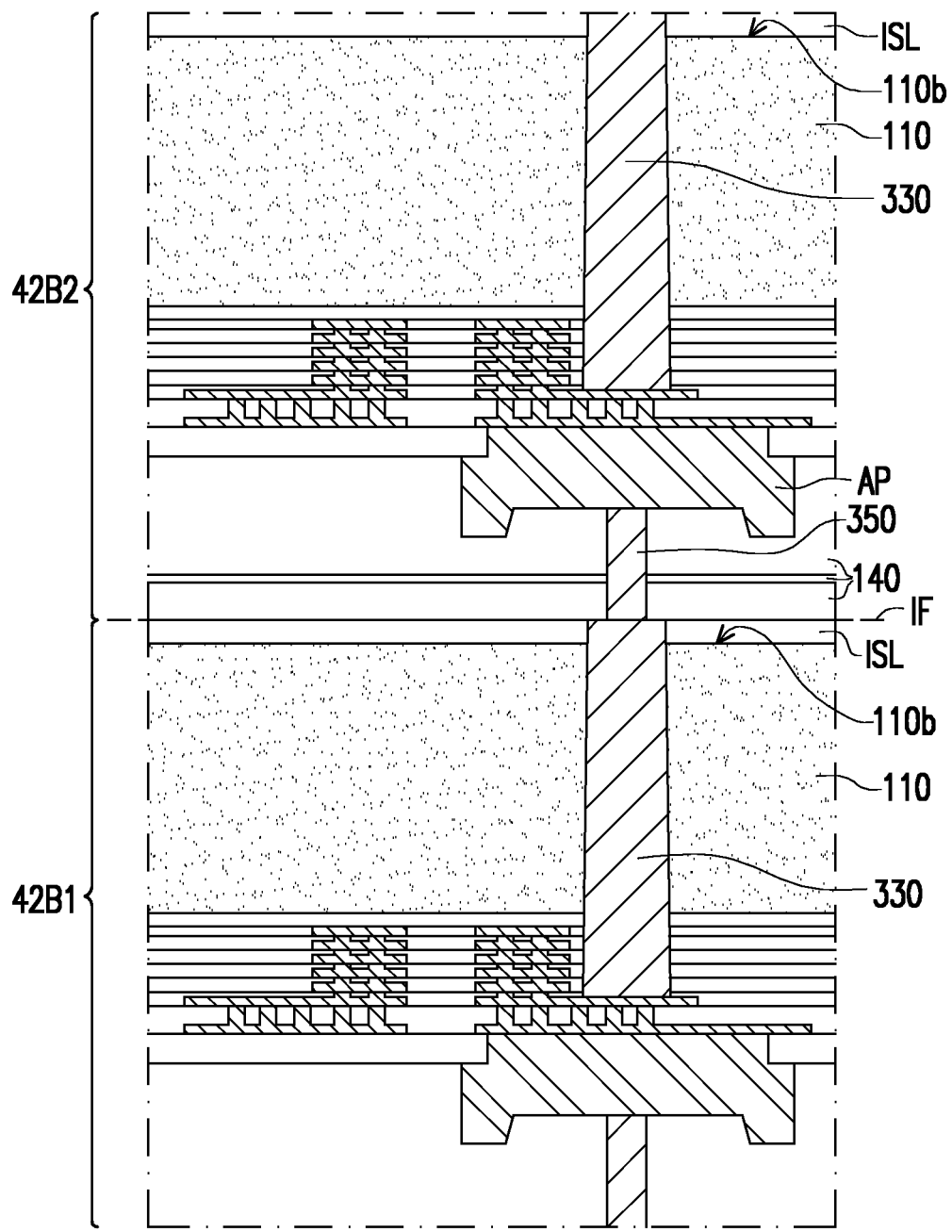

Referring to FIG. 15, the semiconductor die 42B2 is bonded to the semiconductor die 42B1. The semiconductor dies 42B1 and 42B2 may be similar to the semiconductor dies 32B1 and 32B2 discussed in conjunction with FIG. 12. The difference therebetween may include that the semiconductor die(s) 42B1 and/or 42B2 including an isolation layer ISL formed on the back surface 110b of the semiconductor substrate 110. The TSV 330 may be laterally covered by the isolation layer ISL, and the top of the TSV 330 is accessibly revealed by the isolation layer ISL for bonding. The formation of the isolation layer ISL may be similar to the manufacturing method described in conjunction with FIG. 8A to FIG. 8C, and the detailed descriptions are omitted for brevity. In some embodiments, a thickness of the isolation layer ISL laterally covering the TSV 330 is in a range of about 0.5 μm to about 1 μm.

For example, the TSV 330 of the underlying semiconductor die 42B1 is bonded to the bonding conductor 350 of the overlying semiconductor die 42B2, and the isolation layer ISL of the underlying semiconductor die 42B1 is bonded to the dielectric layer 140 of the overlying semiconductor die 42B2. In some embodiments, the bonding conductor 350 is finer than the TSV 330, such that at the bonding interface IF of the semiconductor dies 42B1 and 42B2, the surface area of the TSV 330 having a portion being in physical and electrical contact with the bonding conductor 350 of the overlying semiconductor die 42B2, and the rest portion being in physical contact with the dielectric layer 140 of the overlying semiconductor die 42B2. It should be appreciated that the bonding conductor 350 formed by a single damascene technique illustrated in FIG. 15 is merely an example, and a dual damascene process or other suitable patterning techniques may be used to form the bonding conductor 350 which is not intended to be limiting. In other embodiments, one of the semiconductor dies (e.g., 42B1 or 42B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Referring to FIG. 16, the semiconductor die 44B2 is bonded to the semiconductor die 44B1. The semiconductor dies 44B1 and 44B2 may be similar to the semiconductor dies 34B1 and 34B2 described in FIG. 13A, except that the semiconductor die(s) 44B1 and/or 44B2 includes the isolation layer ISL disposed between the bonding dielectric layer 246 and the back surface 110b of the semiconductor die 110 and laterally covering the TSV 330. The formation of the isolation layer ISL may be similar to the manufacturing method described in conjunction with FIG. 8A to FIG. 8C. After forming the isolation layer ISL, the dielectric materials may be formed layer by layer on the isolation layer ISL and the TSV 330, and then a portion of the dielectric materials is removed to form the bonding dielectric layer 246 with an opening accessibly revealing at least a portion of the TSV 330. Subsequently, conductive material(s) may be formed in the opening of the bonding dielectric layer 246 to form the bonding conductor 242 which is in physical and electrical contact with TSV 330. The bonding conductor 242 may be formed by a damascenes process. It should be appreciated that the bonding conductor 242 formed by a single damascene technique illustrated in FIG. 16 is merely an example, and a dual damascene process or other suitable patterning techniques may be used which is not intended to be limiting.

The dielectric layer 140 of the overlying semiconductor die 44B2 and/or the bonding dielectric layer 246 of the underlying semiconductor die 44B1 may further include dummy conductor(s) 160 and 244 embedded therein and bonded to each other. The dummy conductor 244 is optionally formed during forming the bonding conductor 242. In an embodiment in which the dummy conductor 244 is formed, the dummy conductor 244 has a top surface directly bonded to the dummy conductor 160 of the overlying semiconductor die 44B2, and a bottom surface opposite to the top surface and in physical contact with the isolation layer ISL. Since the dummy conductors 160 and 244 are optionally formed, the dummy conductors 160 and 244 are depicted in FIG. 16 as dashed to indicate they may be or may not be present. In other embodiments, one of the semiconductor dies (e.g., 44B1 or 44B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Referring to FIG. 17, the semiconductor die 46B2 is bonded to the semiconductor die 46B1. The semiconductor dies 46B1 and 46B2 may be similar to the semiconductor dies 44B1 and 44B2 described above, except that the bonding structure 340'. The bonding structure 340' including the bonding conductor 342 and the bonding dielectric layer 346 may be similar to the bonding structure 340' described in conjunction with FIG. 14, and the detailed descriptions are omitted for brevity. The dummy conductors 160 and 344 are optionally formed in the dielectric layer 140 and the bonding dielectric layer 346, respectively; such that the dummy conductors 160 and 344 are depicted in FIG. 17 as dashed to indicate they may be or may not be present. In other embodiments, one of the semiconductor dies (e.g., 46B1 or 46B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

Referring to FIG. 18A and FIG. 18B, the semiconductor die 52B2 is bonded to the semiconductor die 52B1. The semiconductor dies 52B1 and 52B2 may be similar to the semiconductor dies 42B1 and 42B2 described in conjunction with FIG. 15, except that the bonding conductor 350 of the semiconductor die 52B2 penetrating through the conductive pad AP1 to be in physical and electrical contact with the semiconductor die 52B1. For example, the conductive pad AP1 includes a through hole TH, the bonding conductor 350 passes through the through hole TH of the conductive pad AP1, and the dielectric layer 140 extends into the through hole TH of the conductive pad AP1 to spatially separate the bonding conductor 350 from the conductive pad AP1. In some embodiments, the bonding conductor 350 extends through the through hole TH of the conductive pad AP1 to reach the top metallization pattern M1 of the interconnect structure 120, and the TSV 330 may extend from the bonding interface IF to the second level of metallization patterns M2 disposed between the top metallization pattern M1 and the semiconductor substrate 110.

It should be noted that the configuration of the bonding conductor 350 and the TSV 330 shown in FIG. 18A is merely an example, and the bonding conductor 350 and the TSV 330 may be in physical and electrical contact with any level of metallization patterns depending on the design requirements. The semiconductor die 52B1 may have or may not have the bonding conductor 350 which penetrates through the conductive pad AP1. In some embodiments, the semiconductor die 52B1 has the bonding conductor (not shown) disposed aside the conductive pad AP1 and electrically connected to the underlying carrier die 10C (shown in FIG. 4A). In certain embodiments, the semiconductor dies 52B1 and 52B2 have the same configuration. Alternatively, the semiconductor die 52B1 is replaced by one of the semiconductor die described above.

In some embodiments, a width (or diameter) D of a cross-sectional area of the bonding conductor 350 ranges from about 1 µm to about 5 µm in a plane view as illustrated in FIG. 18B. For example, the bonding conductor 350 has a substantially vertical sidewall relative to the bonding interface IF. In some embodiments, the bonding conductor 350 is tapered from the bonding interface IF to the interconnect structure 120. The cross-sectional area of the conductive pad AP1 may be at least ten times or a hundred/thousand times greater than the cross-sectional area of the bonding conductor 350. For example, a width Wa of the conductive pad AP1 ranges from about 30 µm to about 100 µm in the plane view. In some embodiments, the opening area (e.g., a length Lt times a width Wt) of the through hole TH is greater than the cross-sectional area of the bonding conductor 350 as shown in FIG. 18B. For example, the length Lt or the width Wt of the through hole TH is in a range of about 3 µm to about 20 µm.

The through hole TH and/or the bonding conductor 350 in the plan view may have a rectangular shape, a square shape, a polygon shape, a circular shape, an oval shape, etc. It should be noted that the shapes of the through hole TH and the bonding conductor 350 are merely examples, the shape of the through hole TH in the plan view may be any suitable shape to accommodate one or more bonding conductor 350. In some embodiments, the conductive pad AP1 includes a plurality of through holes TH, and each of the through hole TH may have at least one bonding conductor 350 inserted therein. The numbers of the through hole TH and the bonding conductor 350 may be adjusted depending on the design requirements.

A gap G is formed between the sidewall of the bonding conductor 350 and the inner sidewall of the conductive pad AP1 defining the through hole TH. The gap width Wg may be in a range of about 1 µm to about 3 µm. The dielectric layer 140 may be substantially formed in the gap G so that the conductive pad AP1 is electrically isolated the bonding conductor 350 by the dielectric layer 140. It should be noted that the bonding conductor 350 formed by a single damascene process shown in FIG. 18A is merely an example, a dual damascene process or other suitable techniques may be used and is not intended to be limiting. In other embodiments, one of the semiconductor dies (e.g., 52B1 or 52B2) is replaced by the semiconductor die shown in the variations of the embodiments discussed elsewhere in the disclosure. Combination schemes may be formed to include different types of semiconductor dies discussed herein, so that variations thereof may be carried out while still remaining within the scope of the claims and disclosure.

FIG. 19 through FIG. 22 are schematic cross-sectional views showing different configurations of a semiconductor die according to some embodiments of the present disclosure. The semiconductor die(s) discussed above may be replaced by any suitable one of the semiconductor die illustrated in FIG. 19 through FIG. 22. Combination schemes may be formed to include different types of semiconductor dies discussed herein, so that variations thereof may be carried out while still remaining within the scope of the claims and disclosure. Like elements are designated with the same reference numbers for ease of understanding and the details thereof are not repeated herein.

Figure 19:
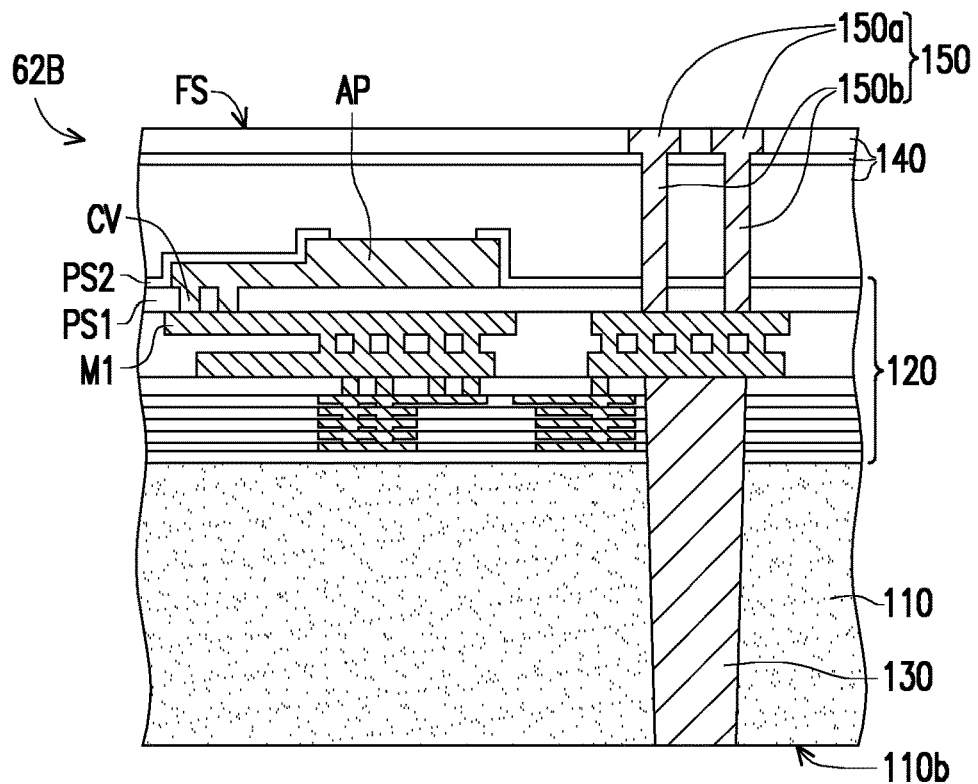
FIG. 19 through FIG. 22 are schematic cross-sectional views showing different configurations of a semiconductor die according to some embodiments of the present disclosure.

Referring to FIG. 19, the semiconductor die 62B includes a plurality of bonding conductors 150 disposed aside the conductive pad AP. In some embodiments, the bonding conductors 150 disposed side by side in a fine-pitched manner. The bonding conductors 150 may be formed during the same process, such as a dual damascene process or the like. In some embodiments, a dimension of the pad portion 150a of the bonding conductor 150 is about 2 times to about 20 times greater than that of the via portion 150b of the bonding conductor 150. For example, the critical dimension of the pad portion 150a ranges from about 1 µm to about 10 µm, and the critical dimension of the via portion 150b may ranges from about 0.5 µm to about 5 µm.

The interconnect structure 120' of the semiconductor die 62B may include a passivation layer PS1 covering the top metallization pattern M1, a post-passivation layer PS2 formed on the passivation layer PS1 and partially covering the conductive pad AP, and a plurality of conductive vias CV laterally covered by the passivation layer PS1, where the conductive pad AP may be electrically connected to the top metallization pattern M1 through the conductive vias CV. The bonding conductor 150 may be accessibly revealed at the front side FS of the semiconductor die 62B and extend into the interconnect structure 120' to be in physical and electrical contact with the metallization pattern(s) (e.g., top metallization pattern M1). In some embodiments, the bonding conductors 150 disposed side by side have the same depths (or heights). Alternatively, the bonding conductors 150 disposed side by side have different depths to reach different levels of the metallization patterns.

In some embodiments, the TSV 130 is disposed corresponding to the bonding conductors 150. Alternatively, the TSV 130 is disposed corresponding to the conductive pad AP. The TSV 130 may have a width gradually decreasing in a direction towards the back surface 110b of the semiconductor substrate 110. In other embodiments, the width of the TSV may increase in a direction towards the back surface 110b of the semiconductor substrate 110 as shown later in FIG. 20. It should be noted that the locations/numbers of the TSV 130, the conductive pad AP, and the bonding conductors 150 may be adjusted depending on the design requirements. It should be also noted that a multi-layered structure of the dielectric layer 140 illustrated in FIG. 19 is merely an example, the dielectric layer may be a single layer, which is not limited thereto.

Figure 20:
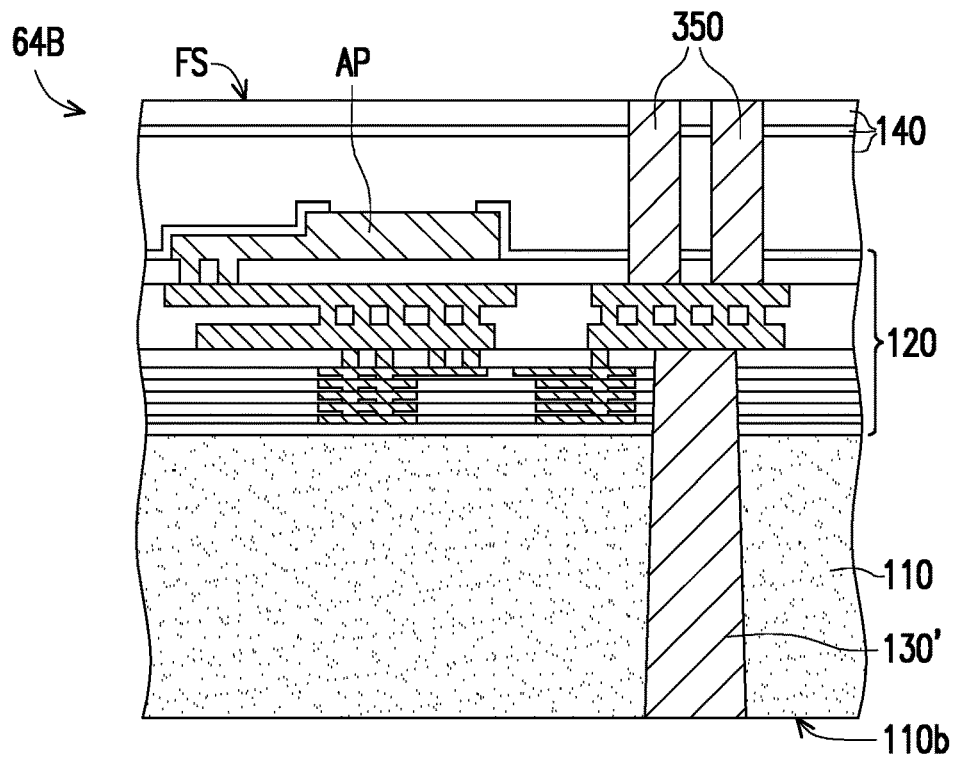

Referring to FIG. 20, the semiconductor die 64B may be similar to the semiconductor die 62B discussed above. The difference therebetween includes that the bonding conductors 350 is formed by such as a single damascene process or the like. In some embodiments, the TSV 130' having a sloped sidewall is disposed corresponding to the bonding conductors 350. For example, the TSV 130' has a width gradually increasing in a direction towards the back surface 110b of the semiconductor substrate 110. Alternatively, the TSV 130' is replaced by the TSV 130. In other embodiments, the TSV 130' is disposed without overlapping the bonding conductors 350. Combination schemes discussed above may be employed in the semiconductor die 64B.

Figure 21:
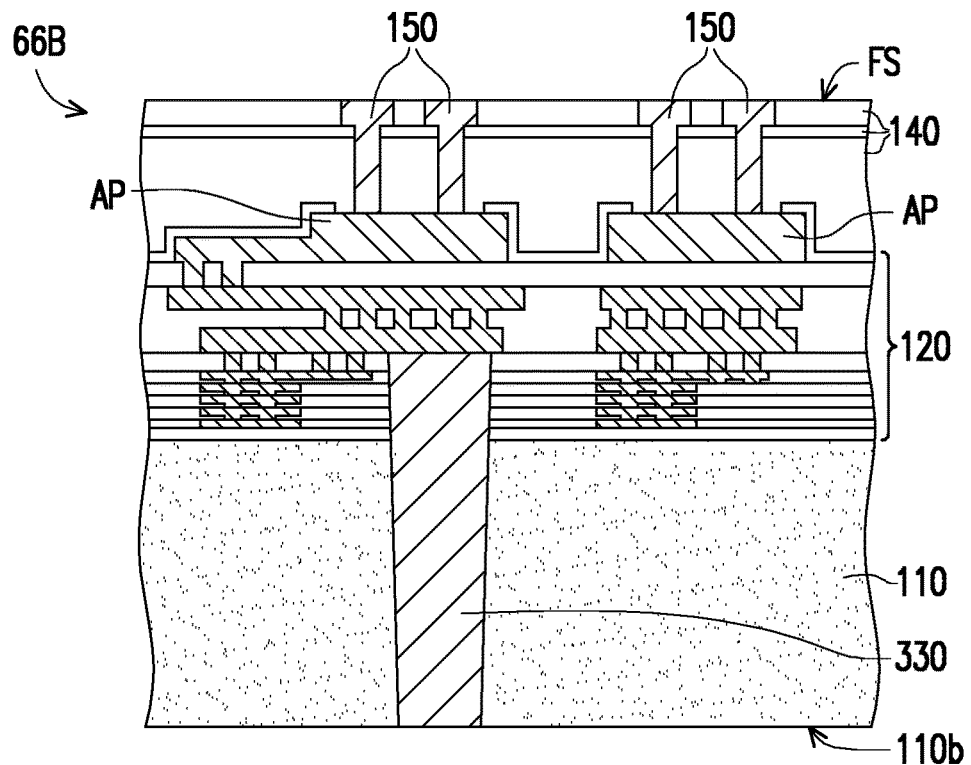

Referring to FIG. 21, the semiconductor die 66B may be similar to the semiconductor die 62B discussed above. The difference therebetween includes that the semiconductor die 66B includes a plurality of conductive pads AP. The conductive pads AP may be disposed side by side. In some embodiments, each of the conductive pads AP has at least one bonding conductor 150 landing thereon. The bonding conductor 150 may be formed by such as a dual damascene process or the like. The number of the bonding conductors 150 landing on the conductive pads AP may be the same or may be different, which depends on the design requirements. The pitch of two adjacent bonding conductors 150 disposed on one of the conductive pads AP may be the same or similar to the pitch of two adjacent bonding conductors 150 disposed on another one of the conductive pads AP. Alternatively, the bonding conductors 150 disposed on the different conductive pads AP have different pitches. It should be noted that the locations/numbers of the conductive pads AP and the bonding conductors 150 may be adjusted depending on the design requirements.

Figure 22:
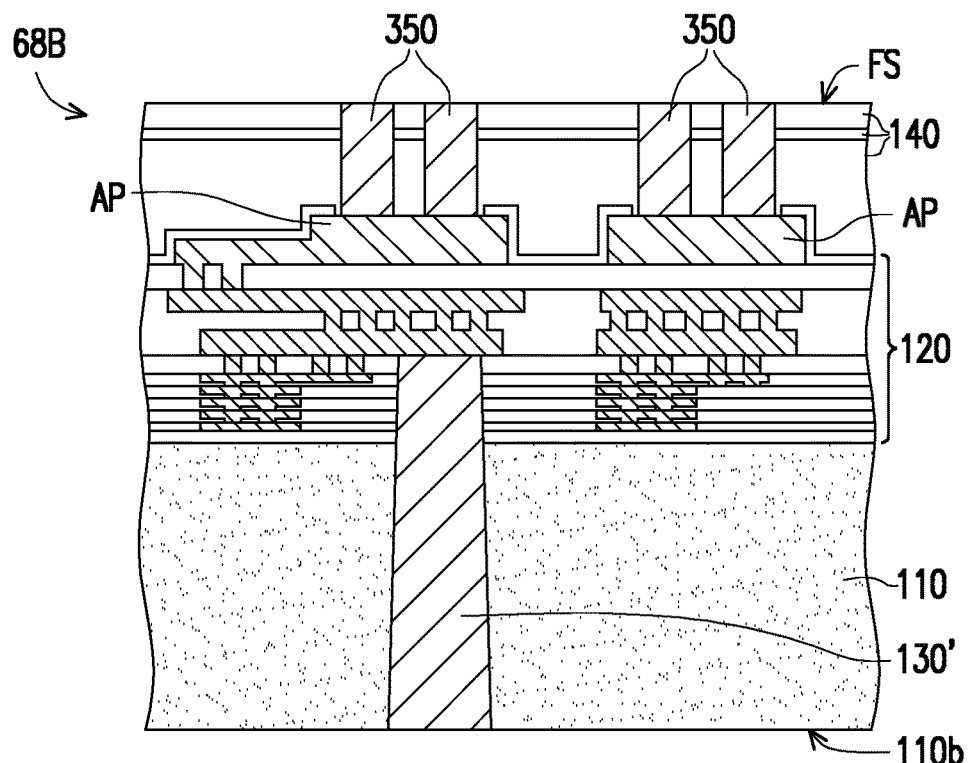

Referring to FIG. 22, the semiconductor die 68B may be similar to the semiconductor die 66B discussed above. The difference therebetween includes that the bonding conductors 350 is formed by such as a single damascene process or the like. In some embodiments, the TSV 130' having a sloped sidewall is disposed corresponding to the bonding conductors 350. For example, the TSV 130' has a width gradually increasing in a direction towards the back surface 110b of the semiconductor substrate 110. Alternatively, the TSV 130' is replaced by the TSV 130. In other embodiments, the TSV 130' is disposed without overlapping the bonding conductors 350. Combination schemes discussed above may be employed in the semiconductor die 68B.

Figure 23:
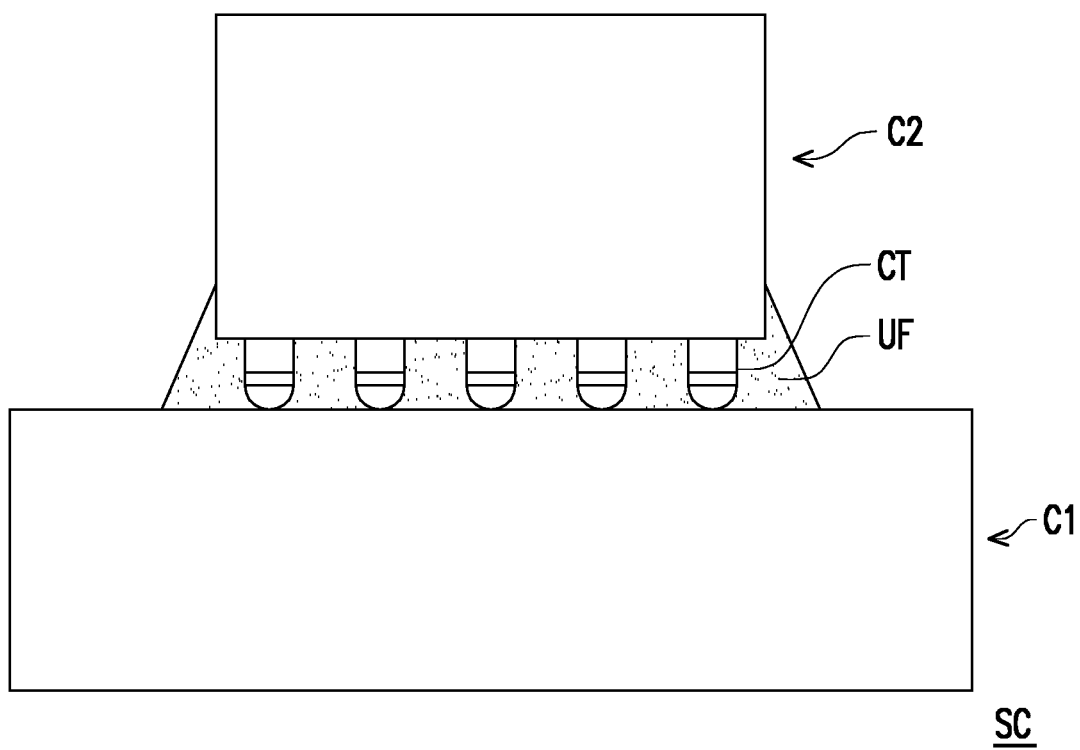
FIG. 23 is a schematic cross-sectional view showing an application of a semiconductor structure according to some embodiments of the present disclosure.

FIG. 23 is a schematic cross-sectional view showing an application of a semiconductor structure according to some embodiments of the present disclosure. Referring to FIG. 23, a component assembly SC including a first component C1 and a second component C2 disposed over the first component C1 is provided. The first component C1 may be or may include an interposer, a package substrate, a printed circuit board (PCB), a printed wiring board, and/or other carrier that is capable of carrying integrated circuits. In some embodiments, the second component C2 mounted on the first component C1 is similar to one of the semiconductor structures S1 to S3 described above. For example, one or more the semiconductor structures (e.g., S1, S2, S3) may be electrically coupled to the first component C1 through a plurality of terminals CT. The terminals CT may be the conductive terminals 30. In some embodiments, an underfill layer UF is formed between the gap of the first component C1 and the second component C2 to at least laterally cover the terminals CT. Alternatively, the underfill layer UF is omitted.

In some other embodiments, the second component C2 mounted on the first component C1 may be an integrated fan-out (InFO) package including at least one semiconductor structure (e.g., S1, S2, S3 respectively described above in conjunction with FIG. 4F, FIG. 6D, and FIG. 7E) packaged therein. For example, the second component C2 includes a plurality of semiconductor structures (e.g., any combinations of semiconductor structures S1, S2, S3) disposed side by side and surrounding by a packaging encapsulation (not shown; e.g., a molding compound). The second component C2 may further include a fan-out redistribution structure (not shown) formed on the packaging encapsulation and these semiconductor structures laterally encapsulated by the packaging encapsulation, and the fan-out redistribution structure may be electrically coupled to these semiconductor structures. In such embodiments, the terminals CT may be controlled collapse chip connection (C4) bumps, ball grid array (BGA) bumps, other suitable terminals having the dimension greater than the conductive terminals of the semiconductor structures, and/or the like. For example, the terminals CT are formed on the fan-out redistribution structure to be electrically coupled to the first component C1, and these semiconductor structures are electrically coupled to the terminals CT through the fan-out redistribution structure.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the semiconductor structure(s) discussed herein may provide high bandwidth data communication. It should be noted that other electronic applications are also possible.

In accordance with some embodiments of the disclosure, a manufacturing method of a semiconductor structure includes at least the following steps. A first semiconductor die is provided. The first semiconductor die includes a first semiconductor substrate, a first interconnect structure formed on the first semiconductor substrate, a first bonding conductor formed on the first interconnect structure, and a conductive via extending from the first interconnect structure toward a back surface of the first semiconductor substrate. The first semiconductor substrate is thinned to accessibly expose the conductive via so as to form a through semiconductor via of the first semiconductor die. A second semiconductor die is bonded to the first semiconductor die. The second semiconductor die includes a second semiconductor substrate, a second interconnect structure between the second semiconductor substrate and the first semiconductor substrate, and a second bonding conductor between the second interconnect structure and the first semiconductor substrate and bonded to the through semiconductor via of the first semiconductor die. The second semiconductor substrate includes an active surface facing the back surface of the first semiconductor substrate. The second bonding conductor is substantially aligned with the first bonding conductor and is smaller than the through semiconductor via.

In accordance with some embodiments of the disclosure, a manufacturing method of a semiconductor structure includes at least the following steps. A thinned semiconductor wafer is formed, where the thinned semiconductor wafer includes a semiconductor substrate, an interconnect structure formed on the semiconductor substrate, a bonding structure formed on the interconnect structure, and a through semiconductor via penetrating through the semiconductor substrate and connected to the interconnect structure. The thinned semiconductor wafer is singulated to form a plurality of semiconductor dies. A first one of the semiconductor dies is bonded to a carrier die, where a bonding conductor of the bonding structure of the first one of the semiconductor dies is bonded to a through carrier via of the carrier die, and a bonding surface area of the bonding conductor is less than a bonding surface area of the through carrier via. A second one of the semiconductor dies is bonded to the first one of the semiconductor dies.

In accordance with some embodiments of the disclosure, a manufacturing method of a semiconductor structure includes at least the following steps. Forming a die stack includes: bonding a top bonding structure of a top semiconductor die to a back side of a bottom semiconductor die, where a top bonding conductor of the top bonding structure is bonded to a through semiconductor via of the bottom semiconductor die, and a surface area of the through semiconductor via of the bottom semiconductor die is greater than a surface area of the top bonding conductor of the top bonding structure of the top semiconductor die. Bonding a front side of the bottom semiconductor die of the die stack to a back side of a carrier die includes: bonding a bottom bonding structure of the bottom semiconductor die to a through carrier via of the carrier die, where a surface area of the front side of the bottom semiconductor die is less than a surface area of the back side of the carrier die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a semiconductor structure, wherein the manufacturing method comprises:
 providing a first semiconductor die, wherein the first semiconductor die comprises:
  a first semiconductor substrate;
  a first interconnect structure formed on the first semiconductor substrate;
  a first bonding conductor formed on the first interconnect structure; and
  a conductive via extending from the first interconnect structure toward a back surface of the first semiconductor substrate;
 thinning the first semiconductor substrate to expose the conductive via so as to form a through semiconductor via of the first semiconductor die; and
 bonding a second semiconductor die to the first semiconductor die, wherein the second semiconductor die comprises:
  a second semiconductor substrate comprising an active surface facing the back surface of the first semiconductor substrate;
  a second interconnect structure between the second semiconductor substrate and the first semiconductor substrate; and
  a second bonding conductor between the second interconnect structure and the first semiconductor substrate and bonded to the through semiconductor via of the first semiconductor die, wherein the second bonding conductor is substantially aligned with the first bonding conductor and is smaller than the through semiconductor via.

2. The manufacturing method of claim 1, further comprising:
 providing a carrier die, wherein the carrier die comprises:
  a carrier substrate;
  a carrier interconnect structure formed on the carrier substrate; and
  a through carrier via penetrating through the carrier substrate and connected to the carrier interconnect structure; and
 bonding the first semiconductor die to the carrier die, wherein the first bonding conductor is bonded to the through carrier via of the carrier die.

3. The manufacturing method of claim 2, wherein the step of bonding the first semiconductor die to the carrier die is performed before thinning the first semiconductor substrate and bonding the second semiconductor die to the first semiconductor die.

4. The manufacturing method of claim 2, wherein the step of bonding the first semiconductor die to the carrier die is performed after bonding the second semiconductor die to the first semiconductor die.

5. The manufacturing method of claim 2, further comprising:
 forming an insulating material to cover the carrier die, the first semiconductor die, and the second semiconductor die after bonding the first semiconductor die to the carrier die and bonding the second semiconductor die to the first semiconductor die; and
 performing a singulation process to singulate the insulating material and the carrier die underlying the insulating material.

6. The manufacturing method of claim 2, further comprising:
 forming a first isolation layer on the carrier die before bonding the first semiconductor die to the carrier die, wherein the through carrier via of the carrier die is exposed by the first isolation layer;
 forming a second isolation layer on the first isolation layer and the first semiconductor die after the first semiconductor die is bonded to the carrier die, wherein the through semiconductor via of the first semiconductor die is exposed by the second isolation layer.

7. The manufacturing method of claim 6, further comprising:
forming an insulating material to cover the second isolation layer and the second semiconductor die after bonding the second semiconductor die to the first semiconductor die; and
performing a singulation process to singulate the insulating material and the second isolation layer.

8. The manufacturing method of claim 1, wherein the step of thinning the first semiconductor substrate to expose the conductive via so as to form the through semiconductor via of the first semiconductor die comprises:
performing a backside thinning process on the first semiconductor substrate, wherein after the backside thinning process is performed on the first semiconductor substrate, the conductive via is protruded from the back surface of the first semiconductor substrate;
forming an isolation material on the back surface of the first semiconductor substrate to cover the conductive via that is protruded from the back surface of the first semiconductor substrate; and
etching the isolation material to form an isolation layer that exposes the conductive via.

9. The manufacturing method of claim 1, further comprising:
forming a backside bonding conductor on the through semiconductor via at the back surface of the first semiconductor substrate before bonding the second semiconductor die to the first semiconductor die, wherein after bonding the second semiconductor die to the first semiconductor die, the second bonding conductor is bonded to the through semiconductor via through the backside bonding conductor.

10. The manufacturing method of claim 9, wherein a damascene process is performed to form the backside bonding conductor that is substantially aligned with the second bonding conductor and is smaller than the through semiconductor via.

11. The manufacturing method of claim 1, wherein when thinning the first semiconductor substrate, a rounded edge of the first semiconductor substrate connected to the back surface and a sidewall of the first semiconductor substrate is formed.

12. A manufacturing method for a semiconductor structure, wherein the manufacturing method comprises:
forming a thinned semiconductor wafer, wherein the thinned semiconductor wafer comprises a semiconductor substrate, an interconnect structure formed on the semiconductor substrate, a bonding structure formed on the interconnect structure, and a through semiconductor via penetrating through the semiconductor substrate and connected to the interconnect structure;
singulating the thinned semiconductor wafer to form a plurality of semiconductor dies;
bonding a first one of the semiconductor dies to a carrier die, wherein a bonding conductor of the bonding structure of the first one of the semiconductor dies is bonded to a through carrier via of the carrier die, and a bonding surface area of the bonding conductor is less than a bonding surface area of the through carrier via; and
bonding a second one of the semiconductor dies to the first one of the semiconductor dies.

13. The manufacturing method of claim 12, further comprising:
thinning a carrier substrate of the carrier die until the through carrier via is exposed by the carrier substrate before bonding the first one of the semiconductor dies to the carrier die.

14. The manufacturing method of claim 12, further comprising:
forming a plurality of conductive terminals on the carrier die, wherein the conductive terminals and the first one of the semiconductor dies are formed at two opposing sides of the carrier die, and each of the conductive terminals comprises a pillar portion and a cap portion formed on the pillar portion.

15. The manufacturing method of claim 12, further comprising:
forming an insulating material on the carrier die, the first one of the semiconductor dies, and the second one of the semiconductor dies; and
singulating the insulating material and the carrier die underlying the insulating material.

16. A manufacturing method for a semiconductor structure, wherein the manufacturing method comprises:
forming a die stack comprising:
bonding a top bonding structure of a top semiconductor die to a back side of a bottom semiconductor die, wherein a top bonding conductor of the top bonding structure is bonded to a through semiconductor via of the bottom semiconductor die, and a surface area of the through semiconductor via of the bottom semiconductor die is greater than a surface area of the top bonding conductor of the top bonding structure of the top semiconductor die; and
bonding a front side of the bottom semiconductor die of the die stack to a back side of a carrier die comprising:
bonding a bottom bonding structure of the bottom semiconductor die to a through carrier via of the carrier die, wherein a surface area of the front side of the bottom semiconductor die is less than a surface area of the back side of the carrier die.

17. The manufacturing method of claim 16, wherein the step of forming the die stack further comprises:
providing the bottom semiconductor die, wherein the bottom semiconductor die comprises a semiconductor substrate, an interconnect structure formed on the semiconductor substrate, the bottom bonding structure formed on the interconnect structure, and a conductive via extending from the interconnect structure and buried in the semiconductor substrate;
thinning the semiconductor substrate of the bottom semiconductor die to expose the conductive via so as to form the through semiconductor via of the bottom semiconductor die; and
bonding the top semiconductor die to the bottom semiconductor die after the thinning.

18. The manufacturing method of claim 17, wherein when thinning the semiconductor substrate of the bottom semiconductor die, a rounded edge of the semiconductor substrate connected to a back surface and a sidewall of the bottom semiconductor die is formed.

19. The manufacturing method of claim 18, further comprising:
forming an insulating material on the carrier die and the die stack, wherein the insulating material physically covers the rounded edge of the bottom semiconductor die.

20. The manufacturing method of claim 16, wherein the step of bonding the top semiconductor die of the top semiconductor die to the through semiconductor via of the bottom semiconductor die comprises:
  forming metal-to-metal bonds and oxide-to-oxide bonds at an interface of the top semiconductor die and the bottom semiconductor die.

* * * * *